(12) United States Patent
Matsushita et al.

(10) Patent No.: US 6,798,696 B2
(45) Date of Patent: Sep. 28, 2004

(54) METHOD OF CONTROLLING THE OPERATION OF NON-VOLATILE SEMICONDUCTOR MEMORY CHIPS

(75) Inventors: Toru Matsushita, Kokubunji (JP); Hideaki Kurata, Kokubunji (JP); Naoki Kobayashi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 11 days.

(21) Appl. No.: 10/364,417

(22) Filed: Feb. 12, 2003

(65) Prior Publication Data

US 2003/0198100 A1 Oct. 23, 2003

Related U.S. Application Data

(63) Continuation-in-part of application No. 10/298,587, filed on Nov. 19, 2002, now abandoned.

(30) Foreign Application Priority Data

Dec. 4, 2001 (JP) .................................. 2001-369447

(51) Int. Cl.[7] .............................................. G11C 11/34
(52) U.S. Cl. ............................ 365/185.11; 365/185.29
(58) Field of Search ........................ 365/185.11, 185.29

(56) References Cited

U.S. PATENT DOCUMENTS 6,504,768 B1 * 1/2003 Roohparvar et al. ......... 365/200

FOREIGN PATENT DOCUMENTS

JP        9-204355      8/1997
JP       11-273370     10/1999

* cited by examiner

Primary Examiner—M. Tran
(74) Attorney, Agent, or Firm—Miles & Stockbridge P.C.

(57) ABSTRACT

Disclosed herewith is a method for controlling the operation of non-volatile semiconductor chips with high sequential access performance realized by smoothing out the variation of the times for writing, erasing, and reading data in/from memory cells among sectors in each of the chips.

13 Claims, 57 Drawing Sheets

METHOD OF CONTROLLING THE OPERATION OF NON-VOLATILE SEMICONDUCTOR MEMORY CHIPS

This application is a continuation-in-part of application Ser. No. 10/298,587 filed Nov. 19, 2002, ABANDONED which is incorporated herein by reference.

BACKGROUND OF THE INVENTION

1. Field of the Invention

The present invention relates to a method of controlling the operation (writing, erasing, and reading) of a semiconductor memory device configured by a plurality of non-volatile semiconductor memory chips.

2. Description of the Prior Art

In recent years, along with the wide spread of such portable devices as portable personal computers (PCs) and portable telephones, non-volatile semiconductor memories including flash memories are widely watched as information storage media employed for those portable devices.

Flash memories are roughly classified into two types according to the accessing unit length; NOR flash memory and AND/NAND flash memory. The NOR flash memory can be accessed in bytes at random, although it is small in capacity, a few megabytes at the most. The AND/NAND flash memory can be accessed in sectors while it has a capacity of a few tens of megabytes; each sector has a capacity of a few hundreds to a few thousands of bytes. The AND/NAND flash memory, which is a large capacity flash memory, is suitable as storages for which both low bit cost and sequential access performance are considered more important than random access performance in bytes. Card type semiconductor memory devices that employ the large capacity flash memories are now being manufactured by many corporations. A card type semiconductor memory device usually includes a plurality of flash memory chips to provide a larger capacity than that of the device itself. FIG. 1 shows a system that employs such a semiconductor memory device. A host system 1 is, for example, a personal computer or digital camera. A semiconductor memory device 2 is connected to the host system 1 and writes/reads information according to the commands received from the host system 1. The semiconductor memory device 2 is configured by a controller for controlling itself, an input/output interface 4 enabling commands and data to be sent/received between the host system 1 and the controller 3, a buffer memory 5, and a plurality of flash memory chips 6 for storing information. The controller 3 analyzes commands received from the host system 1 to control the flash memory chips 6 according to the analysis result and write/read information therein/therefrom. At this time, the controller 3 also erases information from each flash memory chip 6 as needed.

Next, a description will be made for the I/O interface 4 of the flash memory chips 6. Unlike other memories, the large capacity flash memory chip 6 usually has no address terminal. The flash memory chip 6 accesses each sector to perform command input, address input, and data input/output through a common I/O terminal in a time sharing manner in accordance with a procedure predetermined for itself separately. Generally, the large capacity flash memory chip performs an input/output operation in units of eight bits. A 20 MHz I/O clock is used for most of the memories. The large capacity flash memory chip has a plurality of input terminals used for controlling the protocol. The High/Low levels of those input terminals can be combined in various ways to switch among such operations as command input, address input, and data input/output.

FIGS. 52 through 54 show how to access such a large capacity flash memory chip. To simplify the description, the protocol control signal will be omitted and only the access procedure concept will be described here. Hereinafter, the description will be made on the assumption that the I/O bus is eight bits in width, the I/O clock is 20 MHz, the command input cycle is one cycle, the sector address input cycle is two cycles, and the sector size is 2112 bytes.

At first, the writing procedure will be described with reference to FIG. 54. Writing is done sequentially in the order of write command input CMD(W), write sector address input ADR, data input for one sector TR, write start command input CMD(SW), write end wait BUSY, and status read ST. When one sector data input ends, the inputted data is just stored in the buffer memory in the flash memory chip and not written in any memory cell therein yet. Writing in each memory cell in a specified sector starts at a write start command input. The flash memory chip disables simultaneous processing of two commands. When the next command is inputted just after the first one, the next write command is forced to wait for the completion of the preceding write command processing. And, after the flash memory is used for a certain time, the memory cells are degraded, thereby some sectors in the memory come to be disabled for correct writing. Consequently, the status of the flash memory chip is usually read after writing/erasing to/from each memory sector so as to check if the command processing is terminated normally therein. If the writing fails, the data is written in another sector (replacement processing). Each processing time in the above writing will become roughly as follows; the CMD(W) is 50 ns, the SDR is 100 ns, the TR is 110 μs, the CMD(WS) is 50 ns, the BUSY is 2 ms, and the ST is 50 ns.

Next, how to erase information from the large capacity flash memory chip will be described with reference to FIG. 55. Erasing is performed sequentially in order of erase command input CMD(E), target sector address input ADR, erase start command input CMD(SE), wait for completion BUSY, and status read ST. Erasing from a memory cell in a specified sector starts at an erase start command input. Similarly to the writing described above, the next command input to the large capacity flash memory chip is forced to wait until the preceding erase command processing ends. And, similarly to the writing, the status of the large capacity flash memory chip is read usually after erasing of data from each memory sector to check if the command processing is terminated normally therein. When the erasing fails, the sector is registered as a defective one and replaced with another. Each processing time in the above erasing will become roughly as follows; the CMD(E) is 50 ns, the ADR is 100 ns, the CMD(ES) is 50 ns, the BUSY is 1 ms, and the ST is 50 ns.

Next, how to read information from the large capacity flash memory chip will be described with reference to FIG. 56. Reading is performed sequentially in order of read command input CMD (R), target sector address input ADR, wait for reading to be prepared BUSY, and data read (output) TR. Reading (transferring) data from a memory cell in a specified sector provided in a chip to the buffer memory in the large capacity flash memory chip starts at a sector address input, concretely when the read data is transferred completely to the buffer memory provided in the large capacity flash memory chip. Each processing time in the above reading will become roughly as follows; the CMD(R) is 50 ns, the ADR is 100 ns, the TR is 110 μs, and the BUSY is 50 μs.

In a semiconductor memory device configured by some flash memory chips, data is divided into a plurality of data blocks and stored in a plurality of flash memory chips so as to improve the sequential access performance. In other words, processings are performed in a plurality of flash memory chips in parallel to improve the practical sequential access performance.

Hereinafter, a conventional writing method employed for a semiconductor memory device configured by four flash memory chips will be described with reference to some drawings.

FIG. 57 shows the conventional writing method described on the time axis in a case in which the data size is assumed as sector size ×4. Data D is divided into data blocks D0 to D3, each having the same size as the sector size. The data blocks are written in different flash memory chips. In this case, the data block D0 is written in the large capacity flash memory chip 0, the data block D1 is written in the large capacity flash memory chip 1, the data block D2 is written in the large capacity flash memory chip 2, and the data block D3 is written in the large capacity flash memory chip 3 respectively. The CMD(W) denotes a write command input time, the ADRn denotes an input time of an address ADR assigned to each large capacity flash memory chip, the TR(Dn) denotes a data block Dn input time, the CMD(WS) denotes a write start command input time, and the $T_{C\_BUSY}$ denotes a time for writing data inputted to the large capacity flash memory chip in a memory cell provided therein. At first, a write command, an address, a data block, and a write start command are inputted to the large capacity flash memory chip 0 respectively. Hereinafter, the above inputs are repeated sequentially for each of the remaining large capacity flash memory chips 1 to 3.

The official gazette of JP-A No.H11-273370 discloses a method for performing the write command input, the address ADR input, and the write start command input for all of the chips simultaneously by assuming ADR0 to ADR3 as the same address ADR, since the large capacity flash memory chips are all connected to a common bus.

FIG. 58 shows a conventional erasing method described on the time axis. The method erases data from addresses ADR0 to ADR3 specified in the large capacity flash memory chips 0 to 3. The CMD(E) denotes an erase command input time, the ADRn denotes an input time of an address ADR assigned to each of the large capacity flash memory chips, the CMD(ES) denotes an erase start command input time, and the $T_{C\_BUSY}$ denotes a time for erasing data from a memory cell corresponding to an address specified for ADR. At first, an erase command, an address, and an erase start command are inputted to the large capacity flash memory chip 0 respectively. Hereinafter, the above inputs are repeated sequentially for each of the remaining large capacity flash memory chips 1 to 3.

The official gazette of JP-A No. H11-273370 discloses a method for performing the erase command input, the address ADR input, and the erase start command input for all of the chips 1 to 3 simultaneously by assuming ADR0 to ADR3 as the same address ADR, since the large capacity flash memory chips are all connected to a common bus.

FIG. 59 shows a conventional reading method described on the time axis. This method is used for a case in which the data size becomes sector size x 4. Data D is divided into data blocks D0 to D3, each having the same size as the sector size. The data blocks are written in different flash memory chips. In this case, the data block D0 is written in the large capacity flash memory chip 0, the data block D1 is written in the large capacity flash memory chip 1, the data block D2 is written in the large capacity flash memory chip 2, and the data block D3 is written in the large capacity flash memory chip 3 respectively. The CMD(R) denotes a read command input time, the ADRn denotes a time for inputting an address ADR to each large capacity flash memory chip, in which a data block Dn is already written. The TR(Dn) denotes a data block Dn reading time, and the $T_{C\_BUSY}$ denotes a time of preparing for reading a data block from a large capacity flash memory chip in response to an inputted read command. At first, a read command and an address are inputted sequentially to the large capacity flash memory chip 0. Hereinafter, the above inputs are repeated sequentially for each of the remaining large capacity flash memory chips 1 to 3. The reading of a data block from a large capacity flash memory chip begins after all of the chips get ready to be read.

The official gazette of JP-A No. H11-273370 discloses a method for performing the read command input and the address ADR input to all of the chips 0 to 3 simultaneously by assuming ADR0 to ADR3 as the same address ADR, since the large capacity flash memory chips are all connected to a common bus.

In a large capacity flash memory chip, the writing time, the erasing time, and the reading time required for each memory cell are varied among sectors. And, the conventional controlling method described above cannot smooth out the variation.

SUMMARY OF THE INVENTION

Under such circumstances, it is an object of the present invention to provide a method for controlling a plurality of non-volatile semiconductor memory chips so as to solve the above conventional problem. Concretely, the method controls the memory chips so that a write command is inputted to each of the plurality of non-volatile semiconductor memory chips simultaneously in the first step, the same memory address is inputted to each of those non-volatile semiconductor memory chips simultaneously in the second step, and one of the memory chips is selected and a data block and a write start command are inputted to the selected memory chip in the third step. After this, another chip is selected sequentially so that it is subjected to the processing in this third step. In the fourth step, it is determined that the write start command processing is terminated in the memory chip, then another chip is selected sequentially so that it is subjected to the processing in the fifth step and the command execution result is checked therein. When data is to be written in a plurality of different addresses specified in a plurality of non-volatile semiconductor memory chips, the writing method described above is repeated for each of those different addresses.

In another way, in the first step, a write command is inputted to each of a plurality of non-volatile semiconductor memory chips. In the second step, the same memory address is inputted to each of the plurality of memory chips. In the third step, one of the memory chips is selected so that a data block and a write start command are inputted to the chip, then the chip is changed to another sequentially to repeat the processing in this third step. Then, in the fourth step, each of the memory chips is checked for the completion of the write start command and the command execution result check separately. When data is to be written in a plurality of different addresses specified in a plurality of memory chips, the write command and the address are inputted to each of the memory chips separately in and after the second round.

When data is erased from a plurality of non-volatile semiconductor memory chips, an erase command is inputted to each of those chips simultaneously in the first step and the same memory address is inputted to each of those memory chips simultaneously in the second step. Then, in the third step, an erase start command is inputted to each of those memory chips simultaneously. In the fourth step, it is determined that the processing of the erase start command has ended in each of those memory chips. In the fifth step, the chip is changed over to another to check the command execution result therein. When data is erased from a plurality of different addresses, the above processings are repeated for each of those different addresses.

In another way, an erase command is inputted to a plurality of non-volatile semiconductor memory chips simultaneously in the first step and the same memory address is inputted to each of those memory chips simultaneously in the second step. And, in the third step, an erase start command is inputted to each of those memory chips simultaneously. In the fourth step, it is determined in each memory chip separately that the processing of the erase start command is ended, then the command execution result is checked therein. When data is to be erased from a plurality of different addresses, the erase command, the address, and the erase start command are inputted to each of the memory chips separately after the command execution result check.

When data is to be read from a plurality of non-volatile semiconductor memory chips, a read command is inputted to each of those memory chips simultaneously in the first step and the same memory address is inputted to each of those memory chips simultaneously in the second step. Then, in the third step, it is determined that all the memory chips are ready to be read. In the fourth step, one of those memory chips is selected and one data block is read from the selected chip, then the memory chip is changed to another sequentially to repeat the processing in this third step. When data is to be read from a plurality of different addresses, the above processings are repeated for each of the different addresses.

In another way, a read command is inputted to a plurality of non-volatile semiconductor memory chips simultaneously in the first step and the same memory address is inputted to each of those memory chips simultaneously in the second step. Then, in the third step, it is determined in each memory chip separately that the memory chip is ready to be read, then one of the memory chips ready to be read is selected and one data block is read therefrom. After this, the memory chip is changed to another sequentially to repeat the processing in this third step. When data is to be read from a plurality of different addresses, the above processings are repeated so that the read command and each of the addresses are inputted to each of the memory chips just after the data block reading in the third step.

DESCRIPTION OF THE PREFERRED EMBODIMENTS

Hereunder, the preferred embodiments of the present invention will be described with reference to the accompanying drawings.

Figure 1:
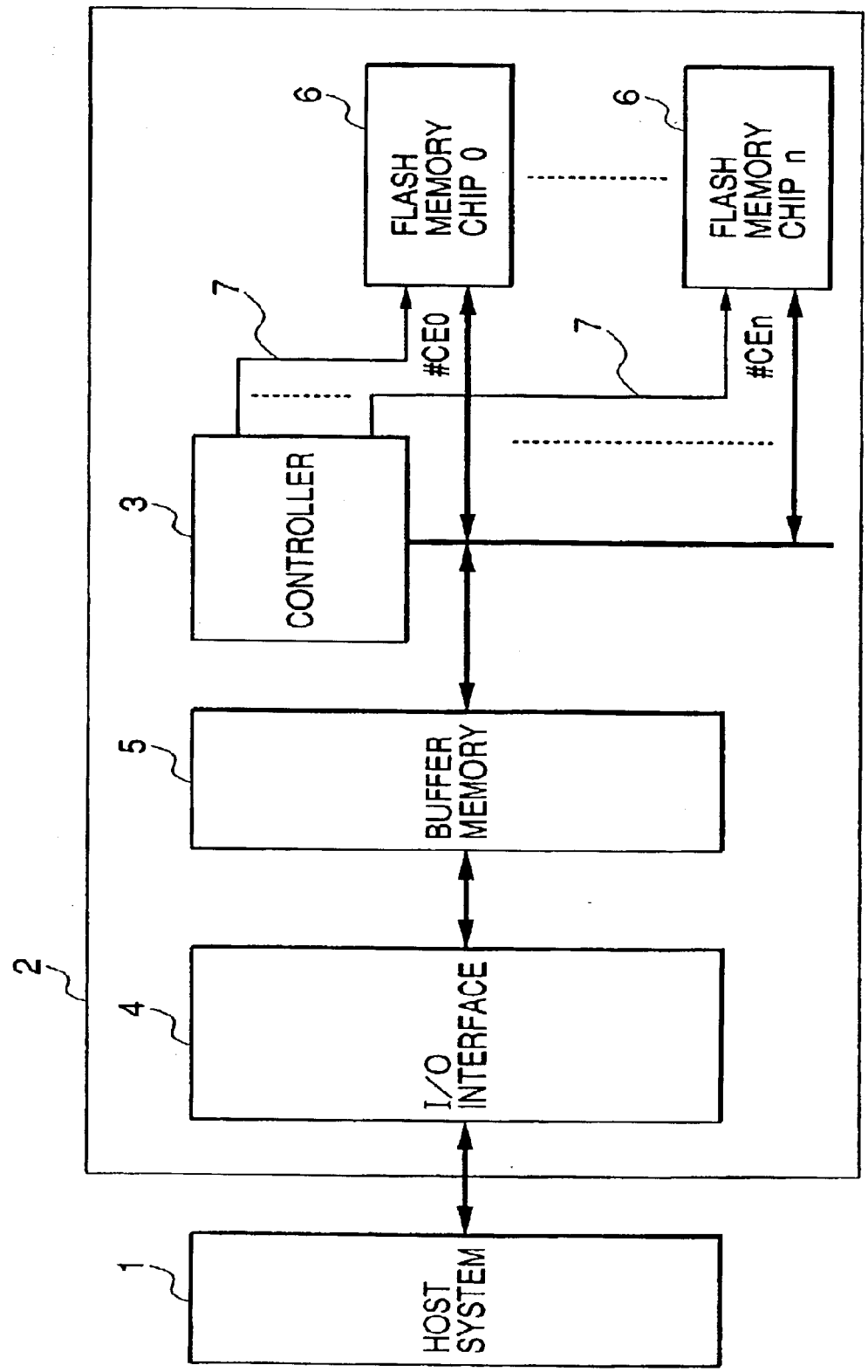
FIG. 1 is a block diagram of a non-volatile semiconductor memory device.

FIG. 1 shows a block diagram of a semiconductor memory device configured by large capacity flash memory ships. A semiconductor memory device 2 is connected to a host system 1 to write/read information to/from the system 1 according to the commands received from the host system 1. The semiconductor memory device 2 is configured by a controller 3, an I/O interface 4, a buffer memory 5, and a plurality of flash memory chips 6. The controller 3 analyzes each command received from the host system 1 to control each flash memory chip 6 according to the analysis result to write, read, and erase information to/from the chip 6. Commands and data are sent/received between the host system 1 and the controller 2 through the I/O interface 4. When data is written in the semiconductor memory device 2, the write data received from the host system 1 is stored in the buffer memory 5 once, then converted to predetermined formatted data and written in the specified flash memory chip 6. When data is read from the semiconductor memory device 2, the predetermined formatted data read from the flash memory chip 6 is restored to the original formatted data, then output to the host system 1 through the buffer memory 5 and the I/O interface. A flash memory chip select signal 7 selects a target flash memory chip. The signal can also select a plurality of any flash memory chips simultaneously.

Next, a description will be made for how to determine the operation status (Ready/Busy) of each flash memory chip. Each flash memory chip is provided with a Ready/Busy terminal that denotes its operation status. Each flash memory chip is also provided with another status register that denotes a command execution result (Fail/Pass). This system can employ at least one or more of the four Ready/Busy determination methods to be described below.

The first Ready/Busy determination method uses a signal obtained by ANDing the Ready/Busy signal of every flash memory chip to determine the Ready/Busy status therein. This method regards the status as Busy when one or more flash memory chips are active, although it cannot identify which chip(s) are actually active.

The second Ready/Busy determination method assigns the Ready/Busy signal of each flash memory chip to each independent bit of a register readable from the controller 3 and this register data is read to determine Ready/Busy in the target flash memory chip. This method can identify which chip(s) are really active, although it needs a larger circuit scale than the first Ready/Busy determination method.

The third Ready/Busy determination method is a combination of the first and second Ready/Busy determination methods. This method groups flash memory chips so that each group is composed of a plurality of flash memory chips. The Ready/Busy signals of all the flash memory chips in a group are ANDed. A signal obtained by ANDing the Ready/Busy signals in each group such way is assigned to each independent bit in a flash memory chip register readable from the controller 3. Then, the data in this register is read to determine Ready/Busy in the flash memory chip. This method can identify each group that includes active flash memory chip(s), although it needs a large circuit scale and the first Ready/Busy determination method cannot identify any active flash memory chip. In addition, this method cannot identify any active flash memory chip, although it can identify a group that includes active flash memory chip(s) and the second Ready/Busy determination method can identify any of active flash memory chips. This method needs a smaller circuit scale than the second Ready/Busy determination method.

The fourth Ready/Busy determination method reads a status register of each flash memory chip to determine Ready/Busy therein. This method needs no additional circuit such as an AND circuit and a register that are needed in the first to third Ready/Busy determination methods. To read a status register, however, this method controlling overhead becomes larger than those of other methods. The controlling overhead includes sending a status register read command to the target flash memory chip, switching the flash memory chip control signal into the status register read mode.

Next, a description will be made for a writing controlling method for writing data in flash memory chips. The data writing in this case is divided into two types; writing in the same addresses specified in a plurality of flash memory chips and writing in a plurality of different addresses specified in a plurality of flash memory chips. In this case, it is premised that data is divided into a plurality of data blocks in a size of an integer multiple of the sector size and stored in a plurality of flash memory chips.

At first, the method for writing data in the same addresses specified in a plurality of flash memory chips will be described with reference to FIGS. 2 through 10.

Figure 2:
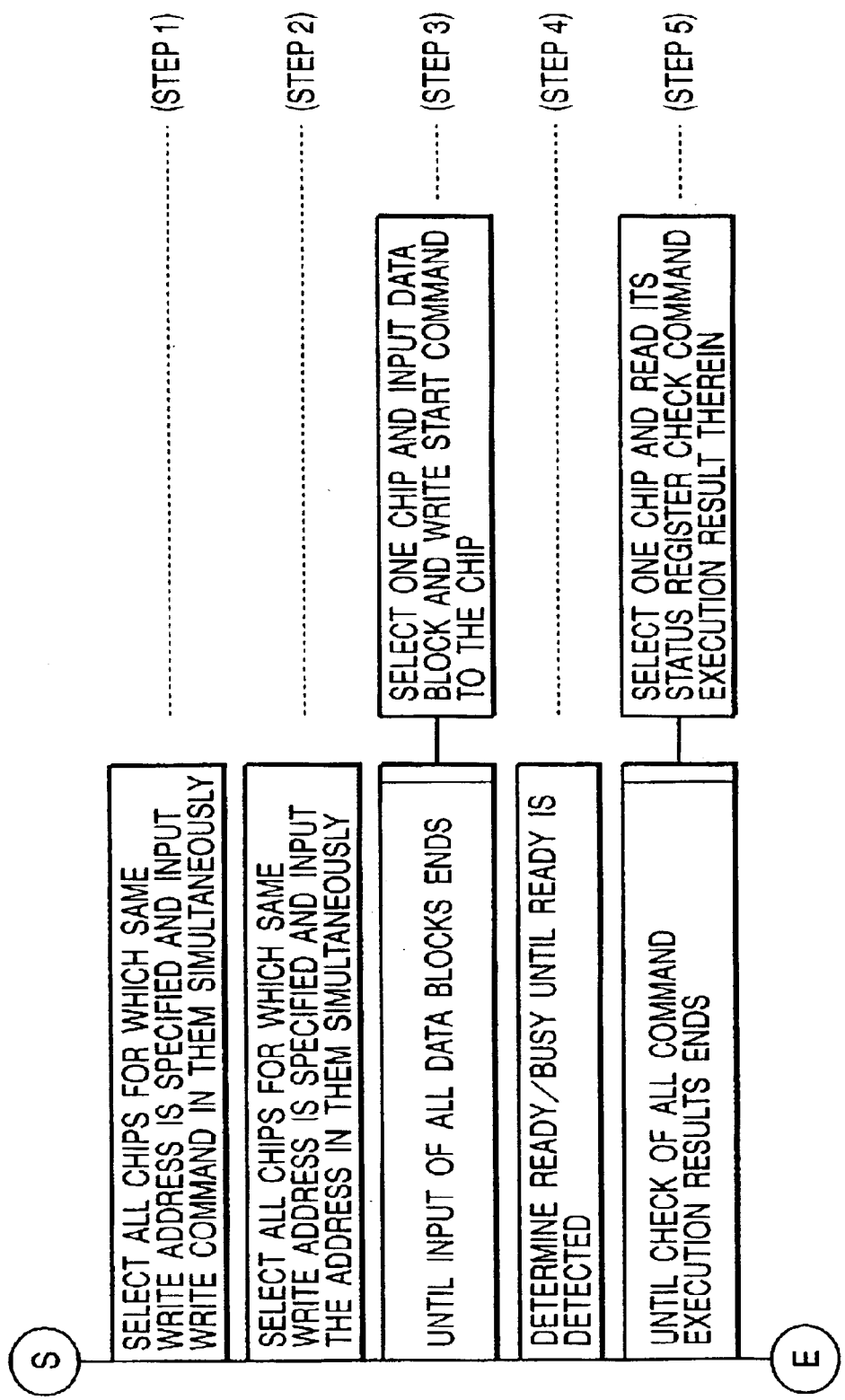
FIG. 2 is a flowchart of a writing controlling method for writing data in the same addresses specified in a plurality of flash memory chips with use of the first Ready/Busy determination method.

FIGS. 2 through 5 show flowcharts for controlling writing of data in accordance with the first to fourth Ready/Busy determination methods. FIG. 2 shows a flowchart for controlling the writing with use of the first Ready/Busy determination method. In STEP1, a write command is inputted simultaneously to each of the flash memory chips to which the same address is to be inputted. In STEP2, the same address is inputted simultaneously to each of the flash memory chips to which a write command is inputted in STEP1. In STEP3, one of the above flash memory chips is selected and a data block and a write start command are inputted to the chip sequentially. The flash memory chip selection in STEP3 is done in order of data block writing until the input of all of the data blocks and write start commands is completed. In STEP4, Ready/Busy is determined in each flash memory chip until Ready is detected therein. In STEP5, the status register of each flash memory chip selected sequentially is read to check the result of the write start command execution therein.

Figure 3:
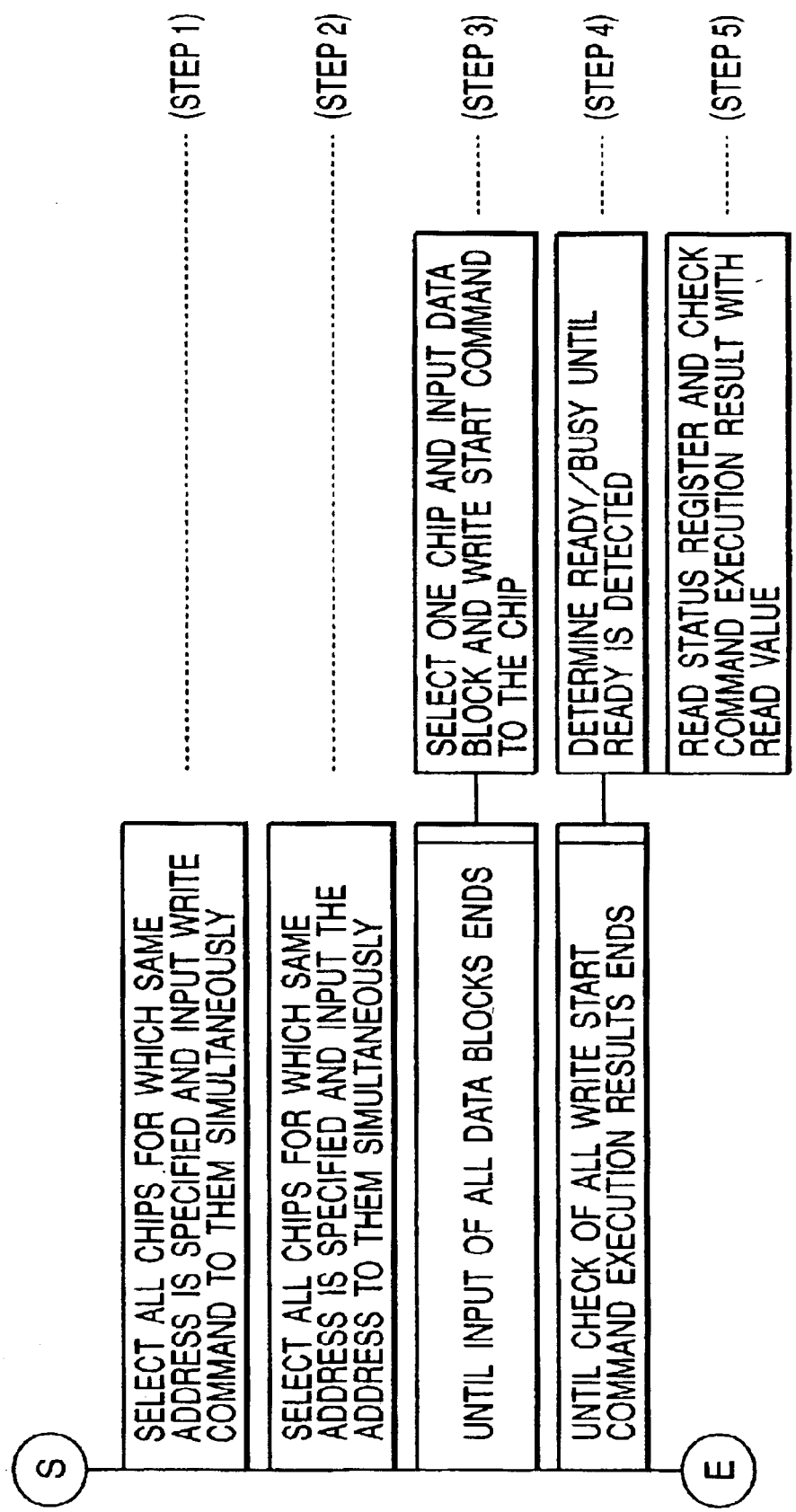
FIG. 3 is a flowchart of a writing controlling method for writing data in the same addresses specified in a plurality of flash memory chips with use of the second Ready/Busy determination method.

FIG. 3 shows a flowchart for controlling the writing with use of the second Ready/Busy determination method. In STEP1, a write command is inputted simultaneously to each of the flash memory chips to which the same write address is inputted. In STEP2, the same address is inputted simultaneously to each of the flash memory chips to which a write command is inputted in STEP1. In STEP3, one of the above flash memory chips is selected and a data block and a write start command are inputted to the chip sequentially. The flash memory chip selection in STEP3 is done in order of data block writing until the input of all the data blocks and write start commands is completed. In STEP4, Ready/Busy is determined in each flash memory chip until Ready is detected therein. In STEP5, the status register of each flash memory chip in which Ready is detected in STEP4 is read to check the result of the write start command execution therein. The processings in STEP1 to STEP5 are repeated until the result of the write command execution is confirmed in all of the above flash memory chips. The processings in STEP4 and STEP5 can be performed in order of data block input or in order of Ready detection.

Figure 4:
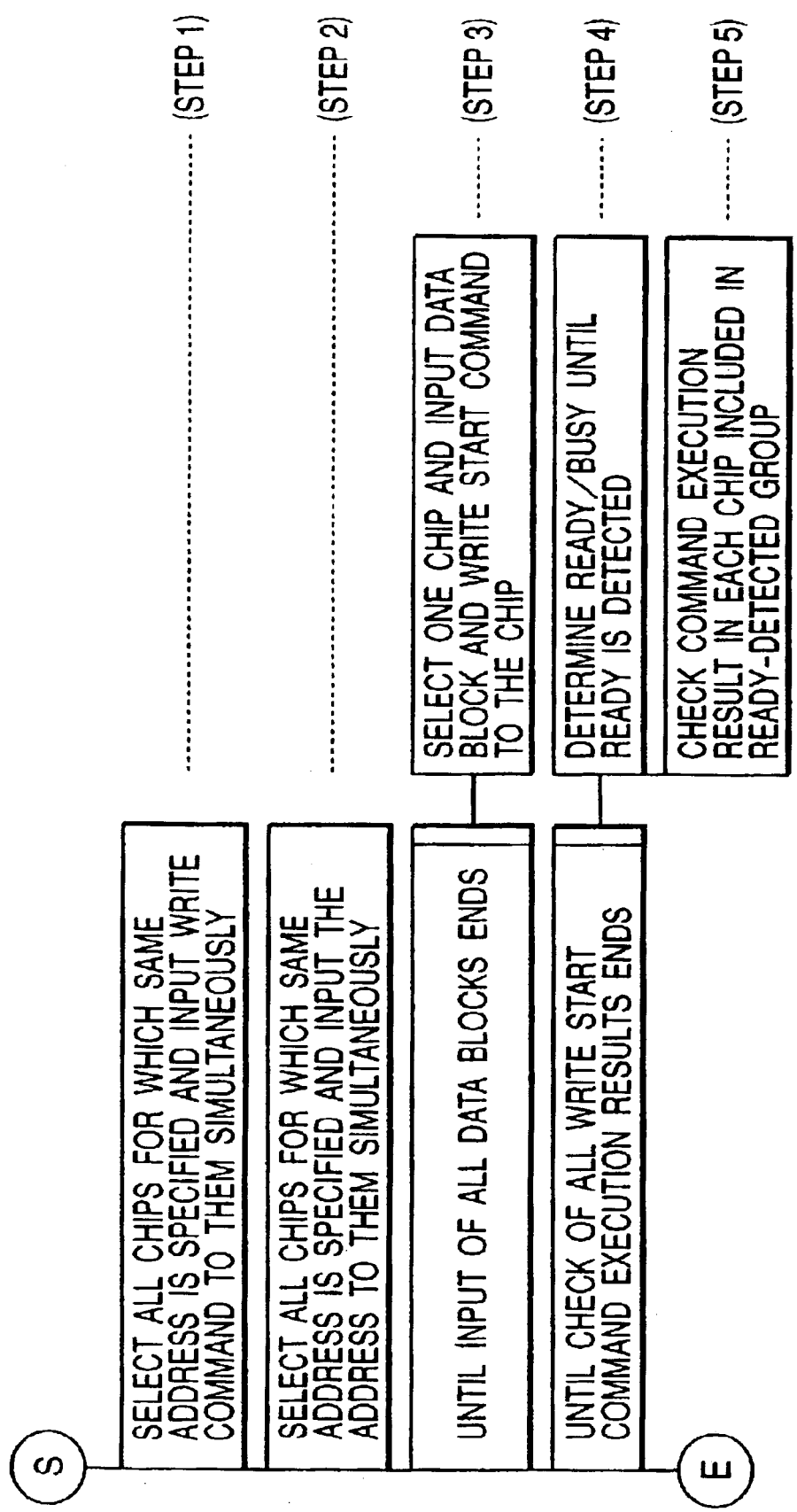
FIG. 4 is a flowchart of a writing controlling method for writing data in the same addresses specified in a plurality of flash memory chips with use of the third Ready/Busy determination method.

FIG. 4 shows a flowchart for controlling the writing with use of the third Ready/Busy determination method. In STEP1, a write command is inputted simultaneously to each of the flash memory chips to which the same address is to be inputted. In STEP2, the same address are inputted simultaneously to each of the flash memory chips to which a write command is inputted in STEP1. In STEP3, one of the above flash memory chips is selected so that a data block and a write start command are inputted to the chip sequentially. The flash memory chip selection in STEP3 is done in order of data block writing until the input of all of the data blocks and write start commands is completed. In STEP4, Ready/Busy is determined in each flash memory chip until Ready is detected therein. In STEP5, the status register of each flash memory chip included in a Ready-detected group is read to check the result of the write start command execution therein. The processings in STEP4 and STEP5 are repeated for each flash memory chip to which a write command is inputted in STEP1 until the result of the command execution is confirmed therein. The processings in STEP4 and STEP5 can be done for each group in order of data block input or in order of Ready detection.

Figure 5:
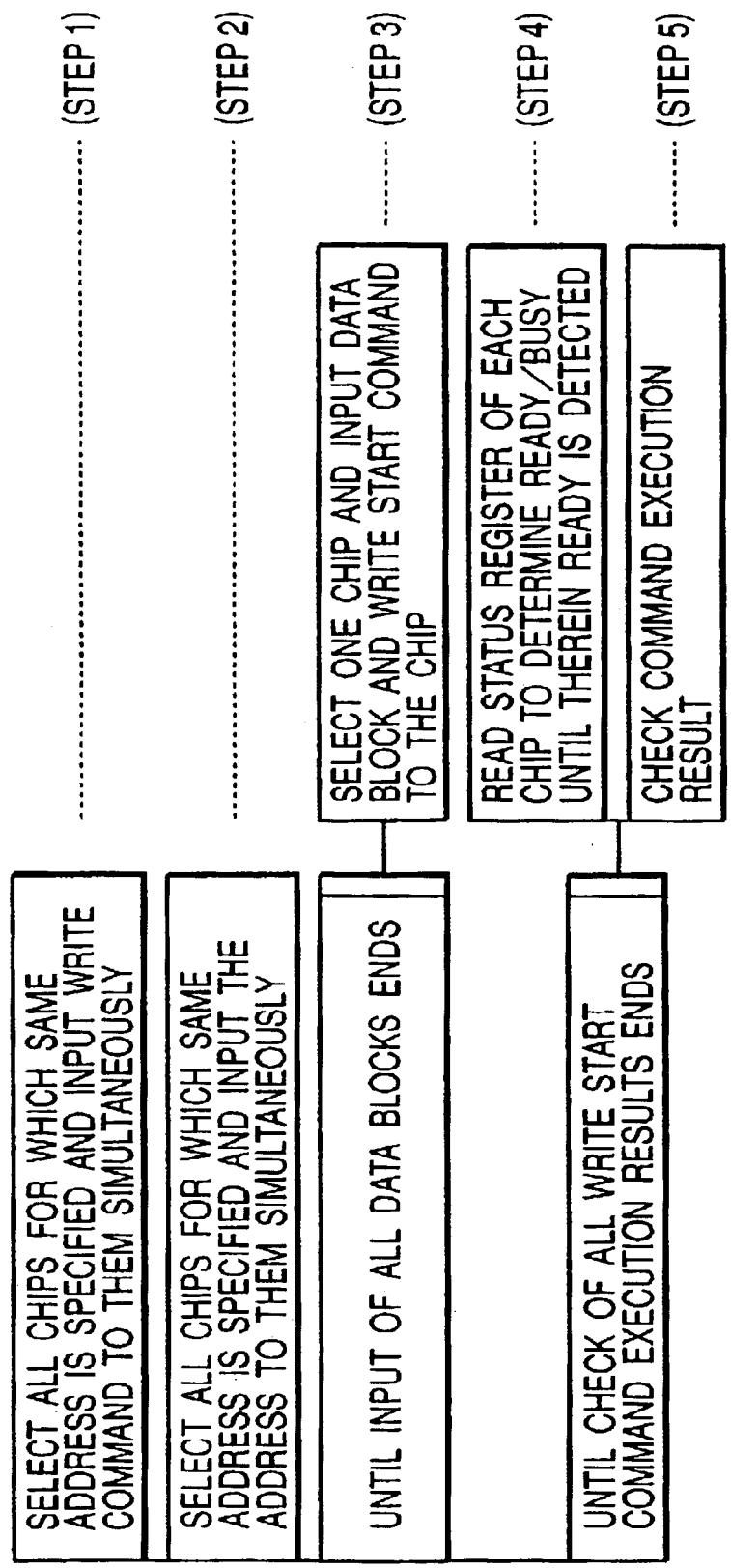
FIG. 5 is a flowchart of a writing controlling method for writing data in the same addresses specified in a plurality of flash memory chips with use of the fourth Ready/Busy determination method.

FIG. 5 shows a flowchart for controlling the writing with use of the fourth Ready/Busy determination method. In STEP1, a write command is inputted simultaneously to each of the flash memory chips to which the same address is to be inputted. In STEP2, the same address is inputted simultaneously to each of the flash memory chips to which a write command is inputted in STEP1. In STEP3, one of the above flash memory chips is selected so that a data block and a write start command are inputted to the chip sequentially. The flash memory chip selection in STEP3 is done in order of data block writing until the input of all of the data blocks and write start commands is completed. In STEP4, Ready/Busy is determined in each flash memory chip until Ready is detected therein. In STEP5, the status register of each flash memory chip in the subject group in which Ready is detected in STEP4 is used to check the result of the write start command execution therein. The processings in STEP4 and STEP5 are repeated until the result of the write start command execution is confirmed in each flash memory chip to which a write command is inputted in STEP1.

Next, a flowchart for controlling writing of data described with reference to FIGS. 2 through 5 will be described more in detail with reference to FIGS. 6 through 10.

Figure 6:
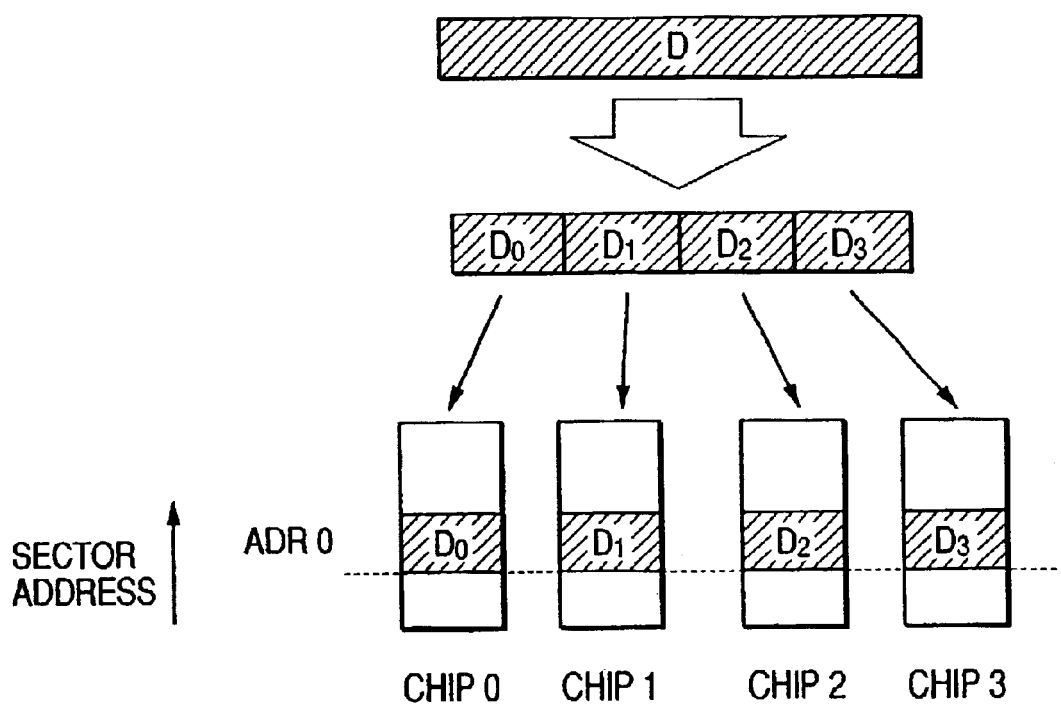
FIG. 6 is physical positions in which data is written when the same addresses are specified in a plurality of flash memory chips.

FIG. 6 shows physical positions in which data is written. Write data D is divided into data blocks D0 to D3, each having a size of an integer multiple of the sector size. In this case, it is premised that the data block size is equal to the sector size. Data blocks D0 to D3 are written in different flash memory chips. Data blocks D0 to D3 are all written in the same sector addresses ADR0 in those chips.

Figure 7:
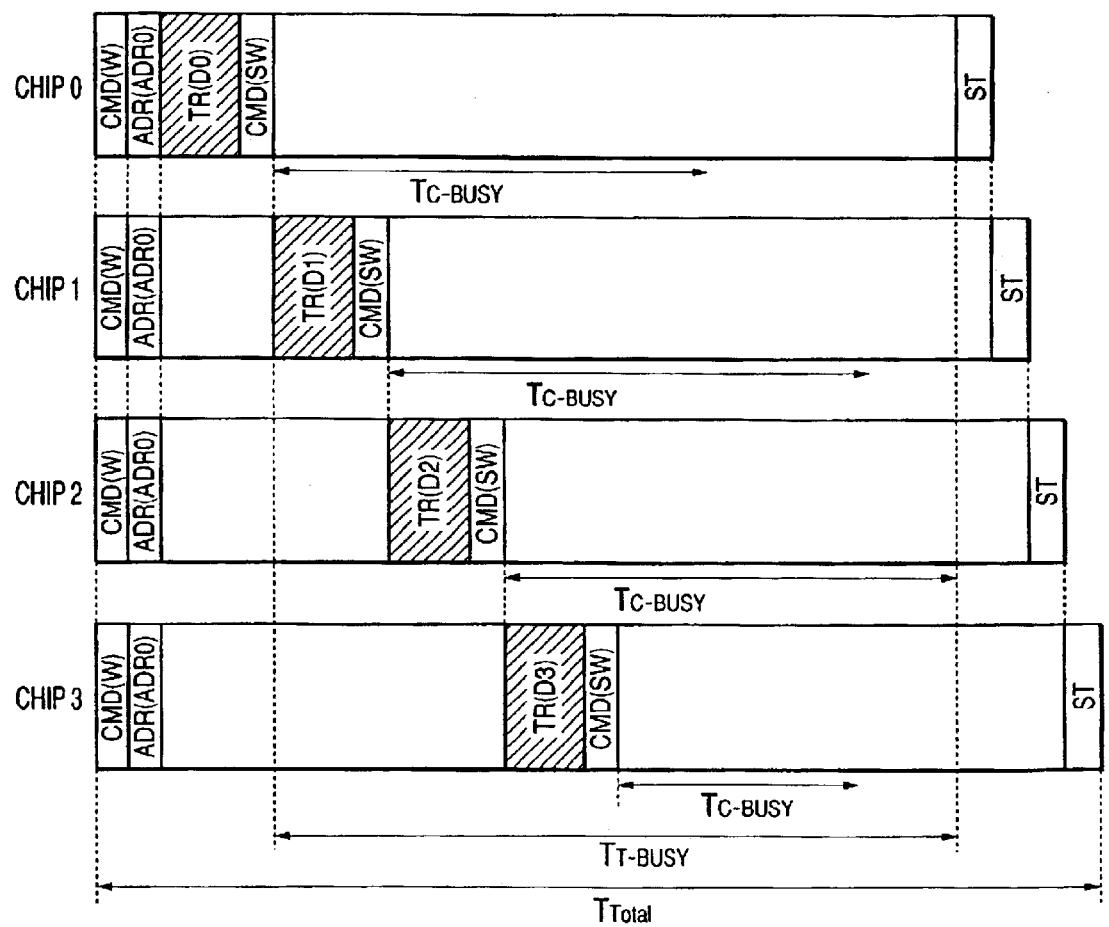
FIG. 7 is a chart for describing a writing controlling method on the time axis for writing data in the same addresses specified in a plurality of flash memory chips with use of the first Ready/Busy determination method.

FIG. 7 shows a flowchart for controlling the writing shown in FIG. 2 on the time axis. At first, flash memory select signals CE0 to CE3 are activated so that a write command is inputted simultaneously to each of the flash memory chips 0 to 3. In FIG. 7, the write command input is described as CMD(W). Then, the same sector address ADR0 is inputted simultaneously to each of the flash memory chips 0 to 3. In FIG. 7, the address ADR0 input is described as ADR(ADR0). After this, only the chip select signal CE0 is activated so that the data block 0 is inputted to the flash memory chip 0. Consequently, the data block 0 is stored in the buffer memory provided in the flash memory chip 0. At this time, the data block 0 is not written yet in any memory cell. In FIG. 7, the data block D0 input is described as TR(D0). Just after the data block 0 input, a write start command is inputted to the flash memory chip 0. Consequently, writing of the data block 0 in memory cells begins when the data is read from the buffer memory of the flash memory chip 0. The $T_{C\_BUSY}$ denotes a time required for writing the data in a memory cell by reading it from the buffer memory of the flash memory chip 0. During this $T_{C\_BUSY}$, Busy is output from the Ready/Busy terminal of the flash memory chip. After this, the flash memory chip select signal CE1 is activated so that the data block D1 is inputted (TR(D1)), then a write start command is inputted (CMD(SW)) to the flash memory chip 1 sequentially. Hereinafter, the flash memory chip select signal is changed over sequentially to input each of the rest data blocks (TR(D2), TR(D3)) and a write start command (CMD(SW)) to each of the rest flash memory chips 2 and 3. The $T_{T\_BUSY}$ denotes a period in which Busy is detected in the Ready/Busy determination. Because the first Ready/Busy determination method is used here, it is determined that the status is Busy if any one of the above flash memory chips is Busy. After Ready is detected as the result of the Ready/Busy determination, the status register of each flash memory chip is read sequentially to check the result of the command execution therein. In FIG. 7, the status register reading is described as ST.

Figure 8:
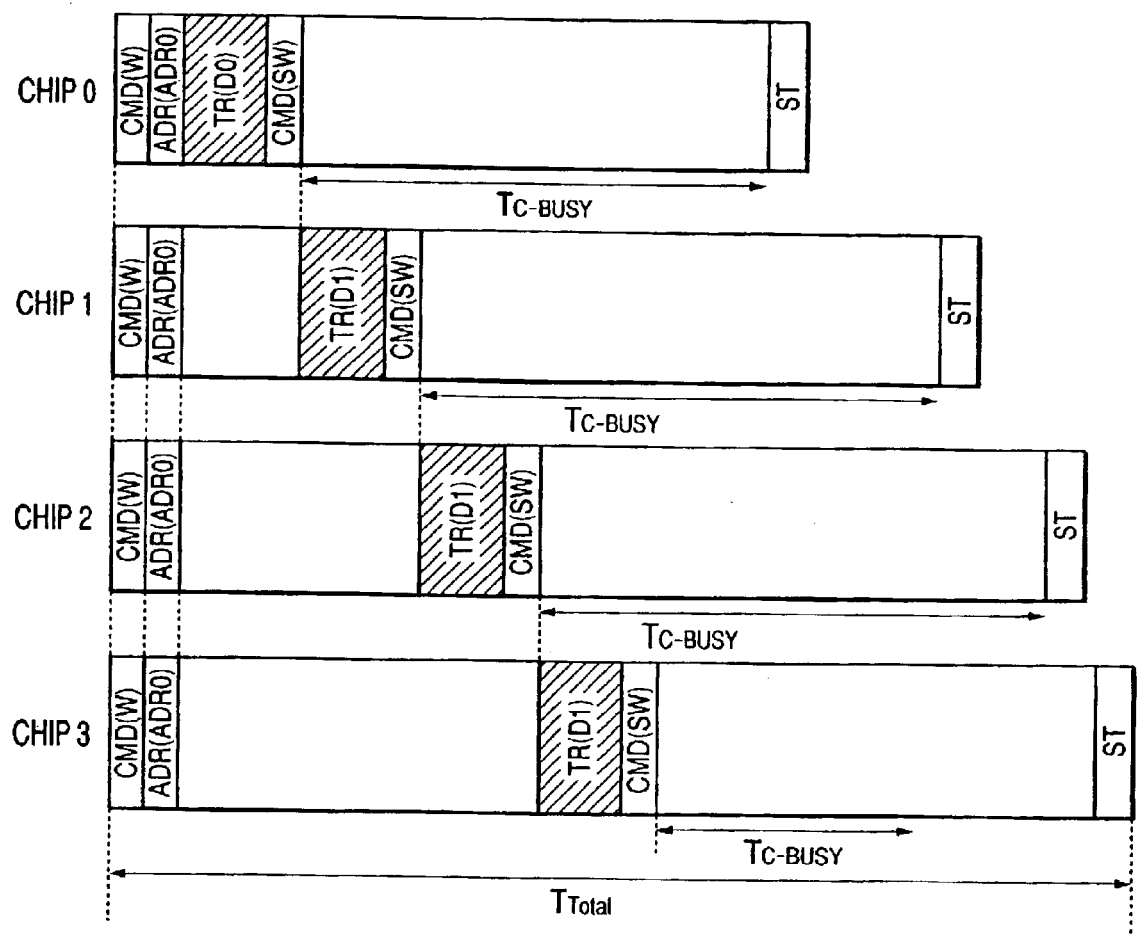
FIG. 8 is a chart for describing a writing controlling method on the time axis for writing data in the same addresses specified in a plurality of flash memory chips with use of the second Ready/Busy determination method.

FIG. 8 shows a flowchart for controlling the writing shown in FIG. 3 on the time axis. At first, flash memory select signals CE0 to CE3 are activated so that a write command is inputted (CMD(W)) simultaneously to each of the flash memory chips 0 to 3. Then, the same sector address ADR0 is inputted (ADR(ADR0)) simultaneously to each of the flash memory chips 0 to 3. After this, only the chip select signal CE0 is activated so that the data block 0 is inputted to the flash memory chip 0 (TR(D0)). Just after the data block 0 input, a write start command is inputted to the flash memory chip 0 (CMD(SW)). After this, only the flash memory chip select signal CE1 is activated so that the data block D1 and a write start command are inputted (TR(D1)) (CMD(SW)) to the flash memory chip 1 sequentially. Hereinafter, the flash memory chip select signal is changed over sequentially to input each of the rest data blocks (TR(D2), TR(D3)) and the write start command (CMD (SW)) to each of the rest flash memory chips 2 and 3. Because the second Ready/Busy determination method is used here, Ready/Busy can be determined in each flash memory chip separately. The command execution result can thus be checked in any of the following two methods; one method enables Ready/Busy to be determined in each flash memory chip in order of Ready detection and the next chip to be selected for Ready/Busy determination and the other method enables the next flash memory chip to be selected for the Ready/Busy determination after a flash memory chip is selected and the result of the command execution is checked therein in order of data block input. FIG. 8 shows a method for selecting the next flash memory chip for the Ready/Busy determination in order of data block connection.

Figure 9:
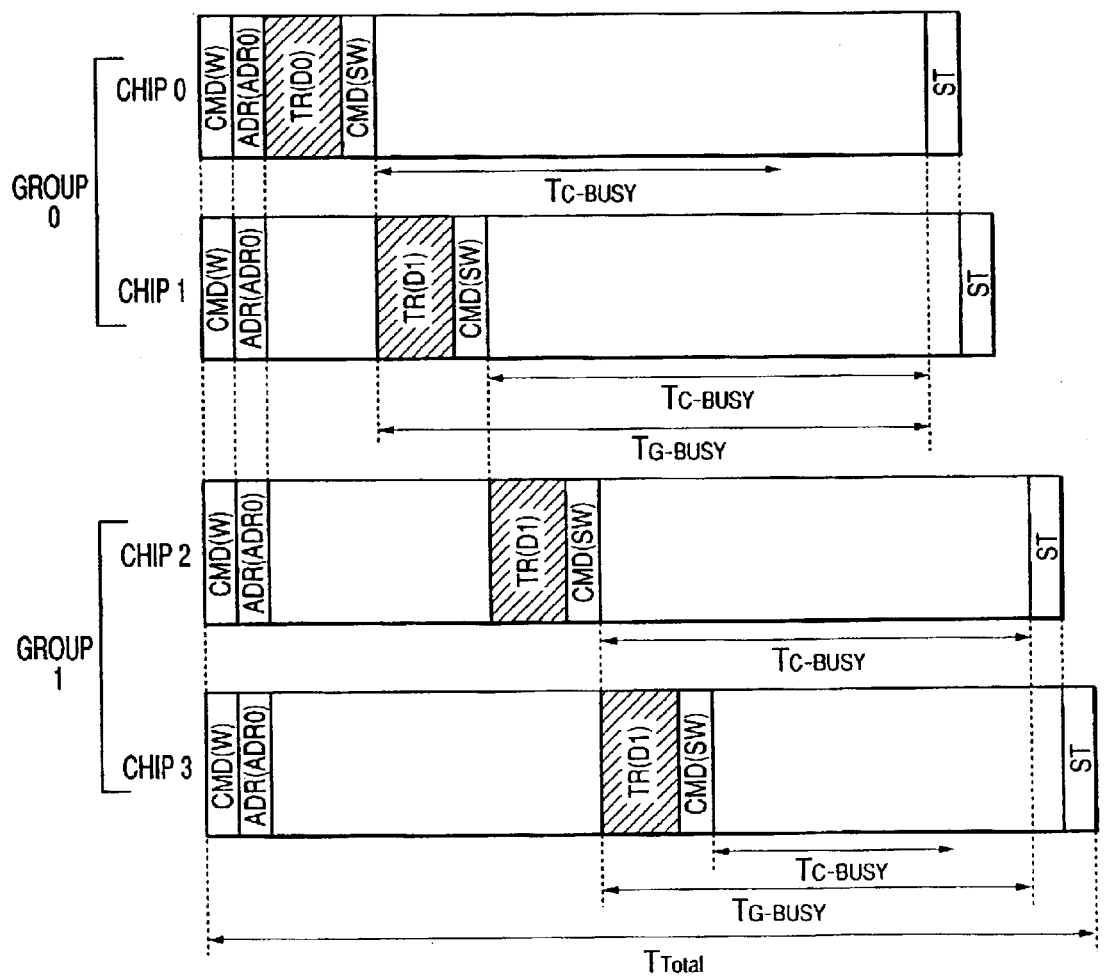
FIG. 9 is a chart for describing a writing controlling method on the time axis for writing data in the same addresses specified in a plurality of flash memory chips with use of the third Ready/Busy determination method.

FIG. 9 shows a flowchart for controlling the writing shown in FIG. 4 on the time axis. It is premised here that the flash memory chips 0 and 1 are included in the group 0 and the flash memory chips 2 and 3 are included in the group 1 to be subjected to the Ready/Busy determination respectively. At first, flash memory select signals CE0 to CE3 are activated so that a write command is inputted (CMD(W)) simultaneously to each of the flash memory chips 0 to 3 and the same sector address ADR0 is inputted (ADR(ADR0)) simultaneously to each of the flash memory chips 0 to 3. After this, only the chip select signal CE0 is activated so that the data block 0 is inputted to the flash memory chip 0 (TR(D0)). Just after the data block 0 input, a write start command is inputted to the flash memory chip 0 (CMD (SW)). After this, only the flash memory chip select signal CE1 is activated so that the data block D1 and a write start command are inputted (TR(D1))(CMD(SW)) to the flash memory chip 1 sequentially. Hereinafter, the flash memory chip select signal is changed over sequentially to input each of the rest data blocks (TR(D2), TR(D3)) and a write start command (CMD(SW)) to each of the rest flash memory chips 2 and 3. After the input of all of the data blocks and write start commands, Ready/Busy is determined and the status register of each chip is read to check the command execution therein. In this case, Ready/Busy is determined in each group separately. The command execution result can thus be checked in those groups by any of the following two methods; in order of Ready detection and in order of data block input, that is, the Ready/Busy determination and the status register reading may begin at the group 0. FIG. 8 shows the latter method, which determines Ready/Busy in order of data block input. In FIG. 8, a period in which Busy is detected in each group is described as $T_{G\_BUSY}$.

Figure 10:
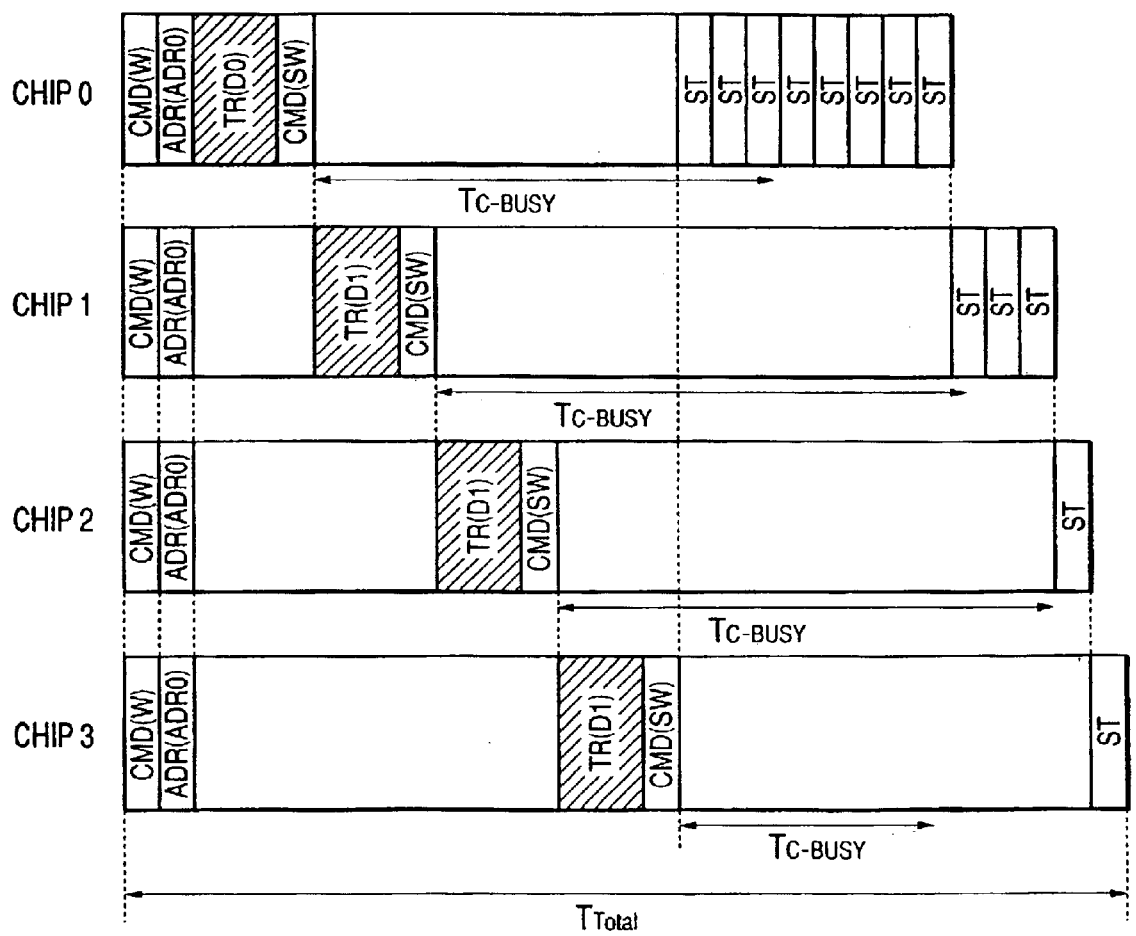
FIG. 10 is a chart for describing a writing controlling method on the time axis for writing data in the same addresses specified in a plurality of flash memory chips with use of the fourth Ready/Busy determination method.

FIG. 10 shows a flowchart for controlling the writing shown in FIG. 5 on the time axis. At first, flash memory select signals CE0 to CE3 are activated so that a write command is inputted (CMD(W)) simultaneously to each of the flash memory chips 0 to 3. Then, the same sector address ADR0 is inputted (ADR(ADR0)) simultaneously to each of the flash memory chips 0 to 3. After this, only the chip select signal CE0 is activated so that the data block 0 is inputted to the flash memory chip 0 (TR(D0)). Just after the data block 0 input, a write start command is inputted to the flash memory chip 0 (CMD(SW)). After this, only the flash memory chip select signal CE1 is activated so that the data block D1 and a write start command (CMD(SW)) are inputted to the flash memory chip 1 sequentially (TR(D1)) (CMD(SW)). Hereinafter, the flash memory chip select signal is changed over sequentially to input each of the rest data blocks (TR(D2), TR(D3)) and a write start command (CMD(SW)) to each of the rest flash memory chips 2 and 3. Ready/Busy is determined and the status register is read in each chip sequentially to check the command execution result therein. In this case, the Ready/Busy determination and the command execution result check can be made by two methods. One method selects a flash memory chip sequentially to read its status register to determine Ready/Busy therein. When Ready is detected in a chip, the status register value is used to check the command execution result therein. This method comes to check the command execution result in each flash memory chip in order of Ready detection. The other method selects a flash memory chip and reads its status register to determine Ready/Busy therein until Ready is detected. After this, the next flash memory chip is selected. Just like the above methods, the command execution result is checked in the chip with the value read from the status register when Ready is detected therein. FIG. 10 shows the latter method and the flash memory chips are changed over in order of data block input.

Next, a description will be made for a method for controlling writing of data in a plurality of different addresses specified in a plurality of flash memory chips with reference to FIGS. 11 to 18. In this case, data is divided into a plurality of data blocks, each having a size of an integer multiple of the sector size. The data blocks are stored in the plurality of different addresses specified in the plurality of flash memory chips.

Figure 11:
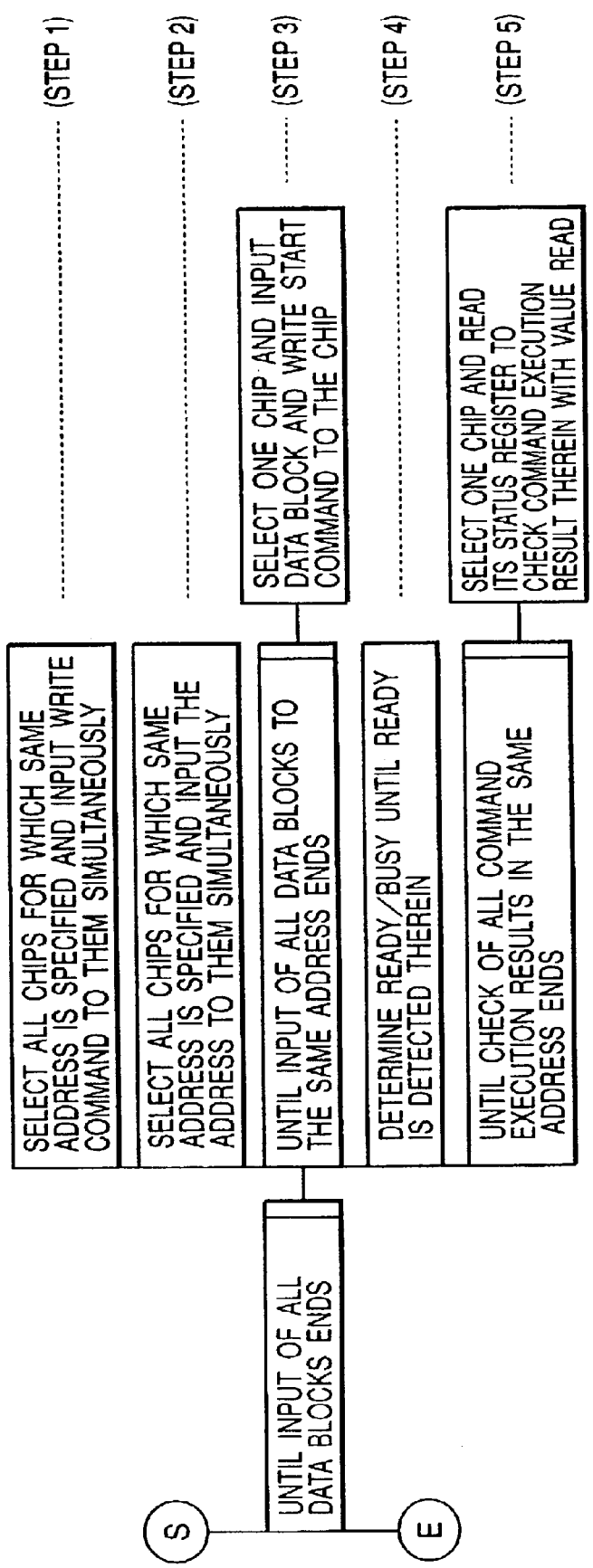
FIG. 11 is a flowchart of a writing controlling method for writing data in a plurality of different addresses specified in a plurality of flash memory chips with use of the first Ready/Busy determination method.

FIGS. 11 through 14 show the flowcharts of the methods for controlling the writing in accordance with the first to fourth Ready/Busy determination methods. FIG. 11 shows a flowchart for controlling the writing in accordance with the first Ready/Busy determination method. In STEP1, a write command is inputted simultaneously to each of the flash memory chips to which the same address is to be inputted. In STEP2, the same sector address is inputted simultaneously to each of the flash memory chips to which a write command is inputted in STEP1. In STEP3, one of the chips is selected and a data block and a write start command are inputted to the chip. The processing in STEP3 is executed for each chip to which a write command is inputted in STEP1 and a sector address is inputted in STEP2. In STEP4, Ready/Busy is determined in each chip until Ready is detected therein. In STEP5, the status register of each chip is read sequentially to check the execution result of the write command inputted in STEP3. The processings in STEP1 to STEP5 are repeated until all the data blocks are written while the sector address in another chip is selected sequentially.

Figure 12:
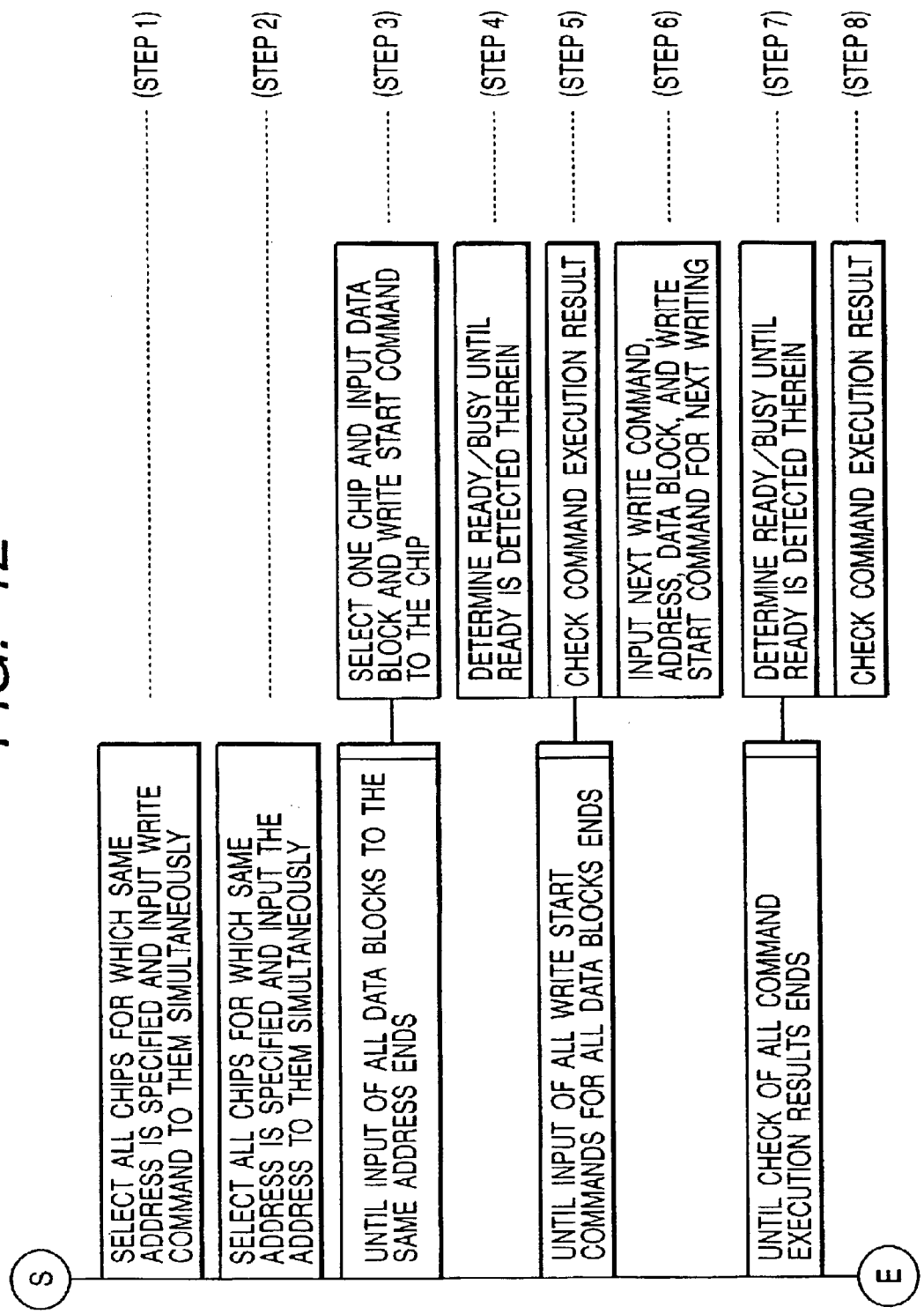
FIG. 12 is a flowchart of a writing controlling method for writing data in a plurality of different addresses specified in a plurality of flash memory chips with use of the second Ready/Busy determination method.

FIG. 12 shows a flowchart for controlling the writing in accordance with the second Ready/Busy determination method. In STEP1, a write command is inputted simultaneously to each of the flash memory chips to which the same sector address is to be inputted. In STEP2, the same sector address is inputted simultaneously to each of the flash memory chips to which a write command is inputted in STEP1. In STEP3, one of the above flash memory chips is selected and a data block and a write start command are inputted sequentially to the chip. The processing in STEP3 is repeated while flash memory chips are changed over in order of data block input until the input of all the specified data blocks and write start commands to the same sector addresses in the flash memory chips are completed. In STEP4, Ready/Busy is determined in each flash memory chip until Ready is detected therein. In STEP5, the status register of each chip in which Ready is detected in STEP4 is read sequentially to check the result of the write command execution therein. In this case, Ready/Busy can be determined in each chip separately. It is thus possible to determine Ready/Busy and check the result of the write command execution in each chip in order of data block input. It is also possible to read the status register of each Ready-detected flash memory chip to check the result of the command execution therein. In STEP6, the next write command, the sector address, the data block, and the write start command for the next writing are inputted to each flash memory chip in which the command execution result is checked in STEP5. The processings in STE4 to STEP6 are repeated until the input of all the data blocks and write start commands is completed. In STEP7, Read/Busy is determined in each flash memory chip with respect to the write start command inputted last to the chip in STEP6. InSTEP7, the status register of each flash memory chip is read to check the result of the command execution therein.

Figure 13:
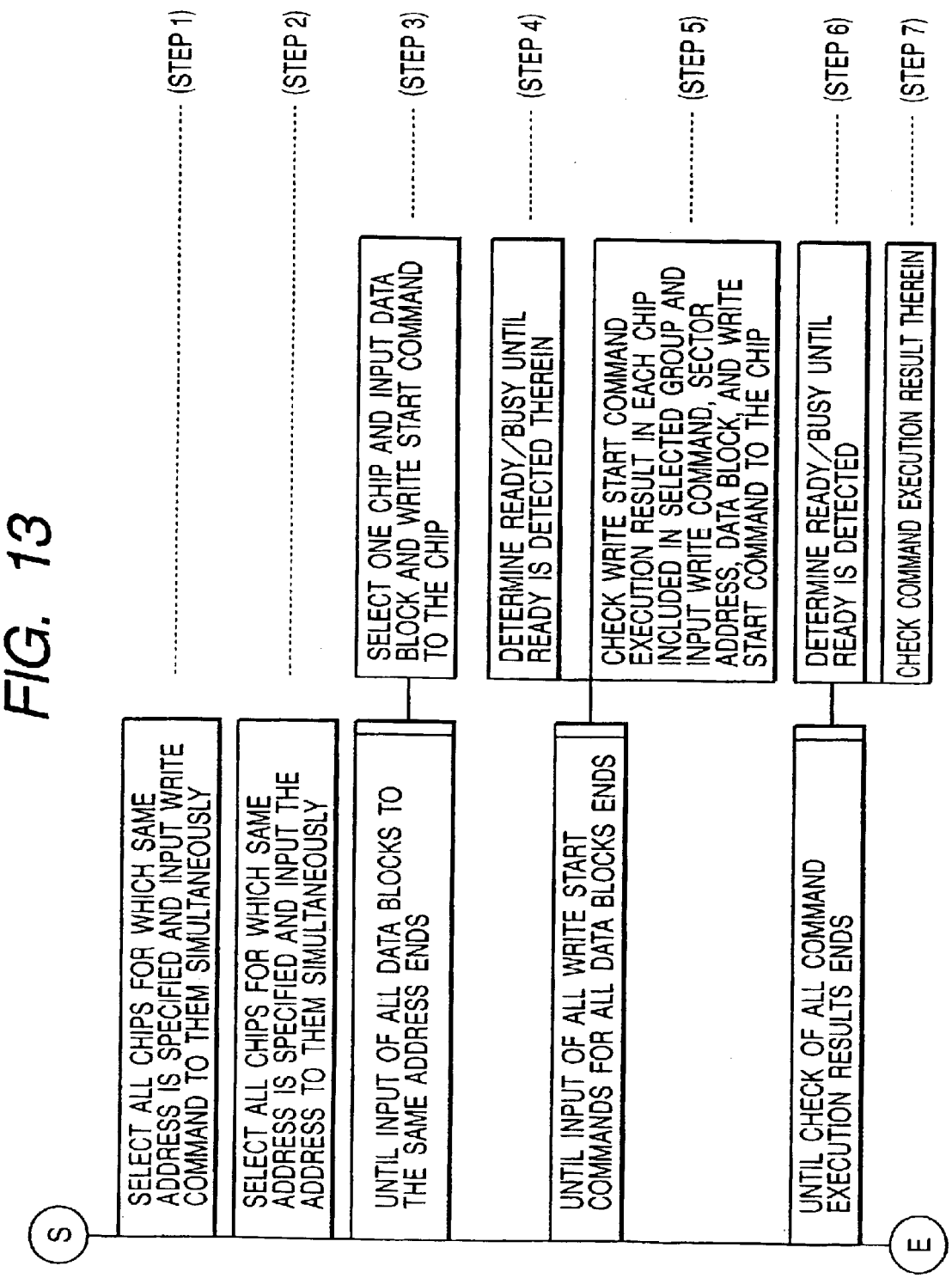
FIG. 13 is a flowchart of a writing controlling method for writing data in a plurality of different addresses specified in a plurality of flash memory chips with use of the third Ready/Busy determination method.

FIG. 13 shows a flowchart for controlling the writing in accordance with the third Ready/Busy determination method. In STEP1, a write command is inputted simultaneously to each of the flash memory chips to which the same sector address is to be inputted. In STEP2, the same sector address is inputted simultaneously to each of the flash memory chips to which a write command is inputted in STEP1. In STEP3, one of the above flash memory chips is selected and a data block and a write start command are inputted sequentially to the chip. The processing in STEP3 is repeated while flash memory chips are changed over in order of data block input until the input of all the specified data blocks and write start commands to the above same sector addresses is completed. In STEP4, Ready/Busy is determined in each of the flash memory chips until Ready is detected therein. In STEP5, one of the flash memory chips included in a Ready-detected group is selected and its status register is read to check the result of the write start command execution therein. After this, the write command, the sector address, the data block, and the write start command for the next writing are inputted to the chip respectively. In STEP5, the result of the write start command execution is checked in each of the rest flash memory chips in the group in which Ready is detected in STEP4. The processings in STEP4 and STEP5 are repeated until the input of all of the data blocks and write start commands is completed. In STEP6, Ready/Busy is determined in each flash memory chip with respect to the write start command inputted last to the chip in STEP5. In STEP7, the status register of each flash memory chip is read to check the result of the command execution therein.

Figure 14:
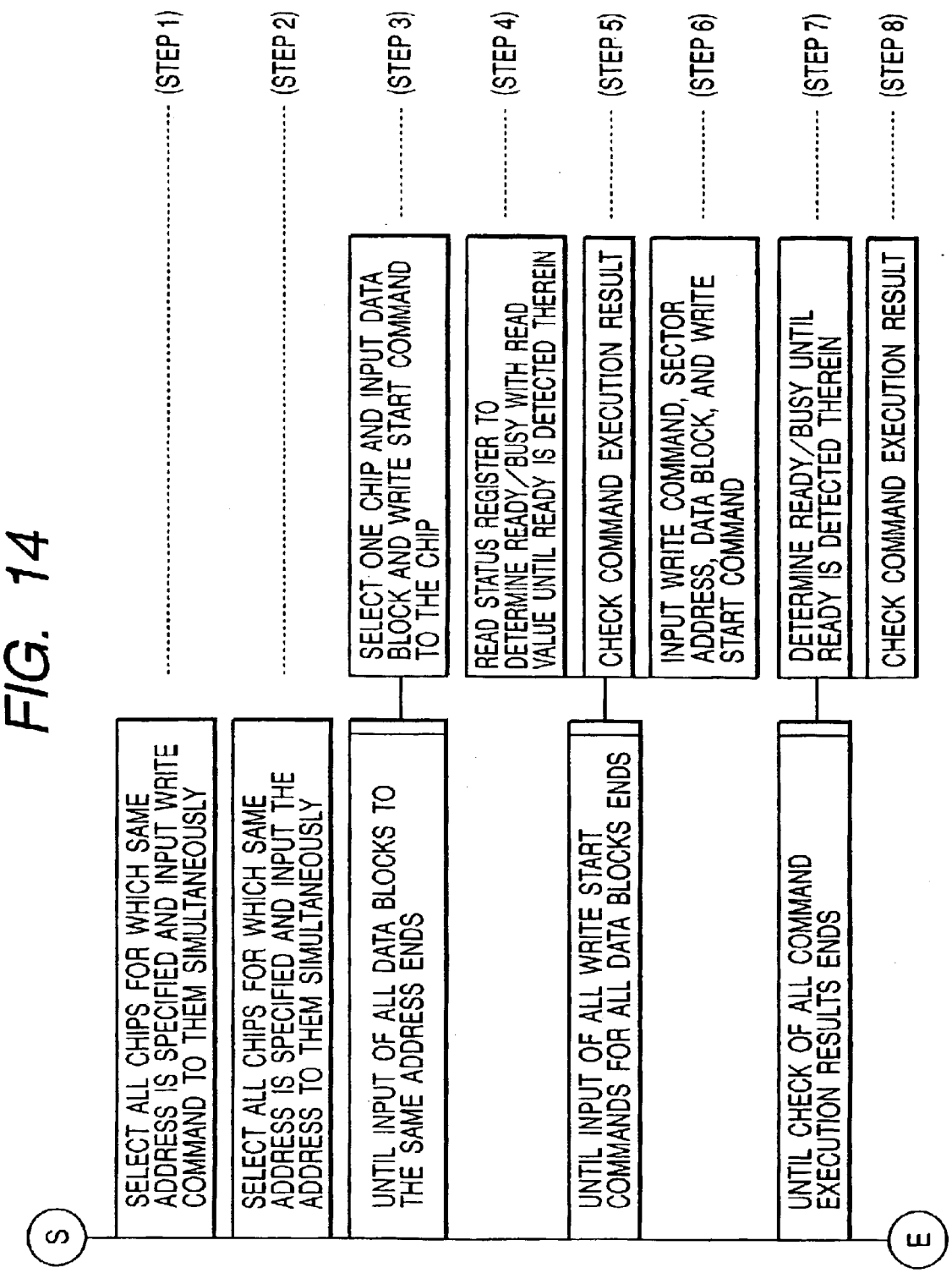
FIG. 14 is a flowchart of a writing controlling method for writing data in a plurality of different addresses specified in a plurality of flash memory chips with use of the fourth Ready/Busy determination method.

FIG. 14 shows a flowchart for controlling the writing in accordance with the fourth Ready/Busy determination method. In STEP1, a write command is inputted simultaneously to each of the flash memory chips to which the same address is to be inputted. In STEP2, the same sector address is inputted simultaneously to each of the flash memory chips to which a write command is inputted in STEP1. In STEP3, one of the above flash memory chips is selected and a data block and a write start command are inputted sequentially to the chip. The processing in STEP3 is repeated while flash memory chips are changed over in order of data block input until the input of all of the specified data blocks and write start commands to the same sector addresses is completed. In STEP4, Ready/Busy is determined in each flash memory chip until Ready is detected therein. In STEP5, the status register of each flash memory chip is read to check the result of the write start command execution therein. In STEP6, the write command, the sector address, the data block, and the write start command for the next writing are inputted to each flash memory chip for which the result of the command execution is checked in STEP5. The processings in STEP4 to STEP6 are repeated until the input of all of the write start commands and data blocks to the same addresses is completed. The processings in STEP4 and STEP5 can be executed by two methods for the above flash memory chips; in order of data block input and in order of Ready detection. In STEP7, Ready/Busy is determined in each flash memory chip with respect to the write start command inputted last to the memory chip in STEP6. In STEP8, the status register of each flash memory chip is read to check the result of the write start command execution therein.

Figure 15:
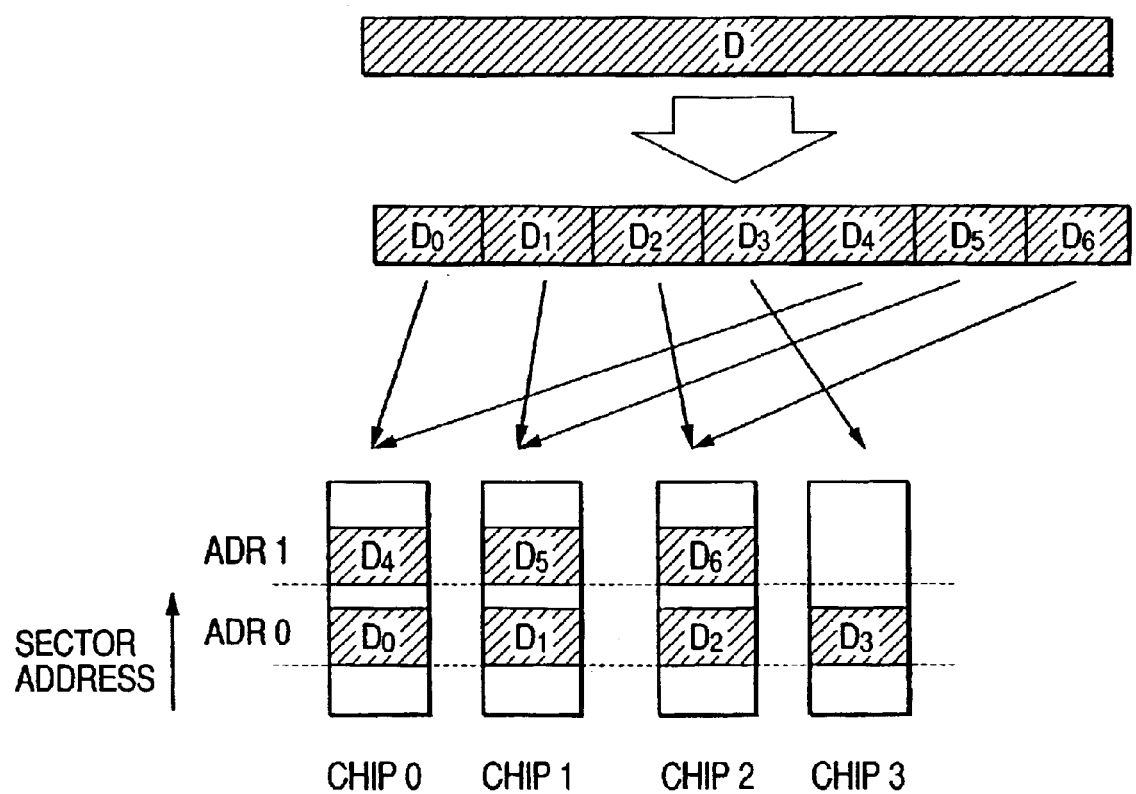
FIG. 15 is physical positions in which data is written when a plurality of different addresses are specified in a plurality of flash memory chips.

Next, a description will be made more in detail for the flowchart for controlling the writing shown in FIGS. 11 through 14 with reference to FIGS. 15 through 19. FIG. 15 shows physical positions in which data is written. At first, write data D is divided into a plurality of data blocks D0 to D6, each having the same data size as an integer multiple of the sector size. In this connection, the data block size is set equally to the sector size described below. Consecutive data blocks are stored in different flash memory chips as far as possible and target data is written in the same sector addresses in those chips as far as possible. In this case, data blocks D0 to D3 are stored in the same sector addresses ADR0 specified in the flash memory chips 0 to 3 and data blocks D4 to D6 are stored in the same sector addresses ADR1 specified in the flash memory chips 0 to 2.

Figure 16:
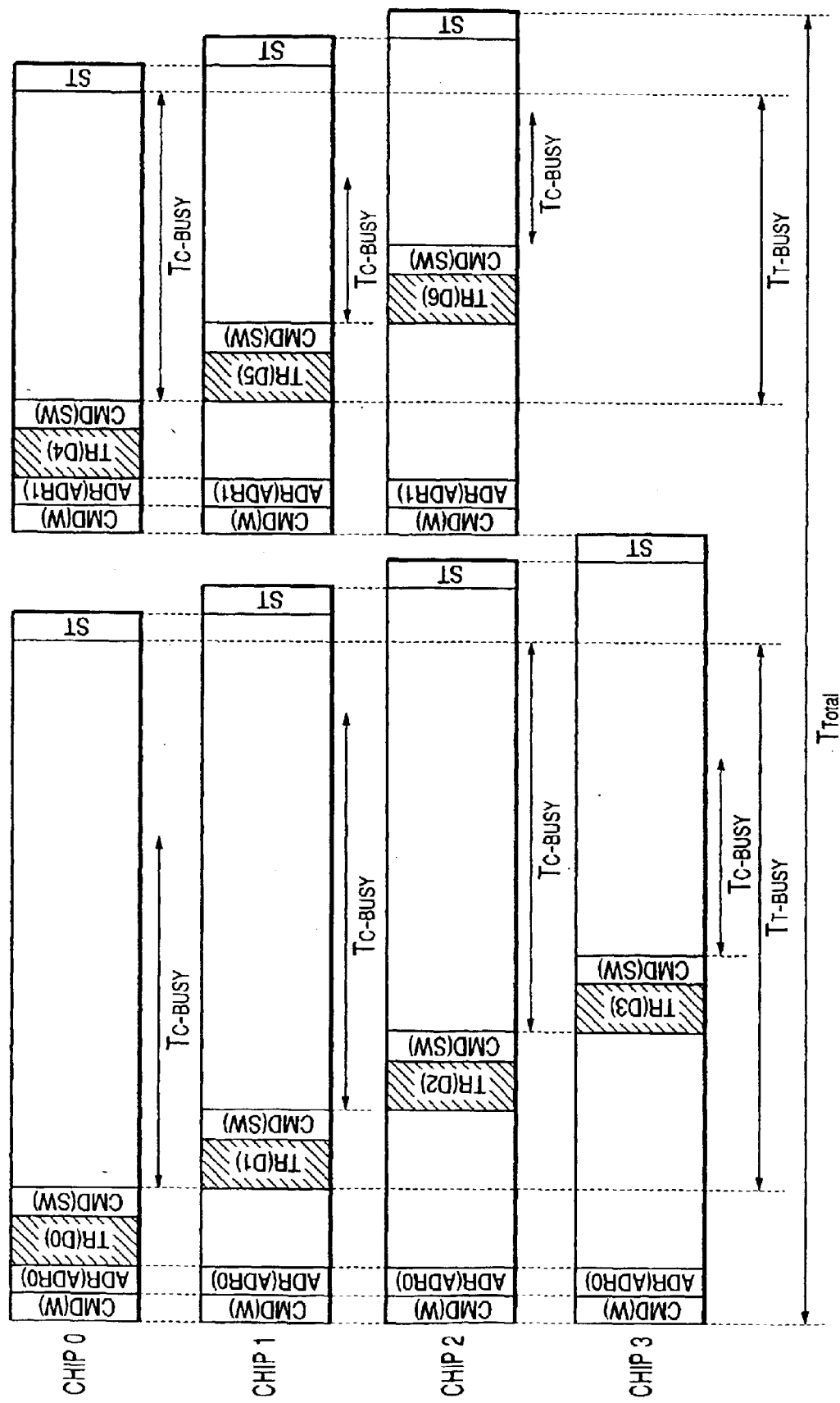
FIG. 16 is a chart for describing a writing controlling method on the time axis for writing data in a plurality of different addresses specified in a plurality of flash memory chips with use of the first Ready/Busy determination method.

FIG. 16 shows a flowchart for controlling the writing shown in FIG. 11 on the time axis. At first, the chip select signals CE0 to CE3 are activated so that a write command is inputted (CMD(W)) simultaneously to each of the flash memory chips 0 to 3. After this, the same sector address ADR0 is inputted (ADR(ADR0)) simultaneously to each of the flash memory chips 0 to 3. Then, only the chip select signal CE0 is activated so that the data block D0 is inputted (TR(D0)) to the flash memory chip 0. Just after this input, a write start command is inputted (CMD(SW)) to the flash memory chip 0. Then, only the chip select signal CE1 is activated so that the data block D1 is inputted (TR(D1)), then a write command is inputted (CMD(SW)) to the chip 1 respectively. Hereinafter, while chips are changed over sequentially, each of the rest data blocks (TR(D2), TR(D3)) and a write start command are inputted (CMD(SW)) sequentially. The $T_{T\_BUSY}$ in FIG. 16 denotes a period in which Busy is detected in the Ready/Busy determination. In this case, because the first Ready/Busy determination method is used, Busy is determined if Busy is detected in any one of the flash memory chips 0 to 3. After Ready is detected, the status register of the flash memory chip is read (ST) to check the result of the command execution therein. After this check, the chip select signal CE0 to CE2 are activated so that a write command is inputted (CMD(W)) to each of the flash memory chips 0 to 2 just like in the above writing of the data blocks 0 to 3, then the same sector address ADR1 is inputted (ADR(ADR1)) to each of those flash memory chips 0 to 2. Then, while the flash memory chip select signals are changed over, the remaining inputs of the data blocks (TR(D4), TR(D5), TR(D6) and the write start commands (CMD(SW)), as well as the remaining Ready detection, and the remaining command execution result checks (ST) are done sequentially.

Figure 17:
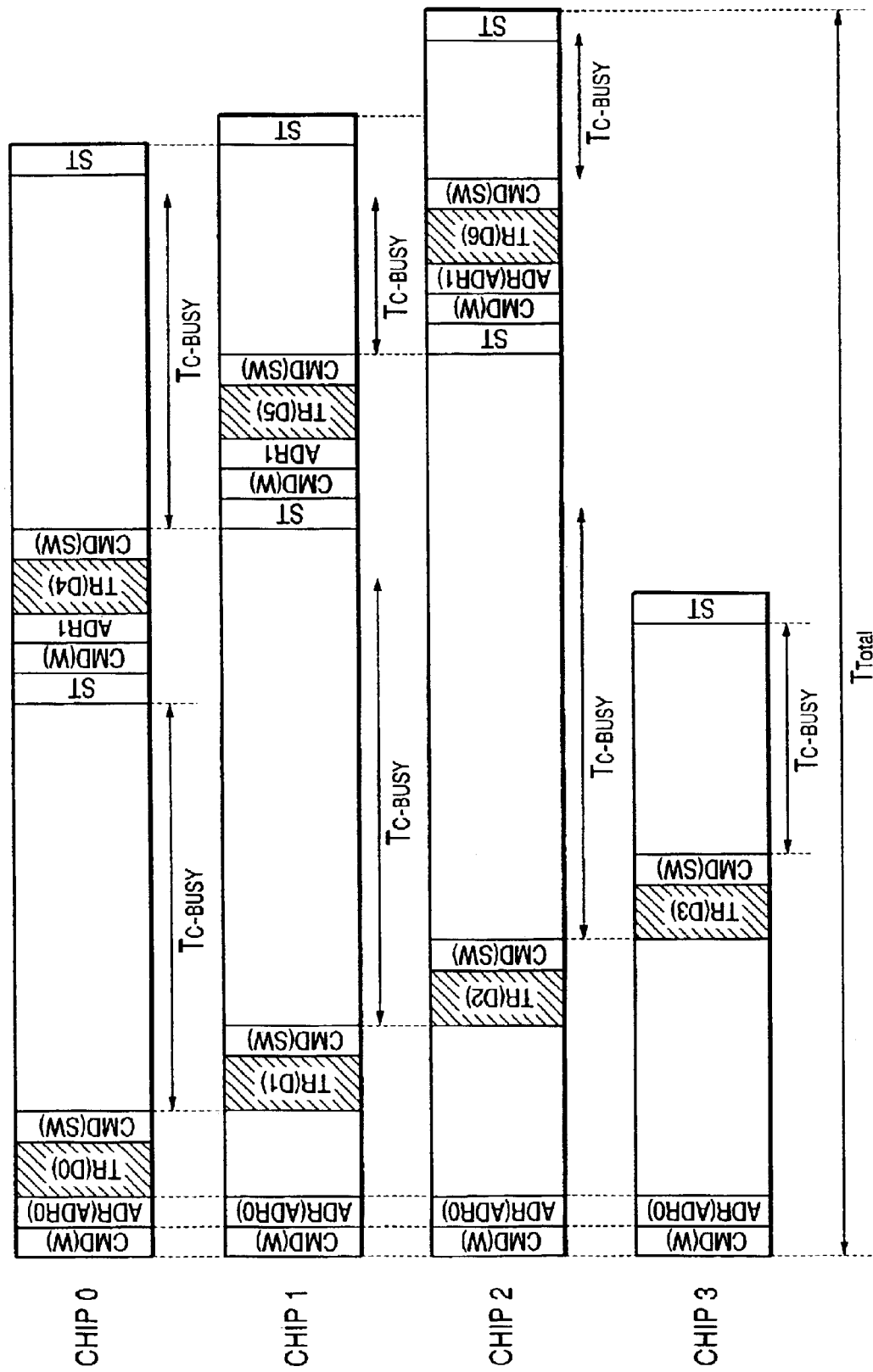
FIG. 17 is a chart for describing a writing controlling method on the time axis for writing data in a plurality of different addresses specified in a plurality of flash memory chips with use of the second Ready/Busy determination method.

FIG. 17 shows a flowchart for controlling the writing shown in FIG. 12 on the time axis. At first, the chip select signals CE0 to CE3 are activated so that a write command is inputted (CMD(W)) simultaneously to each of the flash memory chips 0 to 3. After this, the same sector address ADR0 is inputted (ADR(ADR0)) simultaneously to each of the flash memory chips 0 to 3. Then, only the chip select signal CE0 is activated so that the data block D0 is inputted (TR(D0)) to the flash memory chip 0. Just after this input, a write start command is inputted (CMD(SW)) to the flash memory chip 0. Then, only the chip select signal CE1 is activated so that the data block D1 is inputted (TR(D1)), then a write command is inputted (CMD(SW)) to the chip 1 respectively. Hereinafter, while chip select signals are changed over sequentially, the rest data blocks (TR(D2), TR(D3)) and the write start commands are inputted (CMD (SW)). After the input of the write start command to each of the data blocks D0 to D3, Ready/Busy is determined therein. In this case, Ready/Busy can be determined in each chip separately. Consequently, the subsequent processings can be performed sequentially for each of the chips in order of Ready detection. Here, a method for changing flash memory chips sequentially for Ready/Busy determination will be described. At first, Ready/Busy determination is continued for the flash memory chip 0 until Ready is detected therein. Then, the result of the write start command execution is checked therein. After this, the write command, and the sector address ADR1, the data block D4, and the write start command for the next writing are inputted to the flash memory chip 0. Hereinafter, while the flash memory chips are changed over sequentially, Ready is detected, the result of the preceding write start command execution is checked in each chip, a data block and a write start command are inputted to each chip. After the write start command input to each data block, Ready/Busy is determined and the command execution result is checked therein until the write start command execution results in all the chips are checked.

Figure 18:
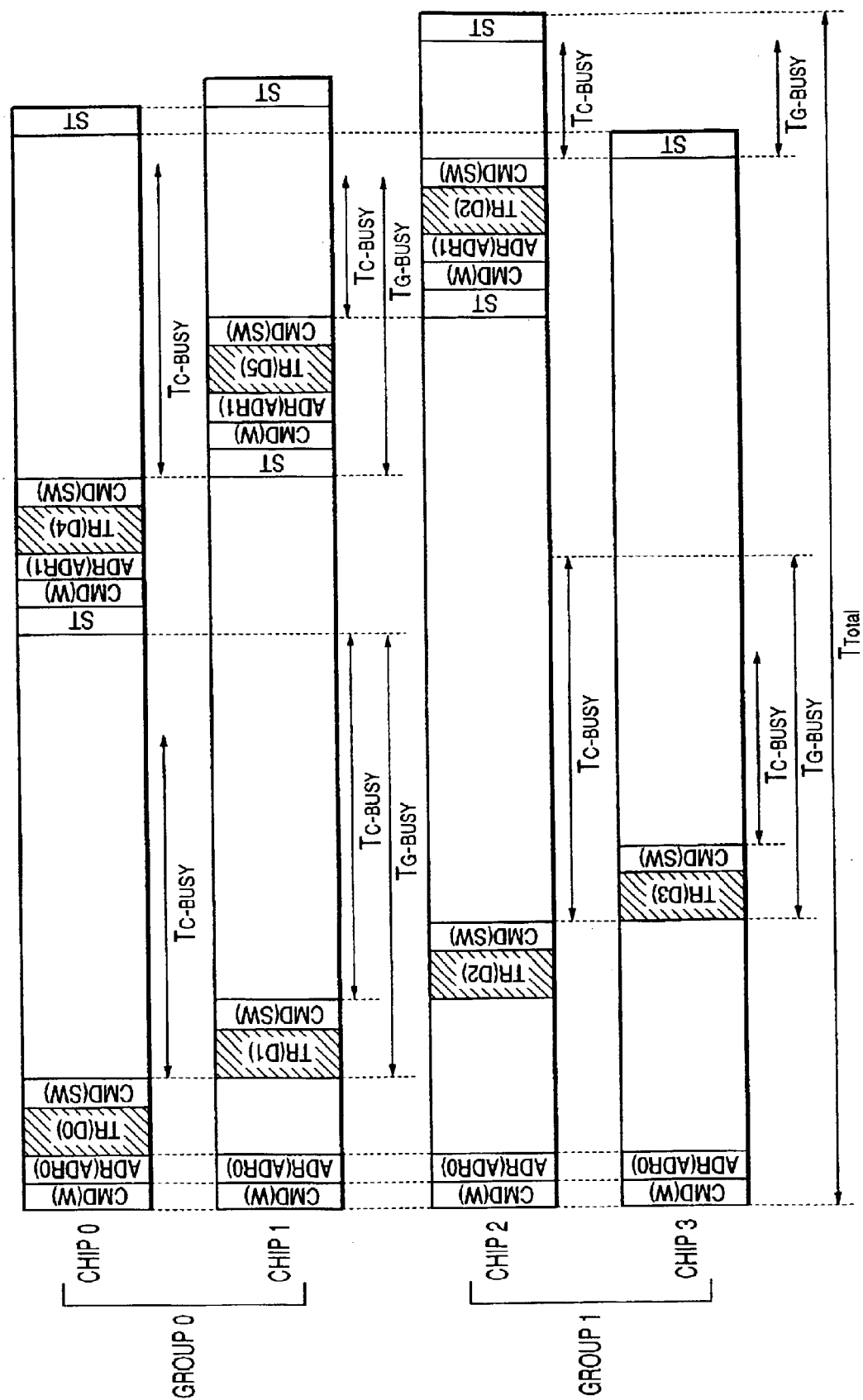
FIG. 18 is a chart for describing a writing controlling method on the time axis for writing data in a plurality of different addresses specified in a plurality of flash memory chips with use of the third Ready/Busy determination method.

FIG. 18 shows a flowchart for controlling the writing shown in FIG. 13 on the time axis. At first, the chip select signals CE0 to CE3 are activated so that a write command is inputted (CMD(W)) simultaneously to each of the flash memory chips 0 to 3, then the same sector address ADR0 is inputted (ADR(ADR0)) simultaneously to each of the flash memory chips 0 to 3. After this, only the chip select signal CE0 is activated so that the data block D0 is inputted (TR(D0)) to the flash memory chip 0. Just after this input, a write start command is inputted (CMD(SW)) to the flash memory chip 0. Then, only the chip select signal CE1 is activated so that the data block D1 is inputted (TR(D1)) and a write command is inputted (CMD(SW)) to the chip 1 respectively. Hereinafter, while chip select signals are changed over sequentially, the rest data block are inputted (TR(D2), TR(D3)), then the write start commands are inputted (CMD(SW)) sequentially. After the write start command is inputted to each chip with respect to each of the data blocks D0 to D3, Ready/Busy is determined in the chip. In this case, while the next processing can be made sequentially for each chip in order of Ready detection, chip groups can also be changed over in order of data block input as follows. In this case, Ready/Busy determination is continued until Ready is detected in the group 0. After Ready is detected in the group 0, the result of the write start command execution is checked in the sector address ADR0 of the flash memory chip 0. After this, the write command, the sector address ADR1, the data block D4, and the write start command for the next writing are inputted to the flash memory chip 0 respectively. Then, the result of the write start command execution is checked in the sector address ADR0 of the flash memory chip 1. After this, the write command, the sector address ADR1, the data block D5, and the write start command for the next writing are inputted to the flash memory chip 1. Then, the groups are changed over from 0 to 1. Hereinafter, the result of the preceding write start command execution is checked and a data block and a write start command are inputted to each chip in the group 1 in order of Ready detection and data block connection. After the input of the write start command to all the target data blocks, Ready/Busy determination and the command execution result check are continued until all the write start commands are checked.

Figure 19:
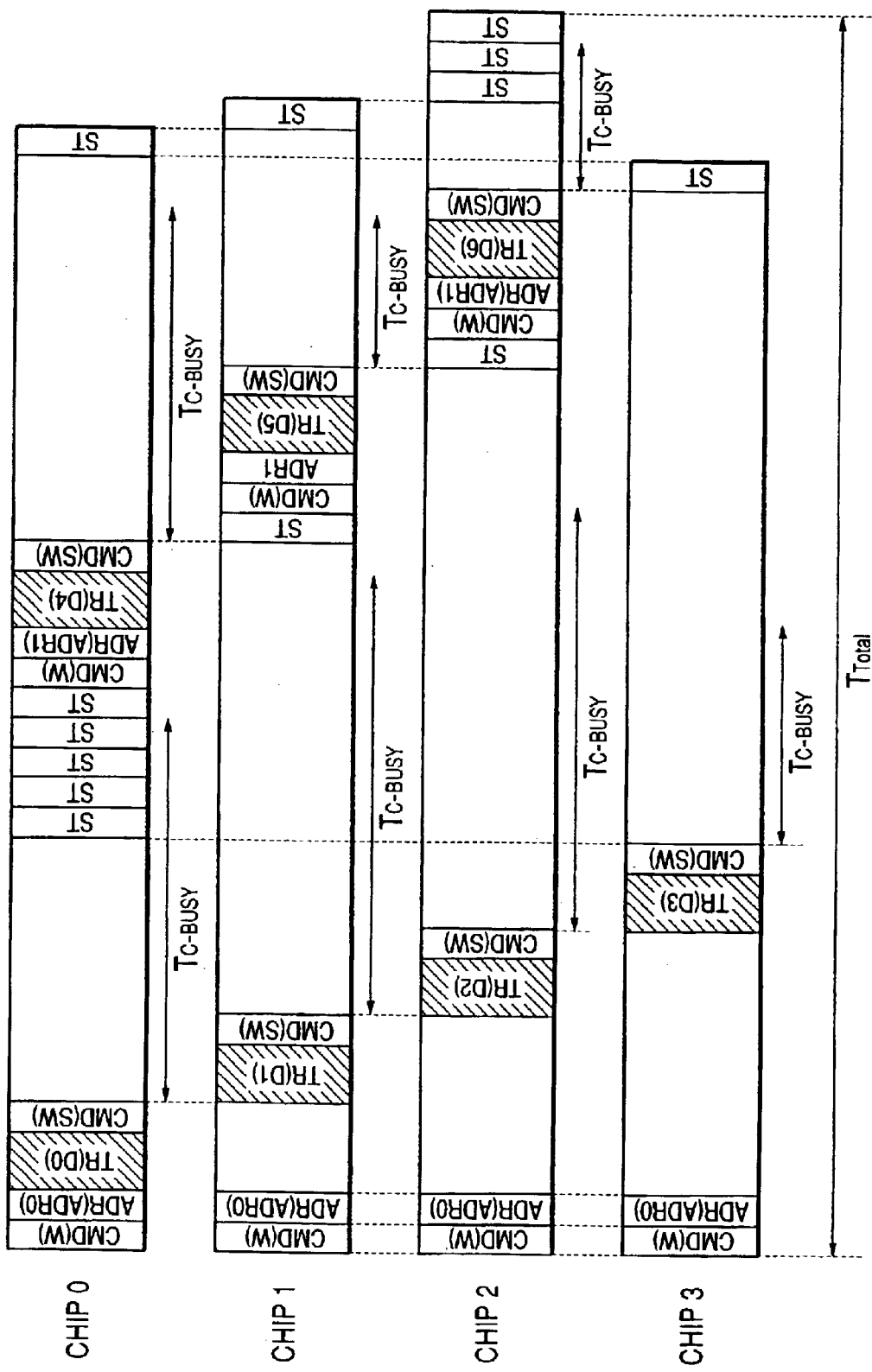
FIG. 19 is a chart for describing a writing controlling method on the time axis for writing data in a plurality of different addresses specified in a plurality of flash memory chips with use of the fourth Ready/Busy determination method.

FIG. 19 shows a flowchart for controlling the writing shown in FIG. 14 on the time axis. At first, the chip select signals CE0 to CE3 are activated so that a write command is inputted (CMD(W)) simultaneously to each of the flash memory chips 0 to 3. After this, the same sector address ADR0 is inputted (ADR(ADR0)) simultaneously to each of the flash memory chips 0 to 3. Then, only the chip select signal CE0 is activated so that the data block D0 is inputted (TR(D0)) to the flash memory chip 0. Just after this input, a write start command is inputted (CMD(SW)) to the flash memory chip 0. Then, only the chip select signal CE1 is activated so that the data block D1 is inputted (TR(D1)), then a write command is inputted (CMD(SW)) to the chip 1 respectively. Hereinafter, while chip select signals are changed over sequentially to input the rest data blocks (TR(D2), TR(D3)) and the rest write start commands (CMD (SW)). After the input of the write start command to all the data blocks D0 to D3, the status register of each chip is read to determine Ready/Busy therein. In this case, while the flash memory chips are changed over sequentially so that the status register of each chip is read in order of Ready detection and the chip is subjected to the next processing, one chip is selected and Ready/Busy is determined only in the chip. Then, the result of the command execution is checked therein before the chip is changed to another. Here, how to change the chips in this connection will be described. At first, the status register of the flash memory chip 0 is read to determine Ready/Busy therein, then the result of the write start command execution is checked in the chip 0 with the value read from the status register when Ready is detected therein. After this, the write command (CMD(W)), the sector address ADR1 (ADR(ADR1)), the data block D4 (TR(D4)), and the write start command (CMD(SW)) for the next writing are inputted to the chip 0. Then, the chips are changed from 0 to 1, followed by the Ready/Busy determination, the preceding write start command execution result check (ST), the write command input (CMD(W)), the data block input (TR(D5), TR(D6)), and the write start command input (CMD(SW)). Finally, Ready/Busy is determined in each chip with respect to the write start command issued to each of the rest data blocks D4 to D6 and the result of the write start command execution is checked therein.

Next, two cases of a method for erasing data from flash memory chips will be described. In one case, data is erased from the same addresses specified in a plurality of flash memory chips. In the other case, data is erased from a plurality of different addresses specified in a plurality of flash memory chips.

At first, the first case will be described with reference to FIGS. 20 through 28. In this case, data is erased from the same addresses specified in a plurality of memory chips.

Figure 20:
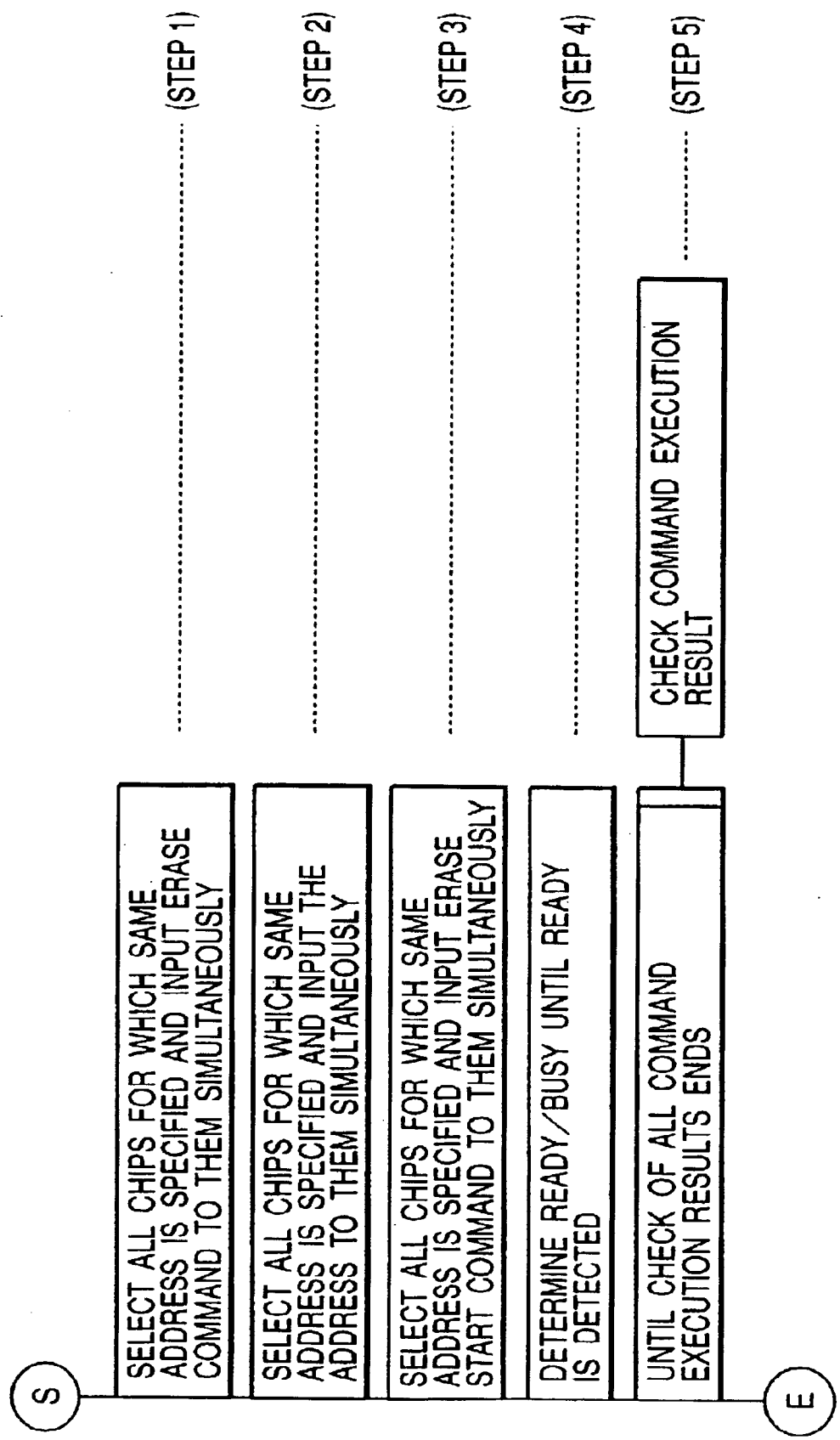
FIG. 20 is a flowchart of an erasing controlling method for erasing data from the same addresses specified in a plurality of flash memory chips with use of the first Ready/Busy determination method.

FIGS. 20 through 23 show flowcharts for controlling erasing of data in accordance with the first to fourth Ready/Busy determination methods. FIG. 20 shows a flowchart for controlling the erasing in accordance with the first Ready/Busy determination method. In STEP1, an erase command is inputted simultaneously to each of the flash memory chips to which the same address is to be inputted. In STEP2, the same address is inputted simultaneously to each of the flash memory chips to which an erase command is inputted in STEP1. In STEP3, an erase start command is inputted simultaneously to each of the flash memory chips to which an erase command is inputted in STEP1 and an address is inputted in STEP2. In STEP4, Ready/Busy is determined in each flash memory chip until Ready is detected therein. In STEP5, the status register of each flash memory chip is read sequentially to check the result of the erase start command execution therein.

Figure 21:
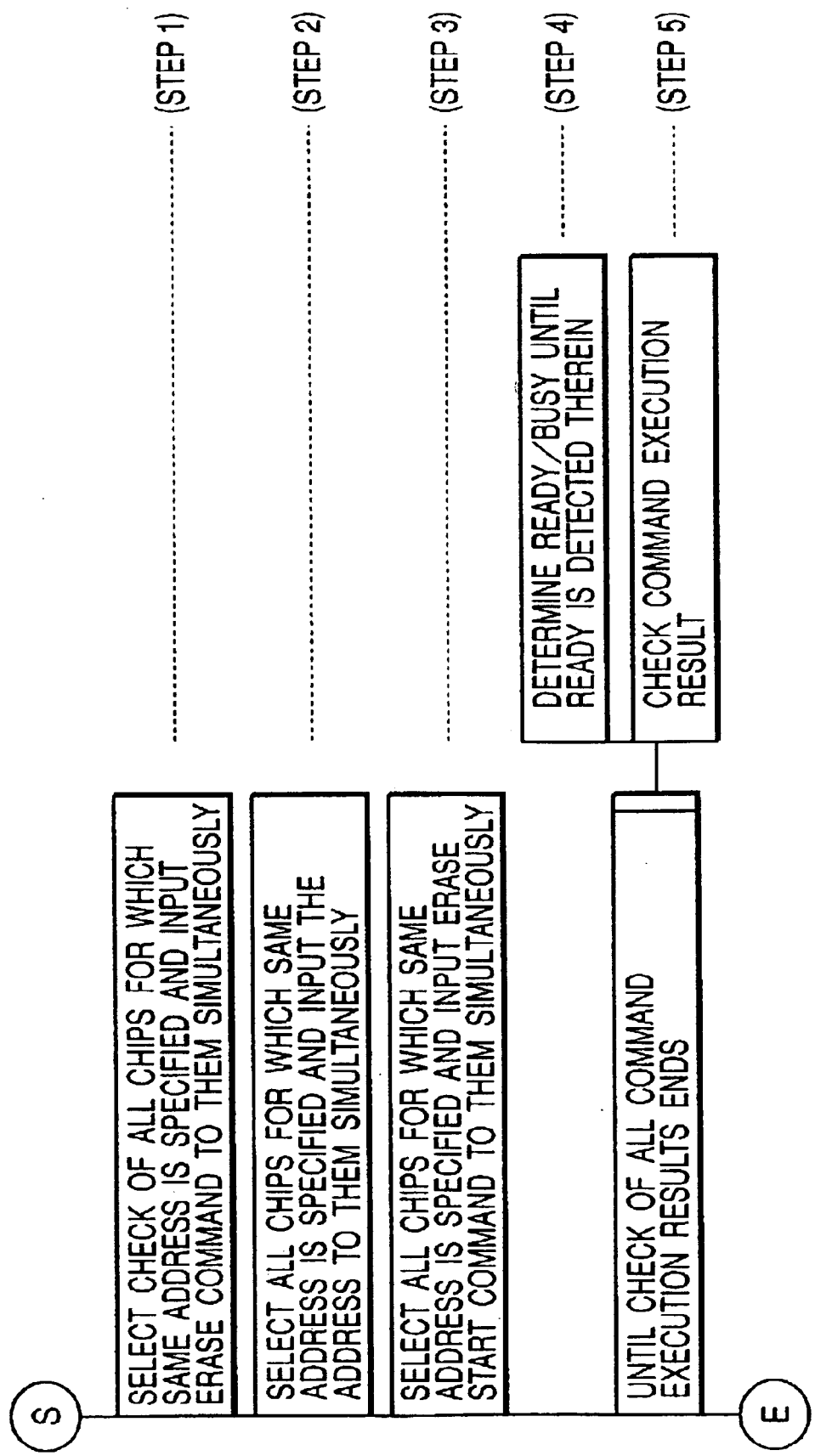
FIG. 21 is a flowchart of an erasing controlling method for erasing data from the same addresses specified in a plurality of flash memory chips with use of the second Ready/Busy determination method.

FIG. 21 shows a flowchart for controlling the erasing in accordance with the second Ready/Busy determination method. In STEP1, an erase command is inputted simultaneously to each of the flash memory chips to which the same address is to be inputted. In STEP2, the same address is inputted simultaneously to each of the flash memory chips to which an erase command is inputted in STEP1. In STEP3, an erase start command is inputted simultaneously to each of the flash memory chips to which an erase command is inputted in STEP1 and an address is inputted in STEP2. In STEP4, Ready/Busy is determined in each flash memory chip until Ready is detected therein. In STEP5, the status register of each flash memory chip is read sequentially to check the result of the erase start command execution therein. In this case, Ready/Busy can be determined in each flash memory chip. Consequently, while it is possible to predetermine the order of flash memory chips in which Ready/Busy is to be determined sequentially, both Ready/Busy determination and command execution result check can be made by reading the status register in this predetermined order. However, it is also possible to check the command execution result by reading the status register of each chip in order of Ready detection. The processings in STEP4 and STEP5 are repeated until the erase start command execution result check is completed in every flash memory chip to which an erase start command is inputted in STEP1.

Figure 22:
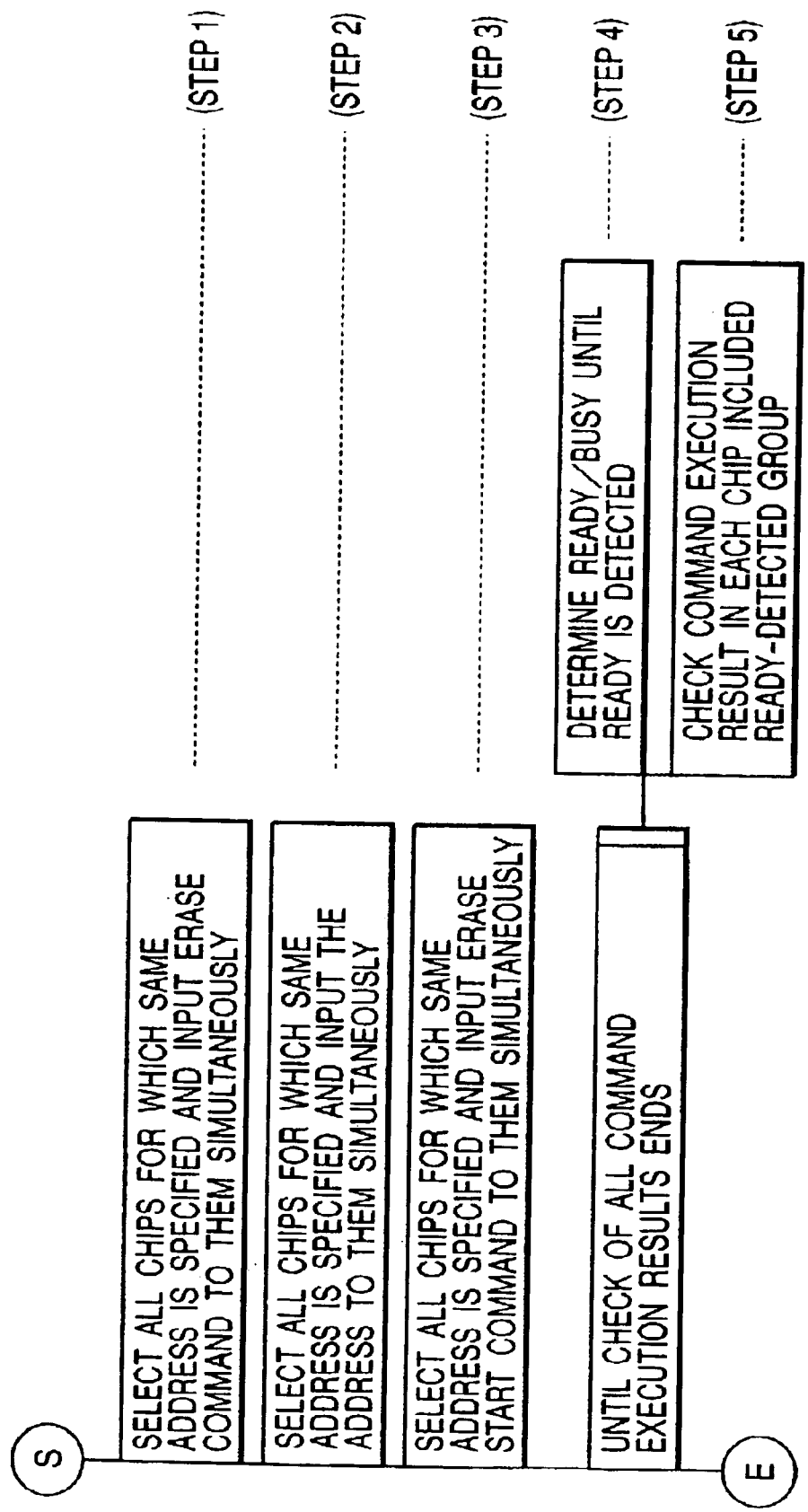
FIG. 22 is a flowchart of an erasing controlling method for erasing data from the same addresses specified in a plurality of flash memory chips with use of the third Ready/Busy determination method.

FIG. 22 shows a flowchart for controlling erasing of data in accordance with the third Ready/Busy determination method. In STEP1, an erase command is inputted simultaneously to each of the flash memory chips to which the same address is to be inputted. In STEP2, the same address is inputted simultaneously to each of the flash memory chips to which an erase command is inputted in STEP1. In STEP3, an erase start command is inputted simultaneously to each of the flash memory chips to which an erase command is inputted in STEP1 and an address is inputted in STEP2. In STEP4, Ready/Busy is determined in each flash memory chip until Ready is detected therein. In STEP5, the status register of each flash memory chip included in a group in which Ready is detected in STEP4 is read sequentially to check the result of the erase start command execution therein. The processings in STEP4 and STEP5 are repeated until all the erase start command execution results are checked. In this case, while it is possible to predetermine the order of chip groups in which Ready/Busy is to be determined sequentially. However, it is also possible to check the command execution result in each chip group in order of Ready detection.

Figure 23:
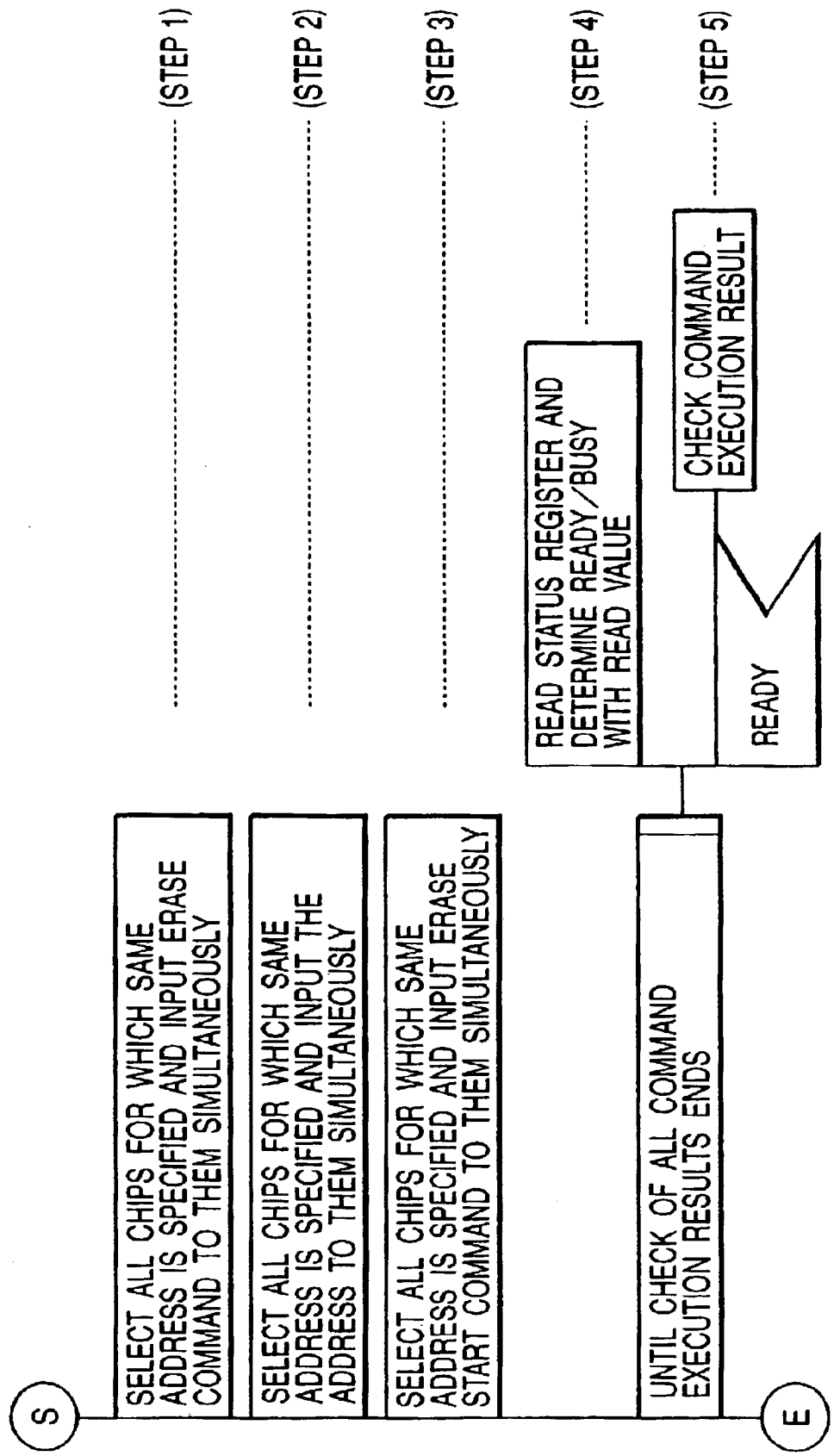
FIG. 23 is a flowchart of an erasing controlling method for erasing data from the same addresses specified in a plurality of flash memory chips with use of the fourth Ready/Busy determination method.

FIG. 23 shows a flowchart for controlling erasing of data in accordance with the fourth Ready/Busy determination method. In STEP1, an erase command is inputted simultaneously to each of the flash memory chips to which the same address is to be inputted. In STEP2, the same address is inputted simultaneously to each of the flash memory chips to which an erase command is inputted in STEP1. In STEP3, an erase start command is inputted simultaneously to each of the flash memory chips to which an erase command is inputted in STEP1 and an address is inputted in STEP2. In STEP4, the status register of each flash memory chip is read to determine Ready/Busy therein. In STEP5, the command execution result is checked in each chip. The processings in STEP4 and STEP5 are repeated until checking of all the erase start command execution results is completed. In STEP4 and STEP5, it is possible to select one flash memory chip and read its status register to check the command execution result therein until Ready is detected, then change the chip to the next one. It is also possible to read the status register of each chip while the chips are changed over sequentially, then the command execution result is checked in each of the flash memory chips in order of Ready detection.

Next, the flowchart for controlling the erasing shown in FIGS. 20 through 23 will be described more in detail with reference to FIGS. 24 through 27.

Figure 24:
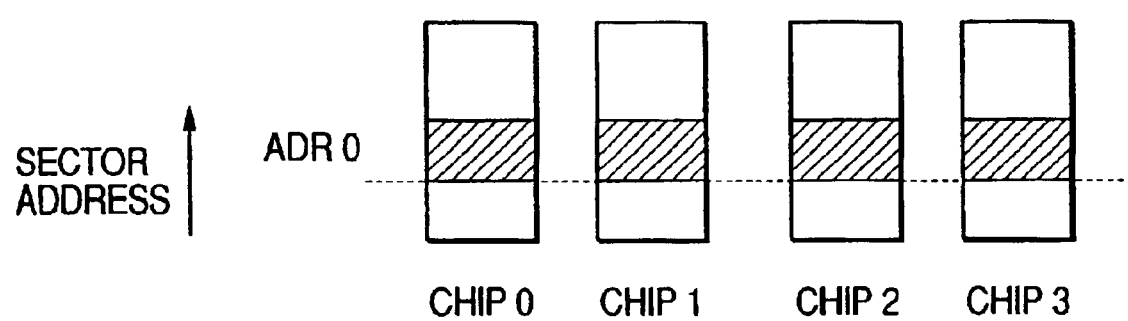
FIG. 24 is physical positions from which data is erased when the same addresses are specified in a plurality of flash memory chips.

FIG. 24 shows physical positions from which data is erased. In this case, data is erased from the same sector address ADR0 specified in each of the flash memory chips 0 to 3.

Figure 25:
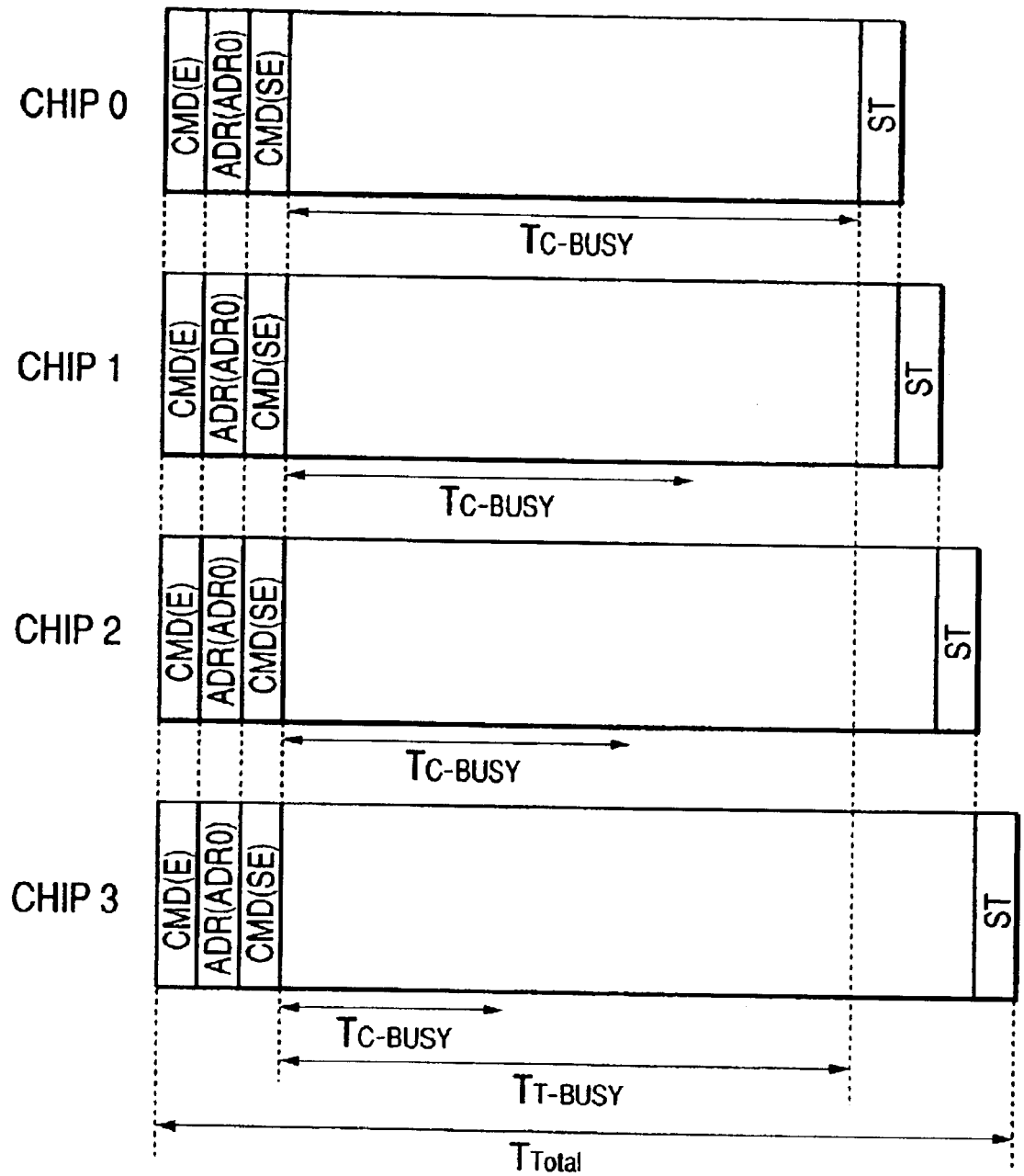
FIG. 25 is a chart for describing an erasing controlling method on the time axis for erasing data from the same addresses specified in a plurality of flash memory chips with use of the first Ready/Busy determination method.

FIG. 25 shows the flowchart for controlling the erasing shown in FIG. 20 on the time axis. At first, the chip select signals CE0 to CE3 are activated so that an erase command is inputted (CMD(E)) simultaneously to each of the flash memory chips 0 to 3. After this, the same sector address ADR0 is inputted (ADR(ADR0)) simultaneously to each of the flash memory chips 0 to 3. Then, an erase start command is inputted (CMD(SE)) to each of the flash memory chips 0 to 3 simultaneously. This erase start command input erases data from the specified memory cells. The Ready/Busy terminal of each flash memory chip outputs Busy between the start and end of this data erasure. The $T_{C\_BUSY}$ in FIG. 25 denotes a period in which Busy is output from the Ready/Busy terminal of each chip. In this case, Ready/Busy is determined in each flash memory chip according to a value obtained by ANDing the signals of all the flash memory chips. When Busy is detected in any one of the chips, it is determined that the chip status is Busy during the period. When data is erased from all the memory cells and Ready is detected as the result of the Ready/Busy determination in each of the flash memory chips 0 to 3, the status register of each chip is read to check the result of the erase command execution therein (ST).

Figure 26:
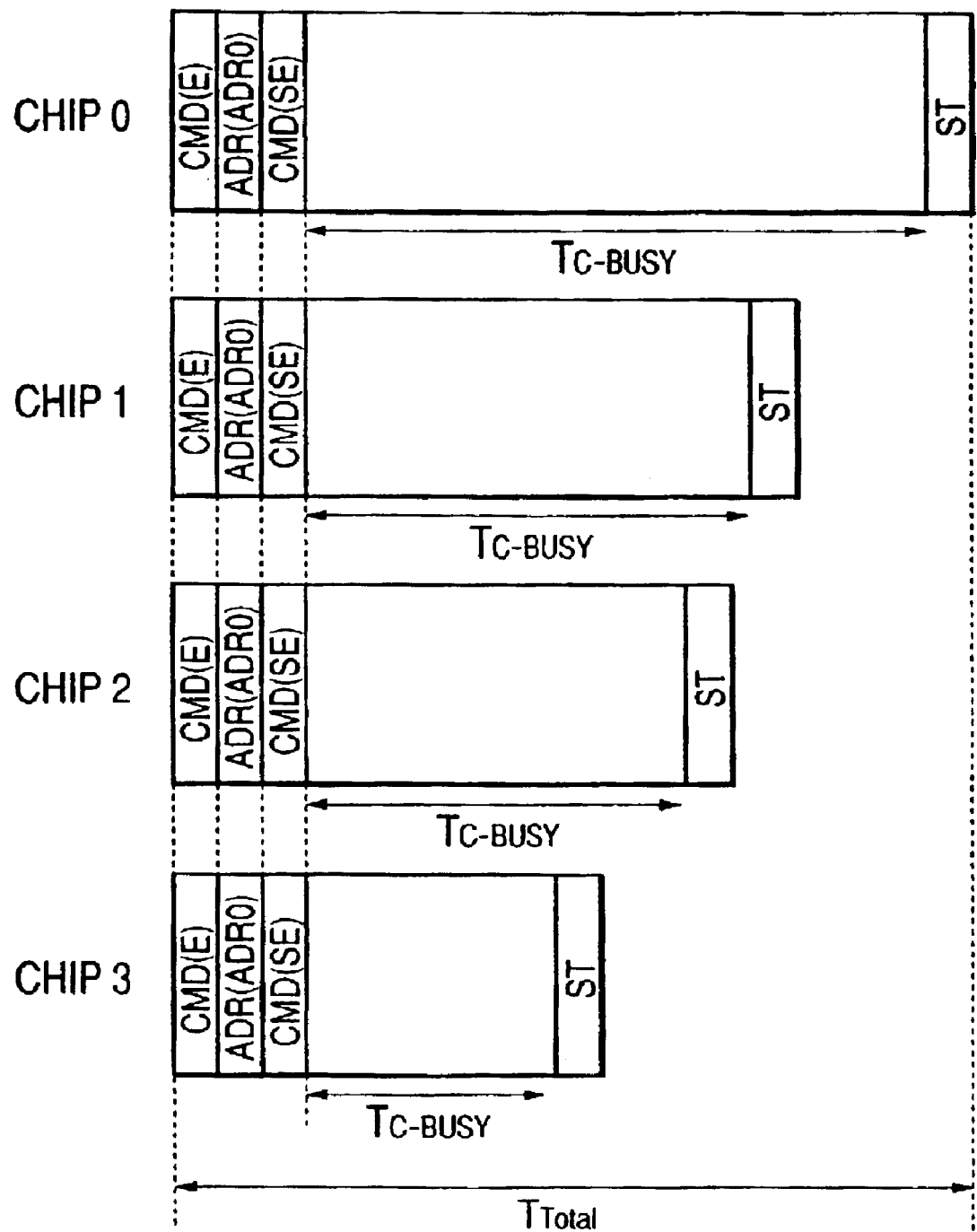
FIG. 26 is a chart for describing an erasing controlling method on the time axis for erasing data from the same addresses specified in a plurality of flash memory chips with use of the second Ready/Busy determination method.

FIG. 26 shows the flowchart for controlling the erasing shown in FIG. 21 on the time axis. At first, the chip select signals CE0 to CE3 are activated so that an erase command is inputted (CMD(E)) simultaneously to each of the flash memory chips 0 to 3. In FIG. 26, this erase command input is described as CMD(E). After this, the same sector address ADR0 is inputted (ADR(ADR0)) simultaneously to each of the flash memory chips 0 to 3. Then, an erase start command is inputted (CMD(SE)) to each of the flash memory chips 0 to 3 simultaneously. Then, Ready/Busy is determined in each flash memory chip and the status register of the chip is read to check the command execution result therein. In this case, Ready/Busy can be determined in each chip separately. It is thus possible to detect Ready and check the command execution result in each chip in an ascending order of chip numbers. It is also possible to check the command execution result in each chip in order of Ready detection. In the case shown in FIG. 26, command execution results are checked in chips in order of Ready detection.

Figure 27:
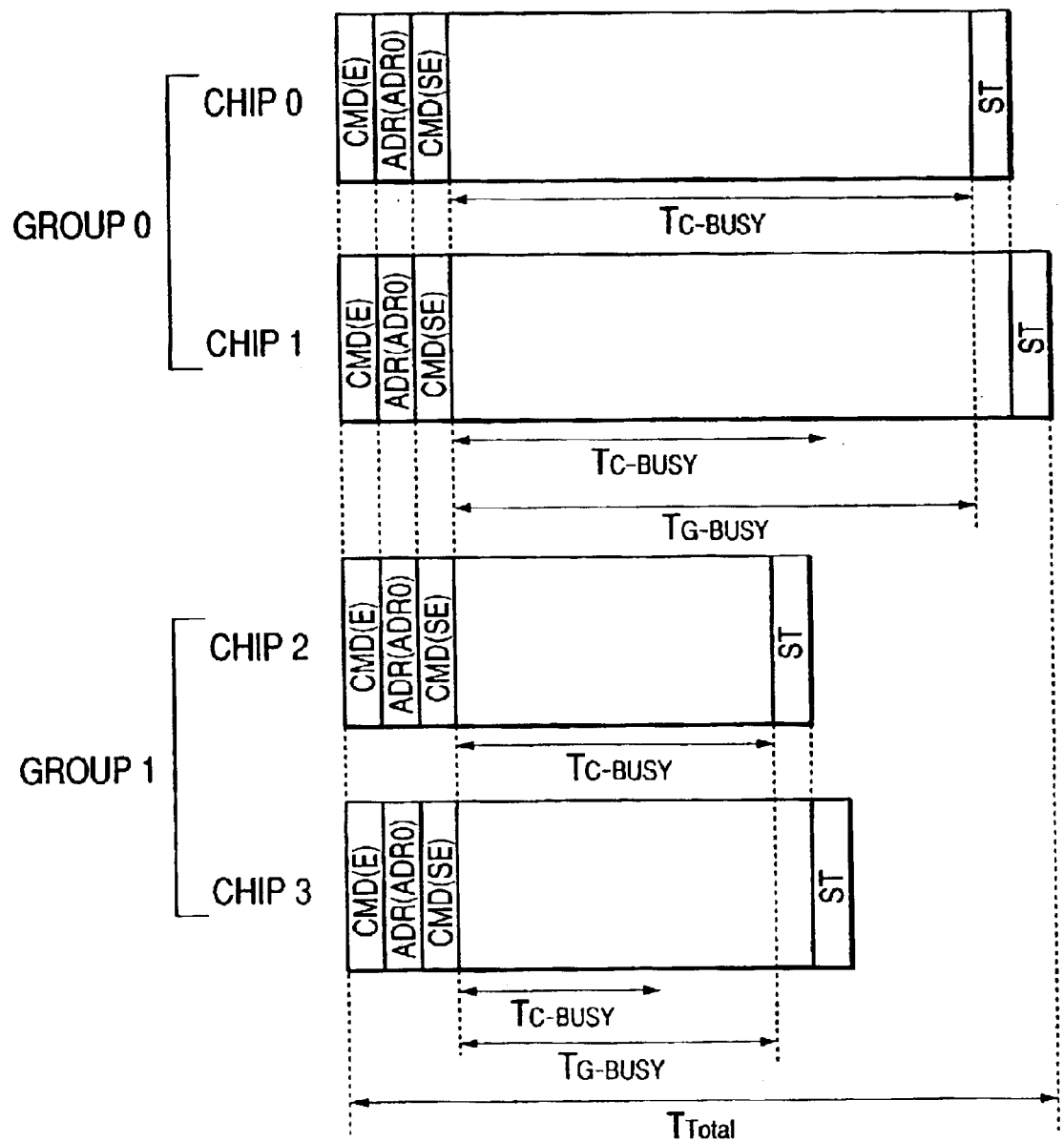
FIG. 27 is a chart for describing an erasing controlling method on the time axis for erasing data from the same addresses specified in a plurality of flash memory chips with use of the third Ready/Busy determination method.

FIG. 27 shows the flowchart for controlling the erasing shown in FIG. 22 on the time axis. In this case, the flash memory chips 0 and 1 are included in the group 0 and the flash memory chips 2 and 3 are included in the group 1 to be subjected to the Ready/Busy determination respectively. At first, the chip select signals CE0 to CE3 are activated so that an erase command is inputted (CMD(E)) simultaneously to each of the flash memory chips 0 to 3. After this, the same sector address ADR0 is inputted (ADR(ADR0)) simultaneously to each of the flash memory chips 0 to 3. Then, an erase start command is inputted (CMD(SE)) to each of the flash memory chips 0 to 3 simultaneously. Then, Ready/Busy is determined in each chip and the status register of each chip included in a Ready-detected group is read to check the command execution result therein. In FIG. 27, because the data erasure is ended earlier in the group 1 than the group 0, the group 1 is processed earlier than the group 0. It is also possible to determine the priority of the Ready/Busy determination between the groups 0 and 1 and make the determination according to the priority until Ready is detected therein.

Figure 28:
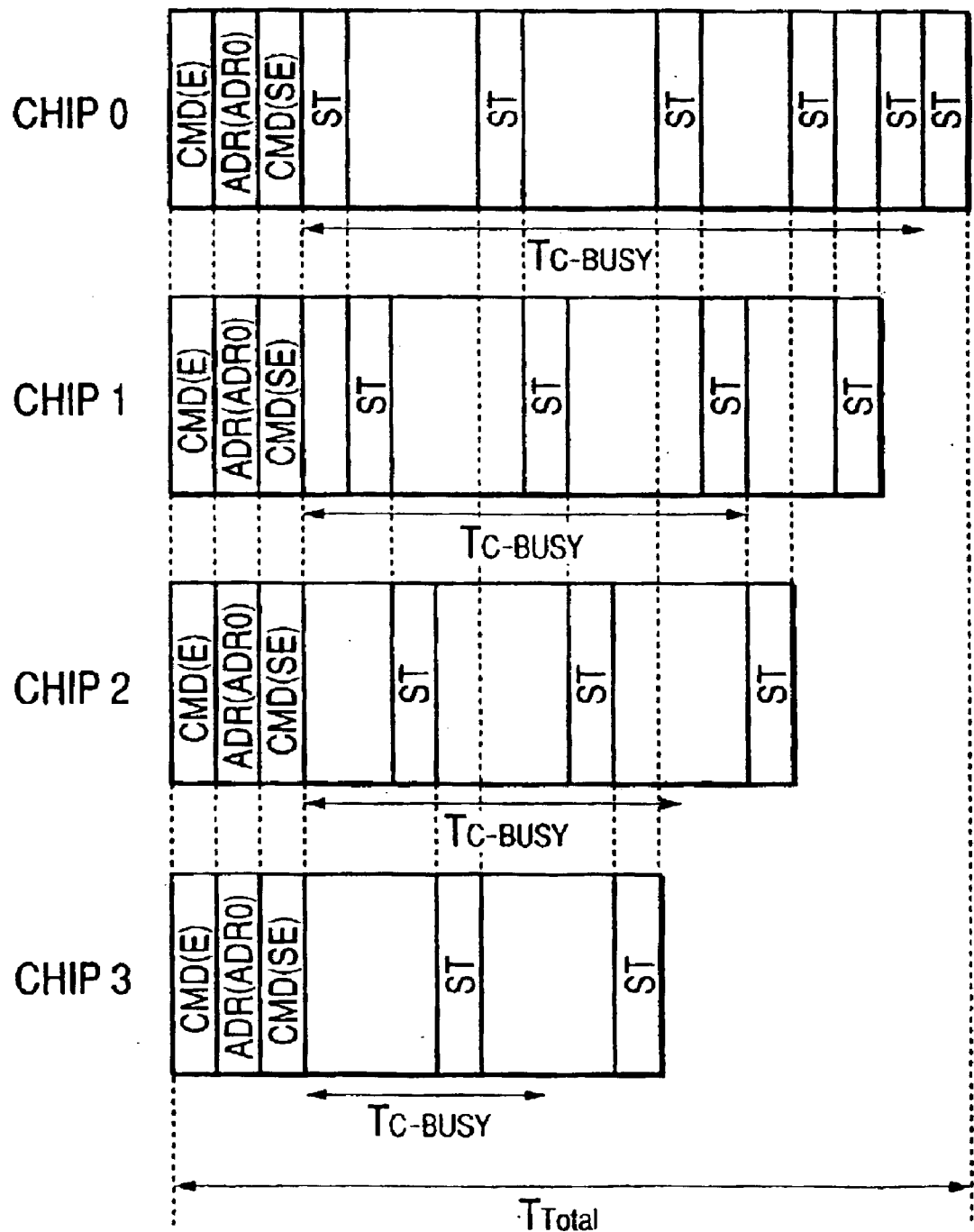
FIG. 28 is a chart for describing an erasing controlling method on the time axis for erasing data from the same addresses specified in a plurality of flash memory chips with use of the fourth Ready/Busy determination method.

FIG. 28 shows the flowchart for controlling the erasing shown in FIG. 23. At first, the chip select signals CE0 to CE3 are activated so that an erase command is inputted (CMD (E)) simultaneously to each of the flash memory chips 0 to 3, then the same sector address ADR0 is inputted (ADR (ADR0)) simultaneously to each of the flash memory chips 0 to 3. After this, an erase start command is inputted (CMD(SE)) to each of the flash memory chips 0 to 3 simultaneously. Then, flash memory chips are changed over sequentially to read the status register of each of the rest chips to check the command execution result therein.

Next, a description will be made for a method for controlling erasure of data from a plurality of different addresses specified in a plurality of flash memory chips with reference to FIGS. 29 through 37.

Figure 29:
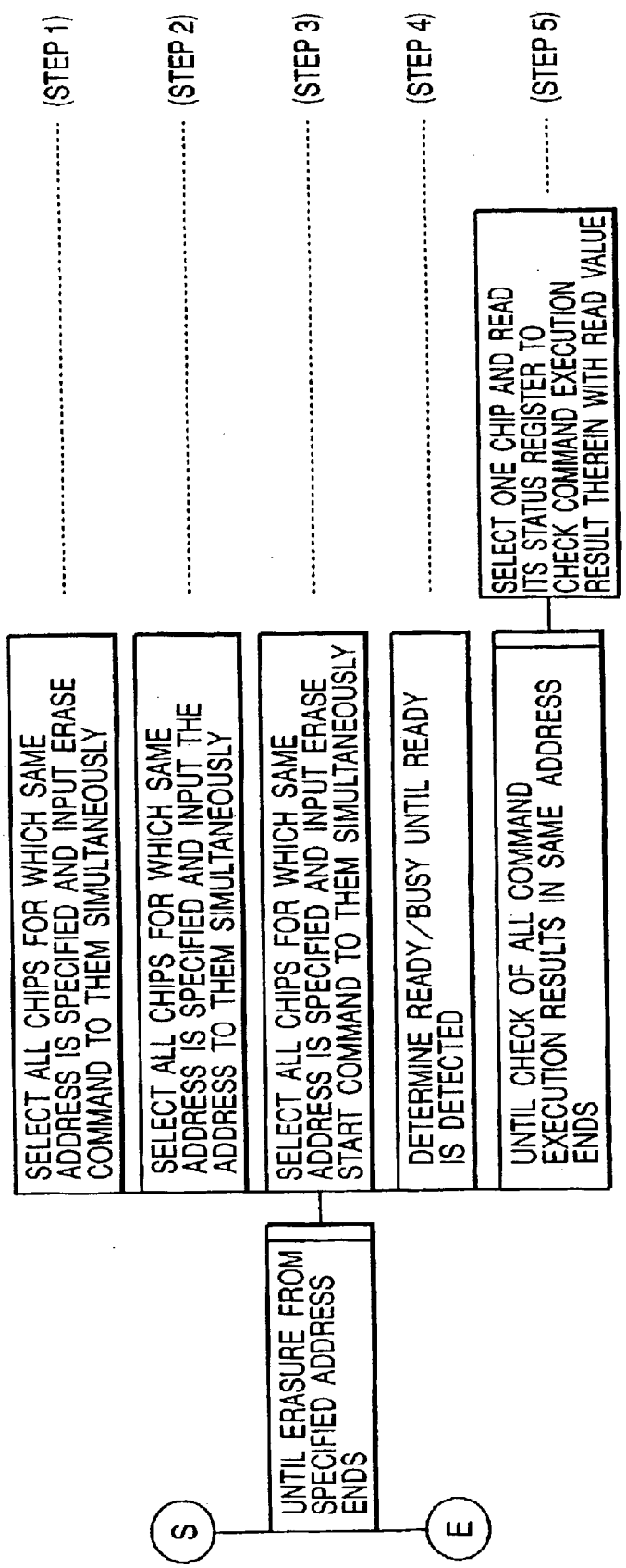
FIG. 29 is a flowchart of an erasing controlling method for erasing data from a plurality of different addresses specified in a plurality of flash memory chips with use of the first Ready/Busy determination method.

FIGS. 29 through 32 show flowcharts for controlling the erasing in accordance with the first to fourth Ready/Busy determination methods. FIG. 29 shows a flowchart for controlling erasure of data in accordance with the first Ready/Busy determination method. In STEP1, an erase command is inputted simultaneously to each of the flash memory chips to which the same address is to be inputted. In STEP2, the same address is inputted simultaneously to each of the flash memory chips to which an erase command is inputted in STEP1. In STEP3, an erase start command is inputted simultaneously to each of the flash memory chips to which an erase command is inputted in STEP1 and an address is inputted in STEP2. In STEP4, Ready/Busy is determined in each flash memory chip until Ready is detected therein. In STEP5, the status register of each flash memory chip to which an erase command is inputted in STEP1 is read sequentially to check the result of the erase start command execution therein. The processings in STEP1 to STEP5 are repeated for each of the addresses that are changed over sequentially until erasing of data from all the specified addresses is completed.

Figure 30:
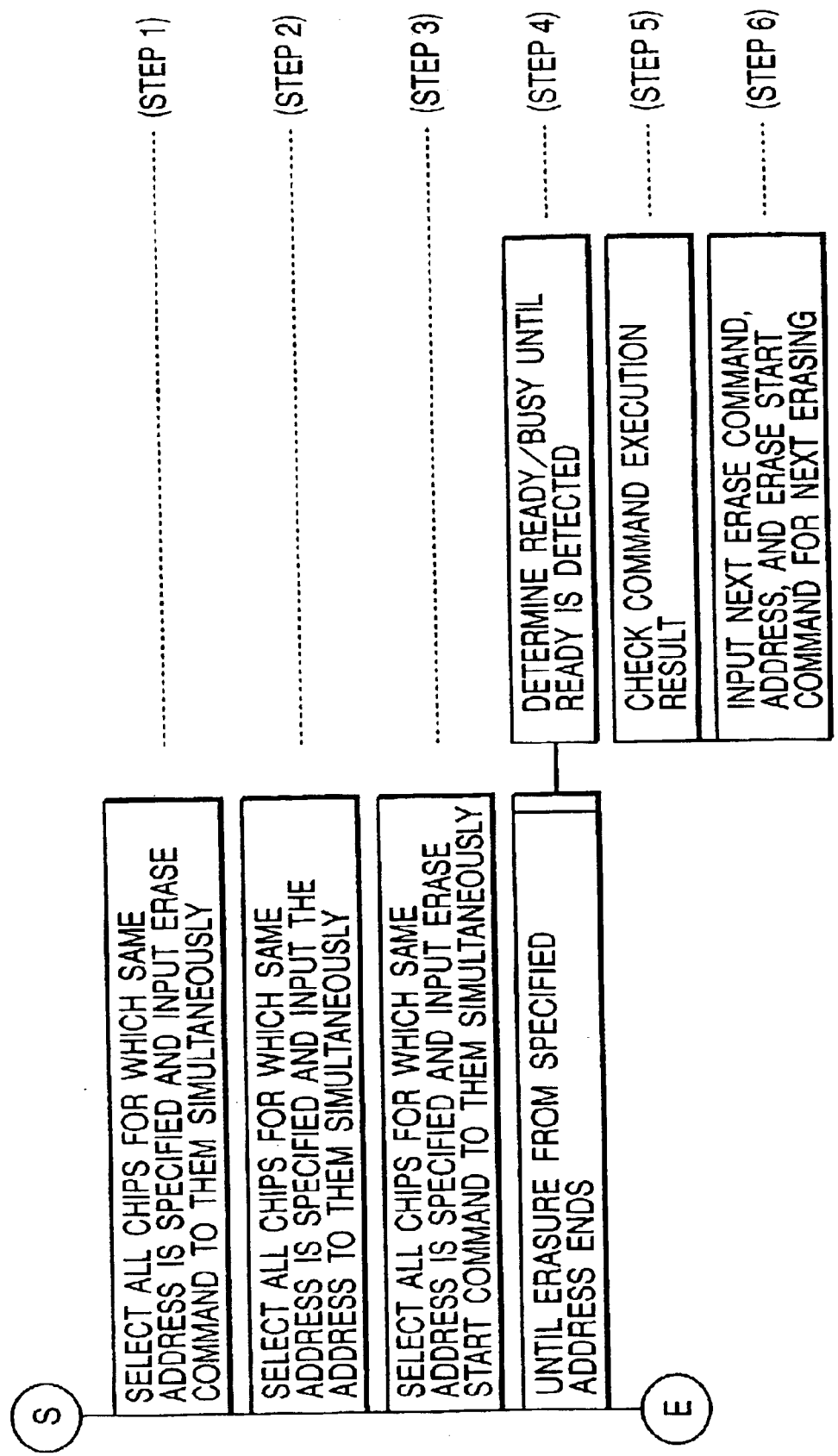
FIG. 30 is a flowchart of an erasing controlling method for erasing data from a plurality of different addresses specified in a plurality of flash memory chips with use of the second Ready/Busy determination method.

FIG. 30 shows a flowchart for controlling the erasure in accordance with the second Ready/Busy determination method. In STEP1, an erase command is inputted simultaneously to each of the flash memory chips to which the same address is to be inputted. In STEP2, the same address is inputted simultaneously to each of the flash memory chips to which an erase command is inputted in STEP1. In STEP3, an erase start command is inputted simultaneously to each of the memory chips to which an erase command is inputted in STEP1 and an address is inputted in STEP2. In STEP4, Ready/Busy is determined in each flash memory chip until Ready is detected therein. In STEP5, the status register of each flash memory chip in which Ready is detected in STEP4 is read sequentially to check the result of the erase start command execution therein. In STEP6, if data is to be erased from another address in the flash memory chip in which the command execution result is checked in STEP5, the erase command, the address, and the erase start command for the erasing are inputted to the chip. The processings in STEP4 to STEP5 are repeated until the data erasure from the addresses specified in all the specified flash memory chips is completed.

Figure 31:
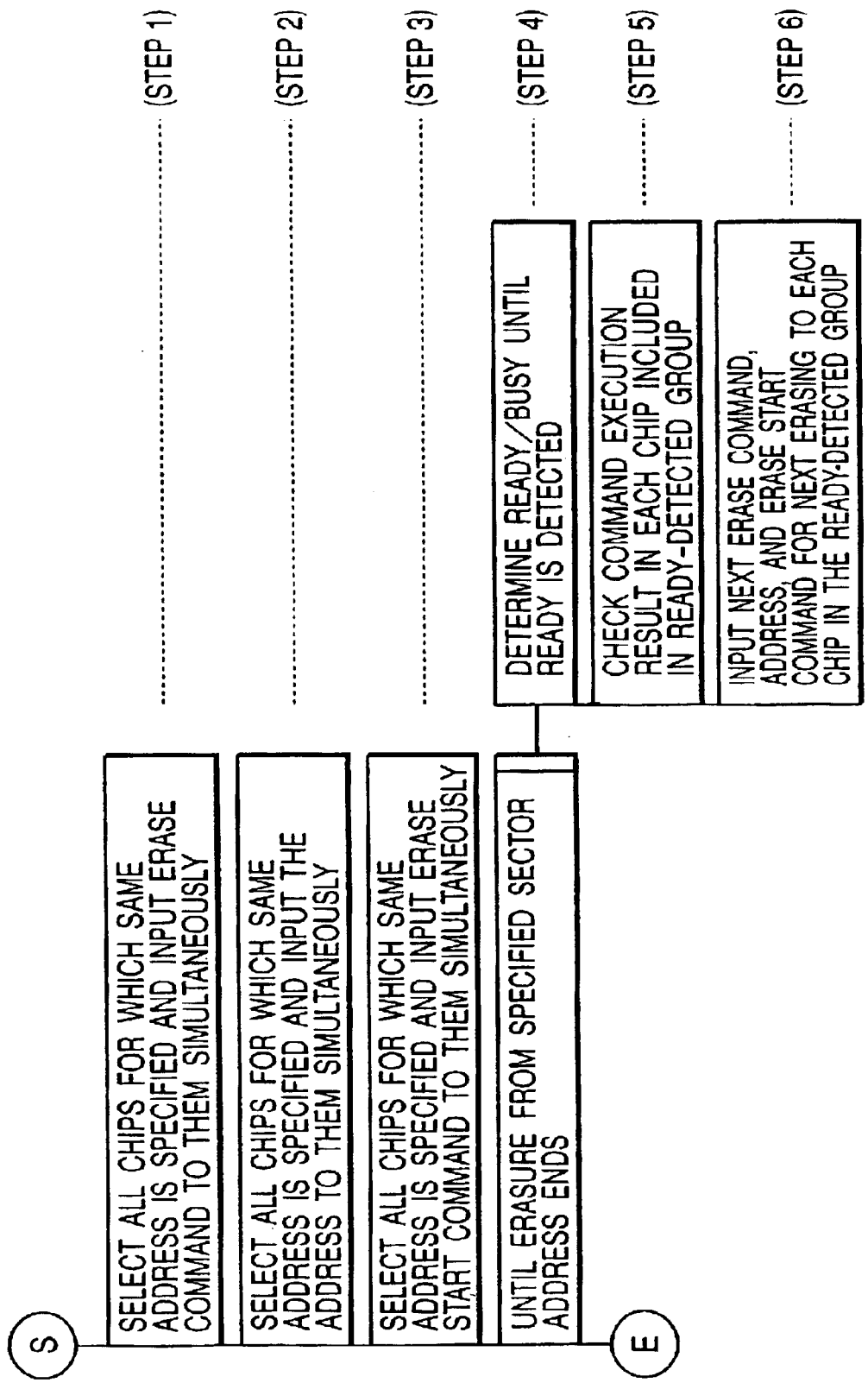
FIG. 31 is a flowchart of an erasing controlling method for erasing data from a plurality of different addresses specified in a plurality of flash memory chips with use of the third Ready/Busy determination method.

FIG. 31 shows a flowchart for controlling the erasing in accordance with the third Ready/Busy determination method. In STEP1, an erase command is inputted to simultaneously each of the flash memory chips to which the same address is to be inputted. In STEP2, the same address is inputted simultaneously to each of the flash memory chips to which an erase command is inputted in STEP1. In STEP3, an erase start command is inputted simultaneously to each of the flash memory chips to which an erase command is inputted in STEP1 and a sector address is inputted in STEP2. In STEP4, Ready/Busy is determined in each flash memory chip until Ready is detected therein. In STEP5, the status register of each flash memory chip included in a group in which Ready is detected in STEP4 is read sequentially to check the result of the erase start command execution therein. In STEP6, if data is to be erased from another address in any flash memory in the group in which Ready is detected in STEP4, the erase command, the address, and the erase start command for the erasing are inputted to the chip. The processings in STEP4 and STEP6 are repeated until the data erasure from the specified addresses in all the flash memory chips is completed.

Figure 32:
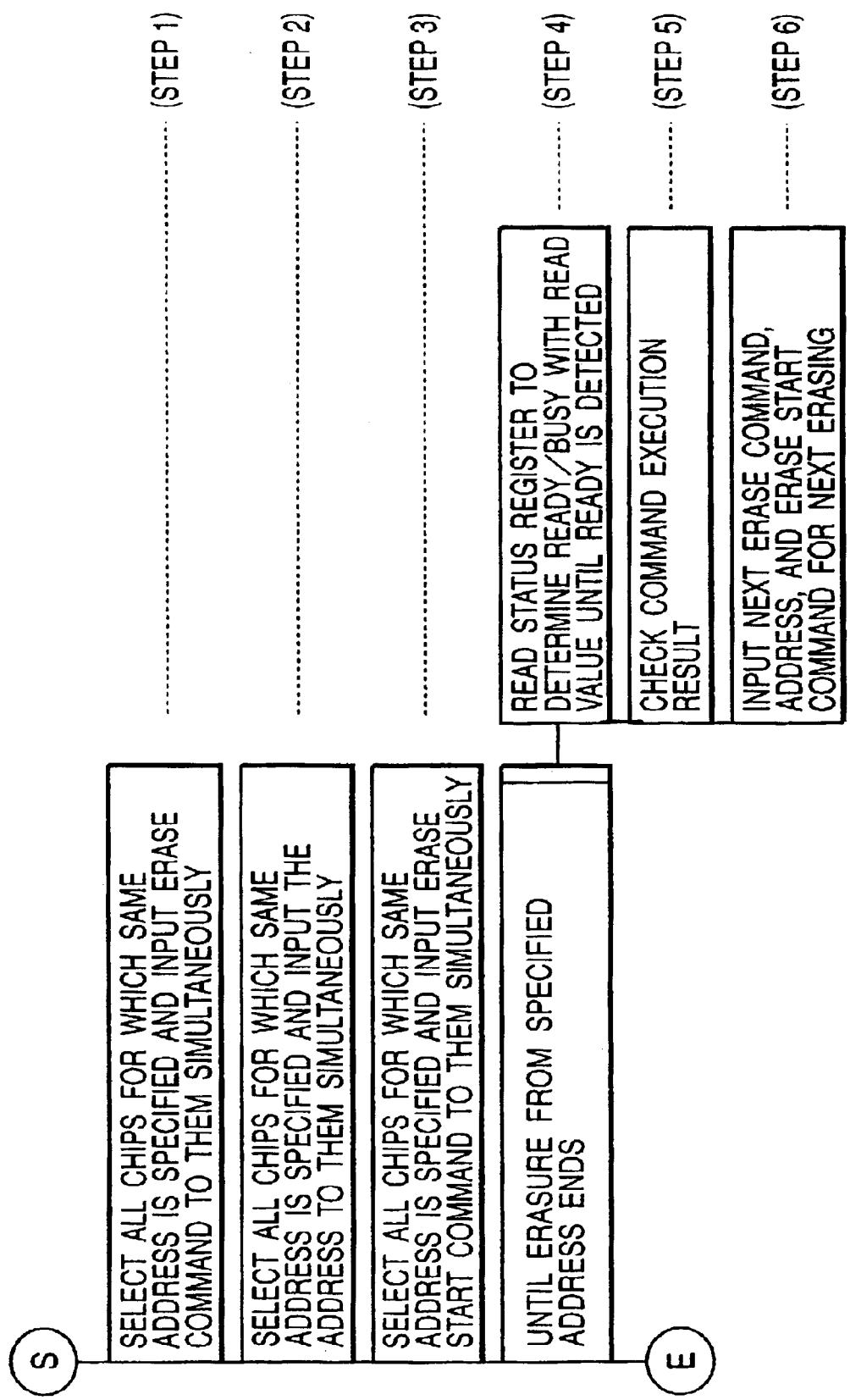
FIG. 32 is a flowchart of an erasing controlling method for erasing data from a plurality of different addresses specified in a plurality of flash memory chips with use of the fourth Ready/Busy determination method.

FIG. 32 shows a flowchart for controlling the erasing in accordance with the fourth Ready/Busy determination method. In STEP1, an erase command is inputted simultaneously to each of the flash memory chips to which the same address is to be inputted. In STEP2, the same address is inputted simultaneously to each of the flash memory chips to which an erase command is inputted in STEP1. In STEP3, an erase start command is inputted simultaneously to each of the flash memory chips to which an erase command is inputted in STEP1 and a sector address is inputted in STEP2. In STEP4, the status register of each flash memory chip is read to determine Ready/Busy therein with the read value until Ready is detected. In STEP5, the command execution result is checked in each flash memory chip in which Ready is detected in STEP4 to check the result of the command execution therein. In STEP6, if data is to be erased from another address in any flash memory in which the command execution result is checked in STEP5, the erase command, the address, and the erase start command for the erasing are inputted to the chip. The processings in STEP4 and STEP6 are repeated until the data erasure from the specified addresses in all the flash memory chips is completed.

Next, a description will be made for the flowcharts shown in FIGS. 29 through 32 more in detail with reference to FIGS. 33 through 37.

Figure 33:
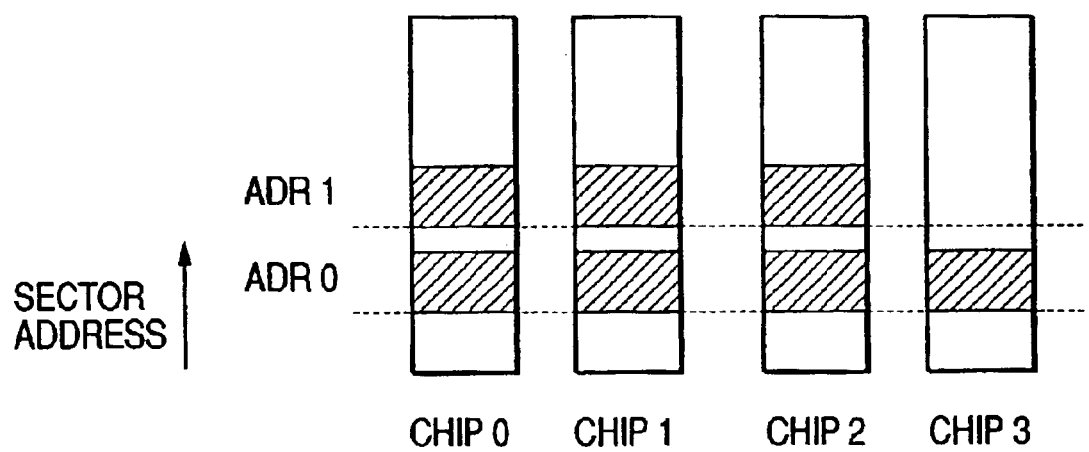
FIG. 33 is physical positions from which data is erased when a plurality of addresses are specified in a plurality of flash memory chips.

FIG. 33 shows physical positions in which data is written. Data is erased from the sector address ADR0 specified in the flash memory chip 0 and from the sector address ADR1 specified in the flash memory chip 1 respectively.

Figure 34:
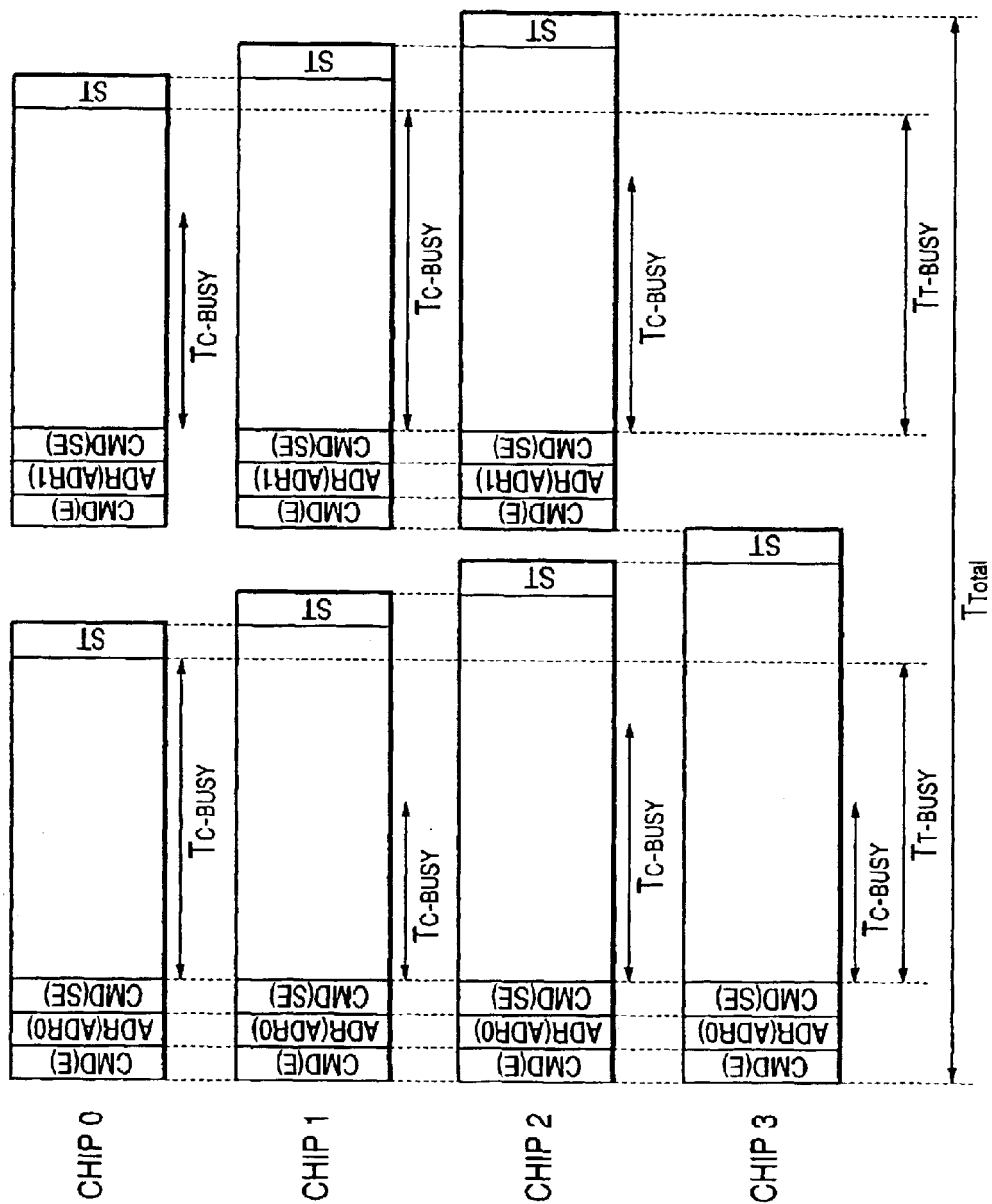
FIG. 34 is a chart for describing an erasing controlling method on the time axis for erasing data from a plurality of different addresses specified in a plurality of flash memory chips with use of the first Ready/Busy determination method.

FIG. 34 shows the flowchart for controlling the erasing shown in FIG. 29 on the time axis. At first, the chip select signals CE0 to CE3 are activated so that an erase command is inputted (CMD(E)) simultaneously to each of the flash memory chips 0 to 3, then the same sector address ADR0 is inputted (ADR(ADR0)) simultaneously to each of the flash memory chips 0 to 3. After this, an erase start command is inputted (CMD(SE)) to each of the flash memory chips 0 to 3 simultaneously. Then, Ready/Busy is determined in each flash memory chip. In this case, the first Ready/Busy determination method is used. The $T_{T\_BUSY}$ shown in FIG. 34 denotes a period in which Busy is determined in the above Ready/Busy determination. Then, the status register of each Ready-detected chip is read to check the command execution result therein with the read value. Hereinafter, data is erased from the sector address ADR1 in each of the flash memory chips 0 to 2 similarly to the erasure from the sector addresses ADR0 in the flash memory chips 0 to 3.

Figure 35:
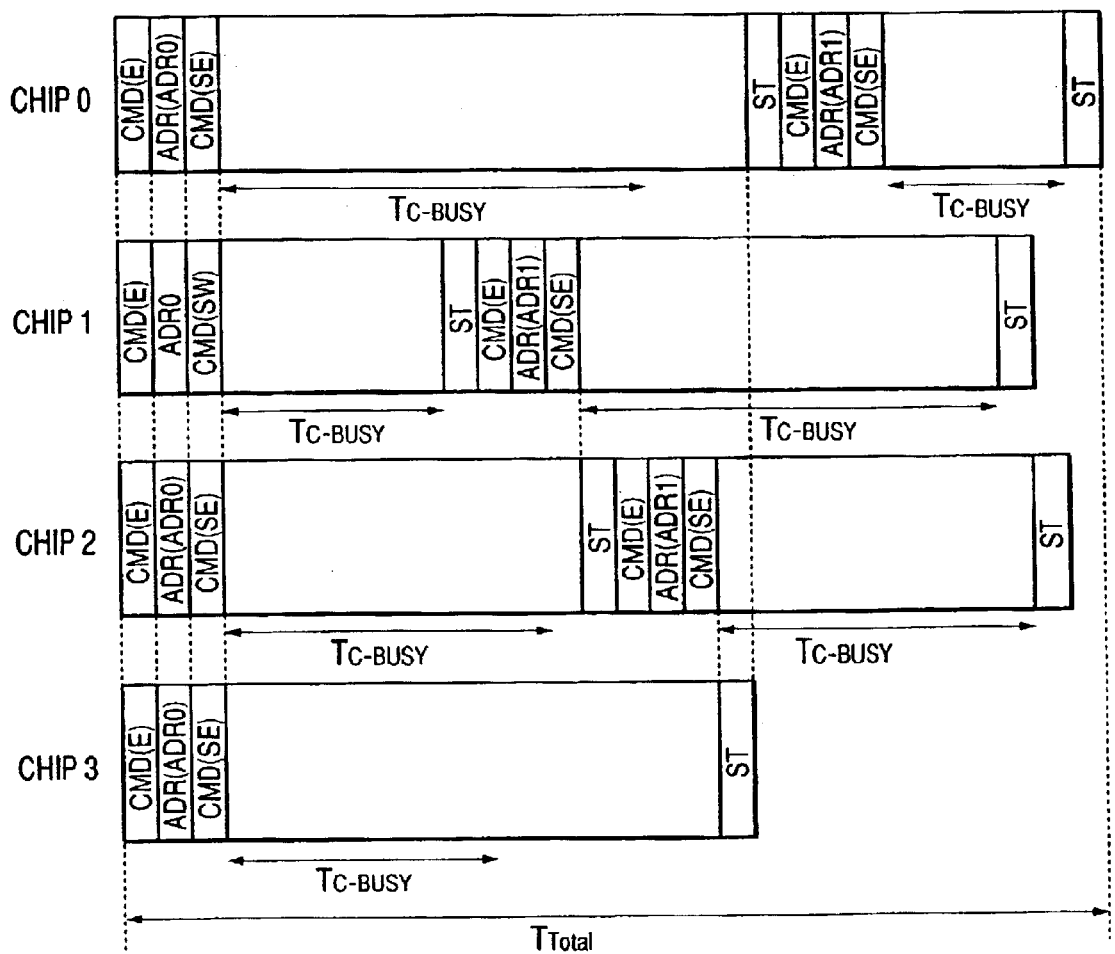
FIG. 35 is a chart for describing an erasing controlling method on the time axis for erasing data from a plurality of different addresses specified in a plurality of flash memory chips with use of the second Ready/Busy determination method.

FIG. 35 shows the flowchart for controlling the erasing shown in FIG. 30 on the time axis. At first, the chip select signals CE0 to CE3 are activated so that an erase command is inputted (CMD(E)) simultaneously to each of the flash memory chips 0 to 3, then the same sector address ADR0 is inputted (ADR(ADR0)) simultaneously to each of the flash memory chips 0 to 3. After this, an erase start command is inputted (CMD(SE)) to each of the flash memory chips 0 to 3 simultaneously. Then, Ready/Busy is determined in each flash memory chip and the status register of each Ready-detected chip is read in order of Ready detection to check the command execution result therein with the read value. If data is to be erased from the sector address ADR1 in the flash memory chip, the erase command (CMD(E)) and the sector address (CMD(SE)) for the erasing are inputted to the chip after the command execution result check therein.

Figure 36:
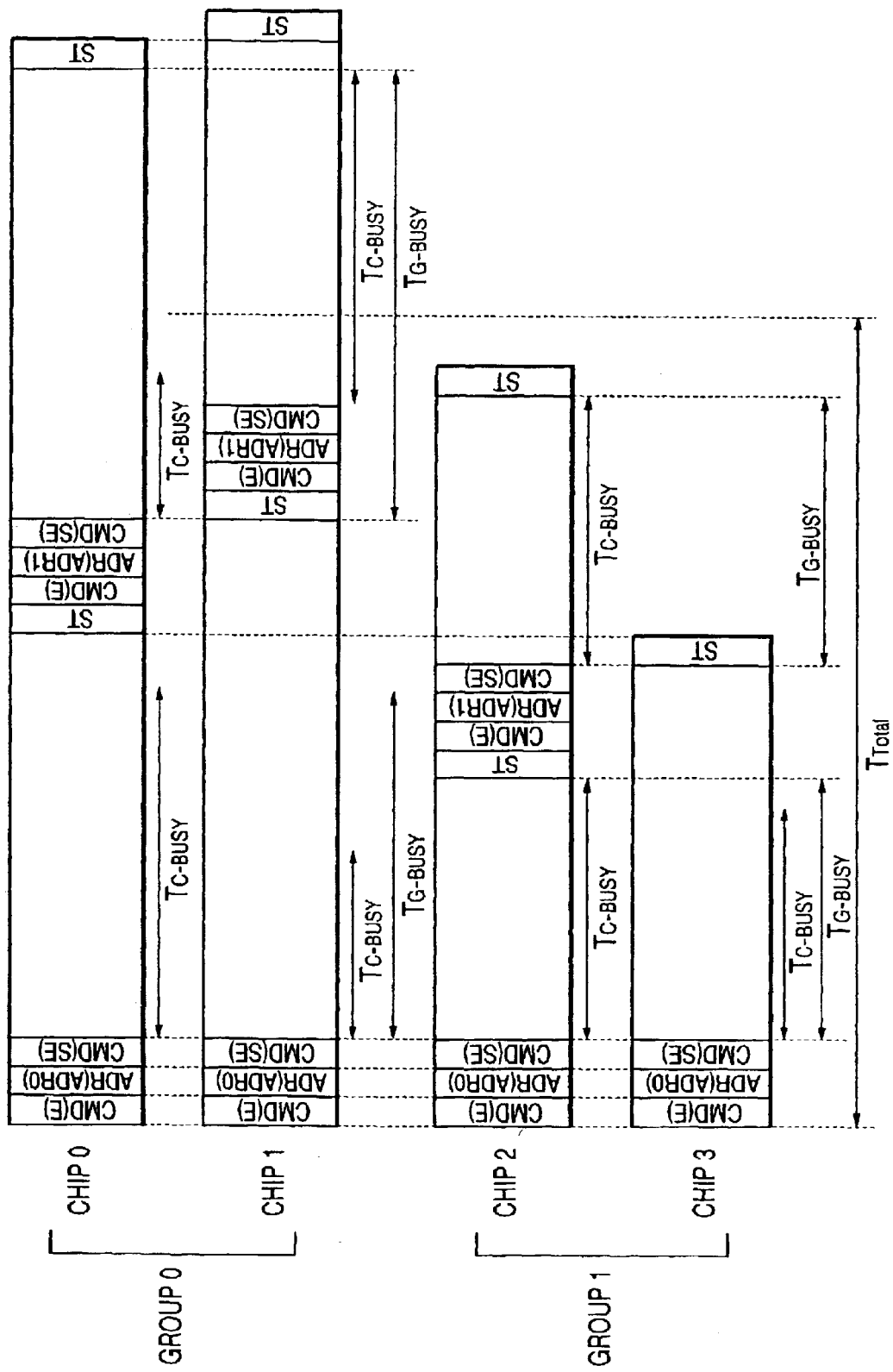
FIG. 36 is a chart for describing an erasing controlling method on the time axis for erasing data from a plurality of different addresses specified in a plurality of flash memory chips with use of the third Ready/Busy determination method.

FIG. 36 shows a flowchart for controlling the erasing shown in FIG. 31 on the time axis. At first, the chip select signals CE0 to CE3 are activated so that an erase command is inputted (CMD(E)) simultaneously to each of the flash memory chips 0 to 3, then the same sector address ADR0 is inputted (ADR(ADR0)) simultaneously to each of the flash memory chips 0 to 3. After this, an erase start command is inputted (CMD(SE)) to each of the flash memory chips 0 to 3 simultaneously. Hereinafter, Ready/Busy is determined in each flash memory chip and the status register of each chip in each group is read in order of Ready detection to check the command execution result therein with the read value. If data is to be erased from the sector address ADR1 in the flash memory chip after the command execution result check, the erase command (CMD(E)), the sector address ADR1 (CMD(ADR1)), and the erase start command CMD(SE)) for the erasing are inputted to the chip.

Figure 37:
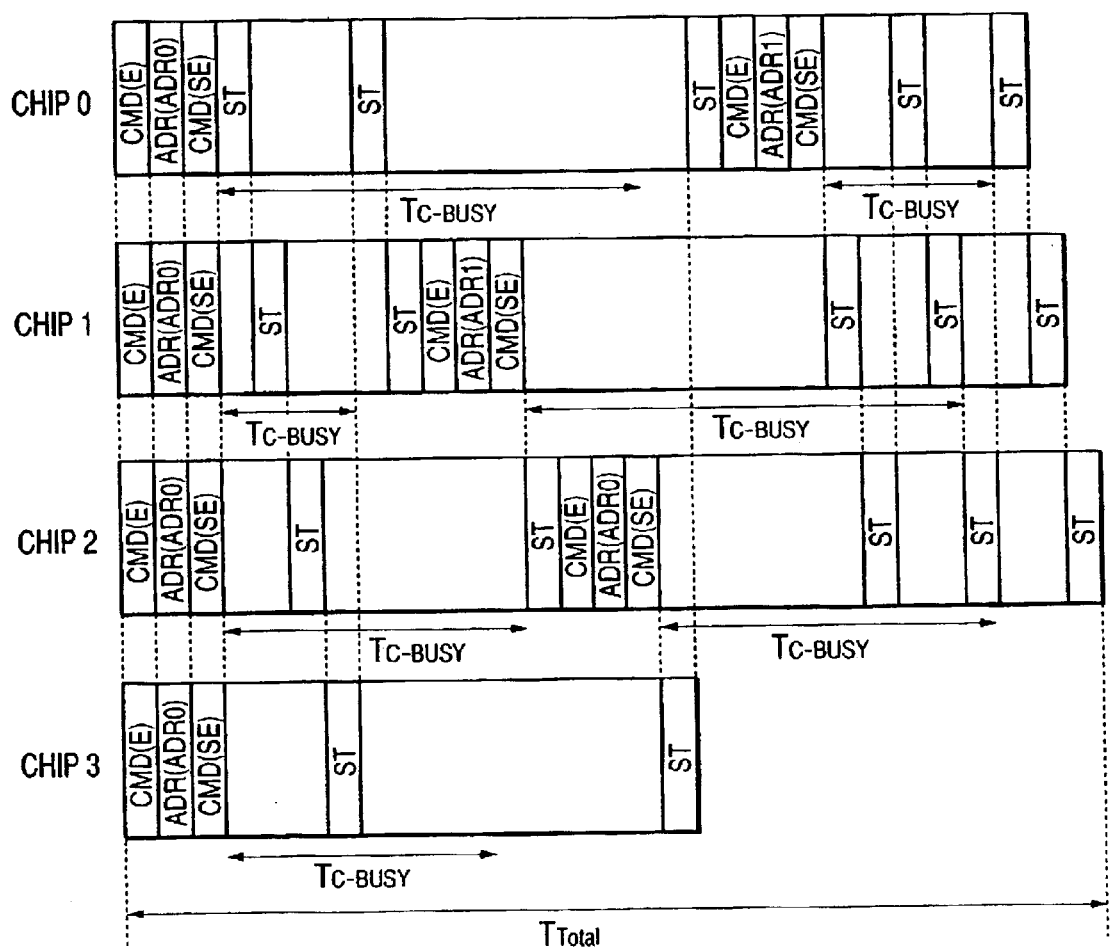
FIG. 37 is a chart for describing an erasing controlling method on the time axis for erasing data from a plurality of different addresses specified in a plurality of flash memory chips with use of the fourth Ready/Busy determination method.

FIG. 37 shows a flowchart for controlling the erasing shown in FIG. 32 on the time axis. At first, the chip select signals CE0 to CE3 are activated so that an erase command is inputted (CMD(E)) simultaneously to each of the flash memory chips 0 to 3, then the same sector address ADR0 is inputted (ADR(ADR0)) simultaneously to each of the flash memory chips 0 to 3. After this, an erase start command is inputted (CMD(SE)) to each of the flash memory chips 0 to 3 simultaneously. Hereinafter, the status register of each chip is read to determine Ready/Busy therein with the read value. Then, the command execution result is checked in each chip in order of Ready detection. If data is to be erased from the sector address ADR1 in the flash memory chip after the command execution result check, the erase command (CMD(E)), the sector address ADR1 (ADR(ADR1)), and the erase start command (CMD(SE)) for the erasing are inputted to the chip.

Next, a description will be made for two cases in which data is read from a plurality of flash memory chips. In one case, data is read from the same addresses specified in a plurality of flash memory chips. In the other case, data is read from a plurality of different addresses specified in the plurality of flash memory chips.

At first, the first case will be described; in this case, data is read from the same addresses specified in a plurality of flash memory chips.

Figure 38:
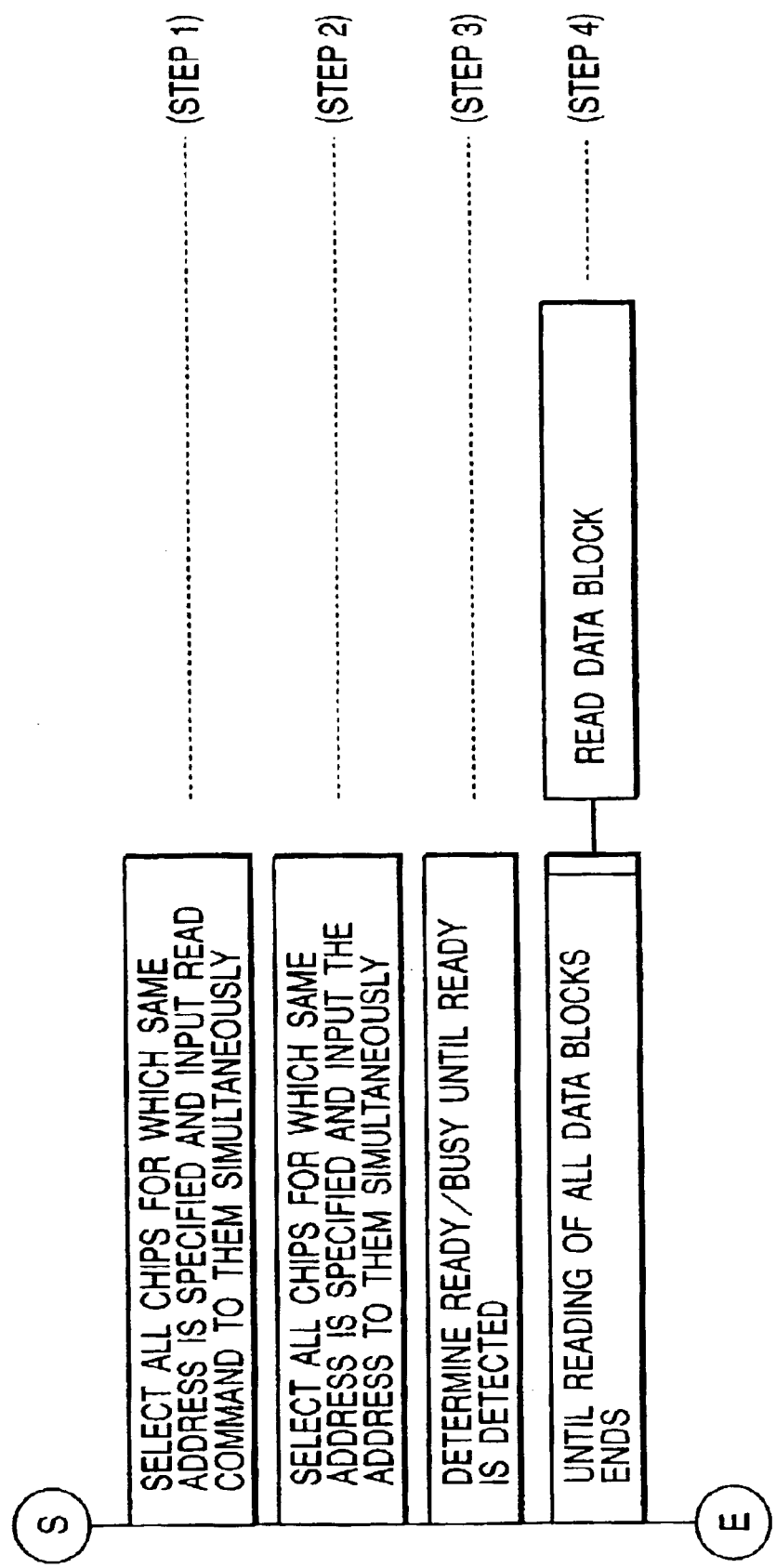
FIG. 38 is a flowchart of a reading controlling method for reading data from the same address specified in a plurality of flash memory chips with use of the first Ready/Busy determination method.

FIGS. 38 through 41 show flowcharts for controlling the reading in accordance with the first to fourth Ready/Busy determination methods. FIG. 38 shows a flowchart for controlling the reading in accordance with the first Ready/Busy determination method. In STEP1, a read command is inputted simultaneously to each of the flash memory chips to which the same address is to be inputted. In STEP2, the same address is inputted simultaneously to each of the flash memory chips to which the read command is inputted in STEP1. In STEP3, Ready/Busy is determined in each chip until Ready is detected therein. Then, the data block is read from the specified address in each of the chips that are selected sequentially until all the target data blocks are read therefrom.

Figure 39:
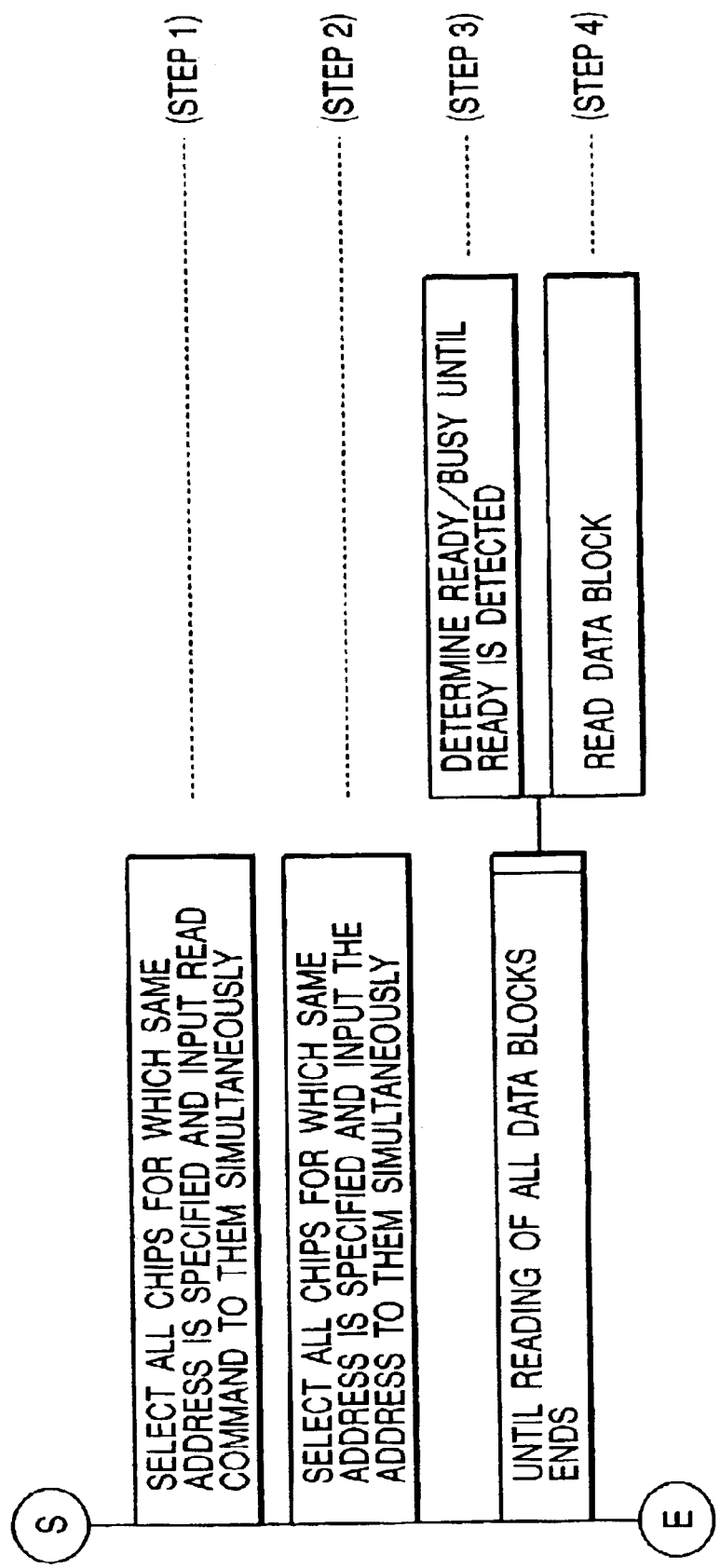
FIG. 39 is a flowchart of a reading controlling method for reading data from the same addresses specified in a plurality of flash memory chips with use of the second Ready/Busy determination method.

FIG. 39 shows a flowchart for controlling the reading in accordance with the second Ready/Busy determination method. In STEP1, a read command is inputted simultaneously to each of the flash memory chips to which the same address is to be inputted. In STEP2, the same address is inputted simultaneously to each of the flash memory chips to which the read command is inputted in STEP1. In STEP3, Ready/Busy is determined in each chip until Ready is detected therein. In STEP4, data blocks are read from the specified addresses. The processings in STEP3 and STEP4 are executed for the same chip and the data blocks are read in order of data block connection.

Figure 40:
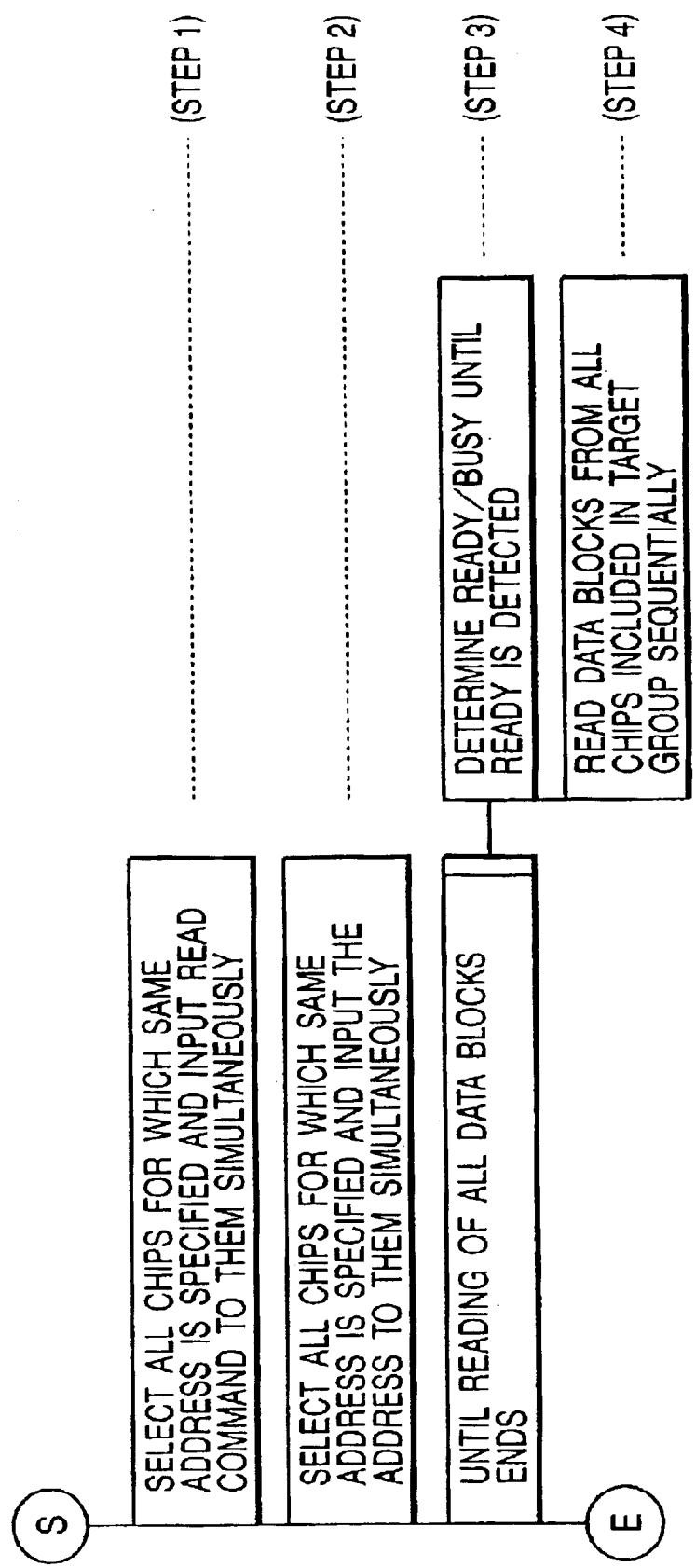
FIG. 40 is a flowchart of a reading controlling method for reading data from the same addresses specified in a plurality of flash memory chips with use of the third Ready/Busy determination method.

FIG. 40 shows a flowchart for controlling the reading in accordance with the third Ready/Busy determination method. In STEP1, a read command is inputted simultaneously to each of the flash memory chips to which the same address is to be inputted. In STEP2, the same address is inputted simultaneously to each of the flash memory chips to which the read command is inputted in STEP1. In STEP3, Ready/Busy is determined in each chip until Ready is detected therein. In STEP4, the data blocks are read sequentially from the flash memory chips included in each Ready-detected group. The processings in STEP3 and STEP4 are repeated to read data blocks sequentially in order of data block connection.

Figure 41:
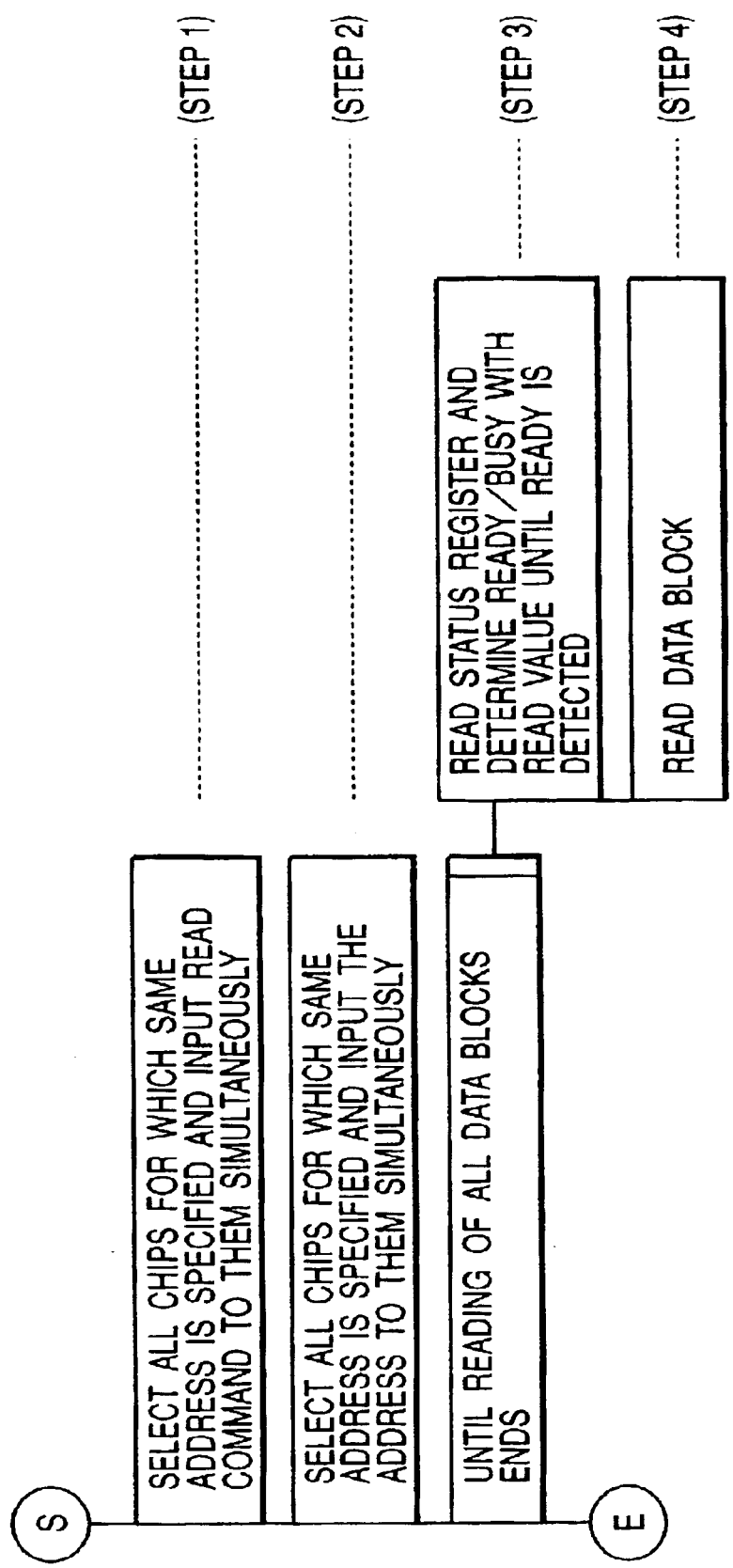
FIG. 41 is a flowchart of a reading controlling method for reading data from the same addresses specified in a plurality of flash memory chips with use of the fourth Ready/Busy determination method.

FIG. 41 shows a flowchart for controlling the reading in accordance with the fourth Ready/Busy determination method. In STEP1, a read command is inputted simultaneously to each of the flash memory chips to which the same address is to be inputted. In STEP2, the same address is inputted simultaneously to each of the flash memory chips to which the read command is inputted in STEP1. In STEP3, the status register of each chip is read to determine Ready/Busy with the read value until Ready is detected therein. In STEP4, the data blocks are read from the chips sequentially in order of Ready detection in STEP3. The processings in STEP3 and STEP4 are repeated for reading data blocks in order of data block connection.

Next, the flowcharts for controlling reading of data shown in FIGS. 38 through 41 will be described more in detail with reference to FIGS. 42 through 45. As shown in FIG. 6, read data D is divided into D0 to D3 and stored in the flash memory chips 0 to 3.

Figure 42:
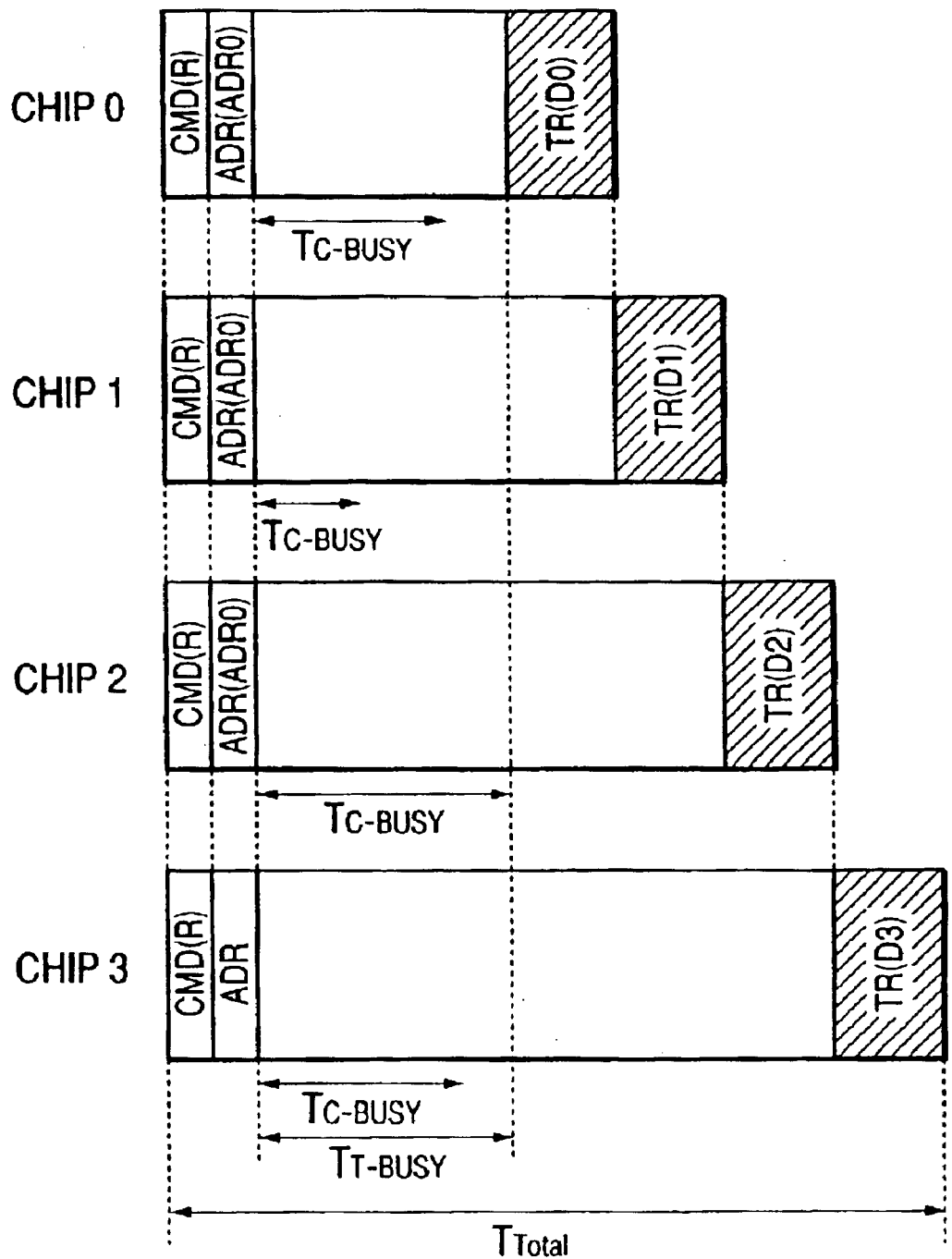
FIG. 42 is a chart for describing a reading controlling method on the time axis for reading data from the same addresses specified in a plurality of flash memory chips with use of the first Ready/Busy determination method.

FIG. 42 shows a flowchart for the reading shown in FIG. 38 on the time axis. At first, the chip select signals CE0 to CE3 are activated so that a read command is inputted (CMD(R)) simultaneously to each of the flash memory chips 0 to 3, then the same sector address ADR0 is inputted (ADR(ADR0)) simultaneously to each of the flash memory chips 0 to 3. After this, Ready/Busy is determined in each chip until Ready is detected therein. When Ready is detected, the chip is changed to the next one so that data blocks D0 to D3 are read sequentially from the chips (in order of TR(D0), TR(D1), TR(D2), TR(D3)).

Figure 43:
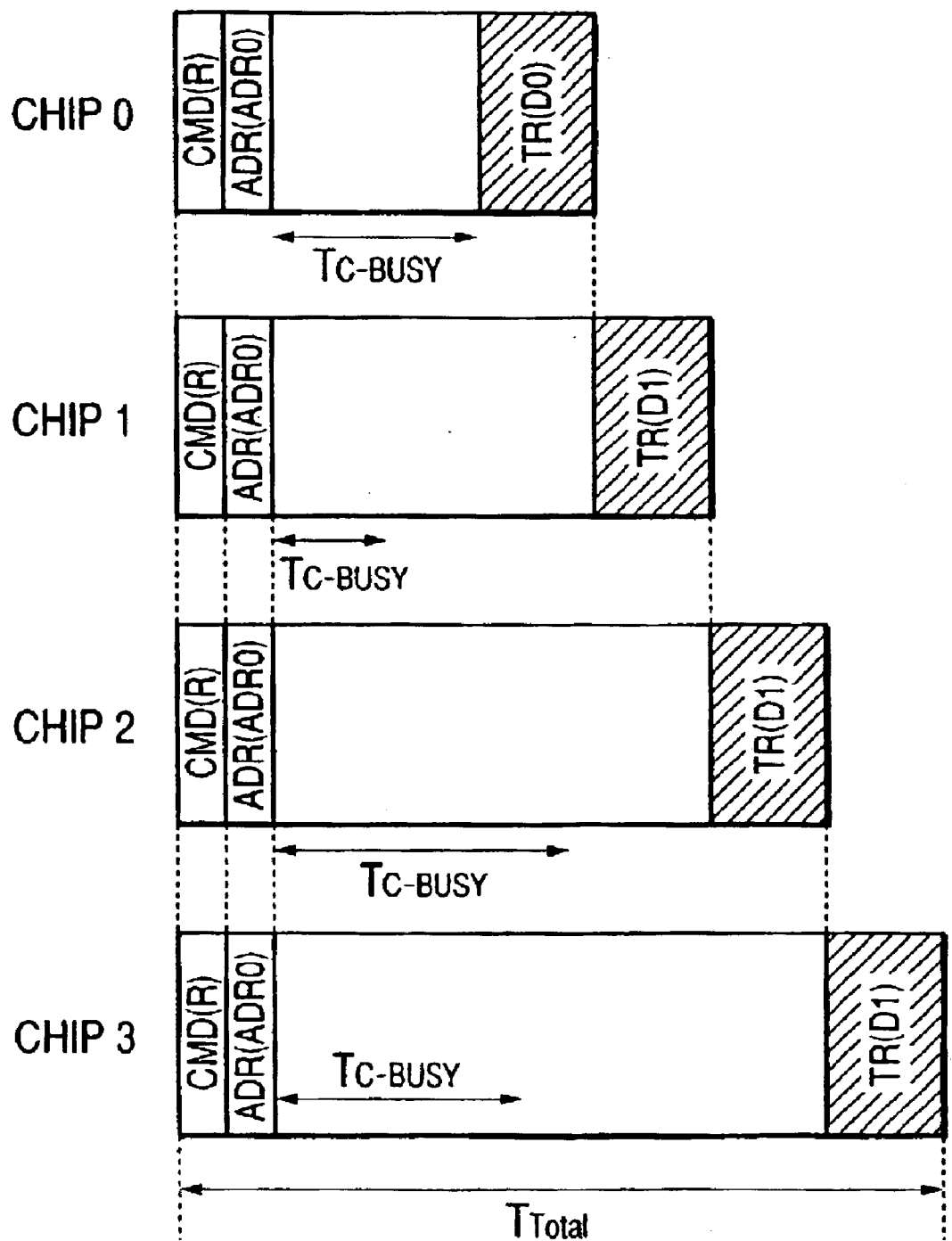
FIG. 43 is a chart for describing a reading controlling method on the time axis for reading data from the same addresses specified in a plurality of flash memory chips with use of the second Ready/Busy determination method.

FIG. 43 shows a flowchart for the reading shown in FIG. 39 on the time axis. At first, the chip select signals CE0 to CE3 are activated so that a read command is inputted (CMD(R)) simultaneously to each of the flash memory chips 0 to 3, then the same sector address ADR0 is inputted (ADR(ADR0)) simultaneously to each of the flash memory chips 0 to 3. After this, Ready/Busy is determined in each chip until Ready is detected therein. When Ready is detected, the data block 0 is read (TR(D0)). Hereinafter, each time Ready is detected in a chip and the data block is read therefrom sequentially (in order of TR(D1), TR(D2), and TR(D3)).

Figure 44:
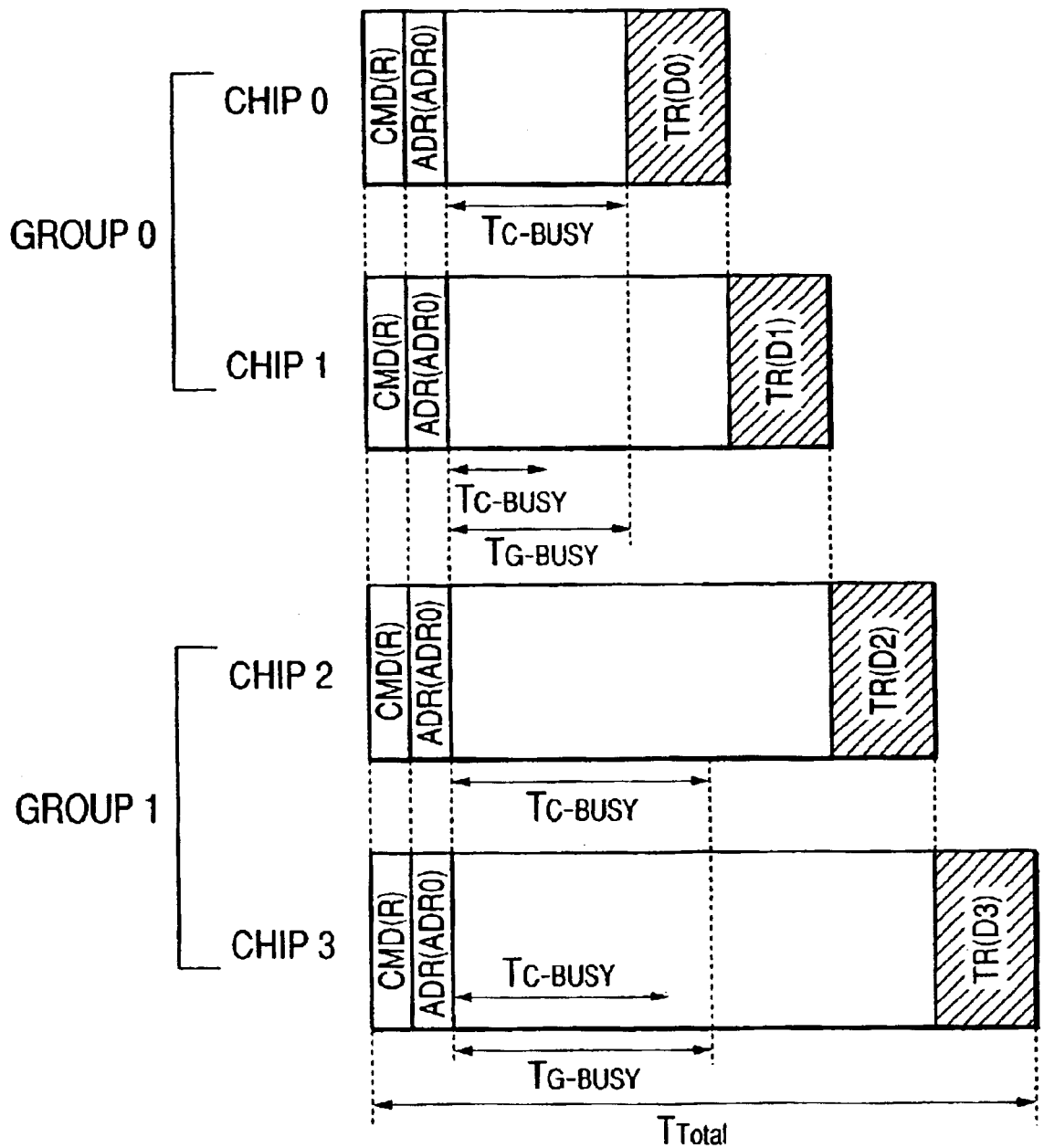
FIG. 44 is a chart for describing a reading controlling method on the time axis for reading data from the same addresses specified in a plurality of flash memory chips with use of the third Ready/Busy determination method.

FIG. 44 shows a flowchart for the reading shown in FIG. 40 on the time axis. In this case, it is premised that flash memory chips 0 and 1 are included in the group 0 and flash memory chips 2 and 3 are included in the group 1 to be subjected to the Ready/Busy determination respectively. At first, the chip select signals CE0 to CE3 are activated so that a read command is inputted (CMD(R)) simultaneously to each of the flash memory chips 0 to 3, then the same sector address ADR0 is inputted (ADR(ADR0)) simultaneously to each of the flash memory chips 0 to 3. After this, Ready/Busy is determined in each chip in the group 0 until Ready is detected therein. When Ready is detected, the data blocks 0 and 1 are read from the flash memory chips 0 and 1 sequentially. Then, Ready/Busy is determined in each chip in the group 1 until Ready is detected therein. When Ready is detected, the data blocks 2 and 3 are read from the flash memory chips 2 and 3 sequentially.

Figure 45:
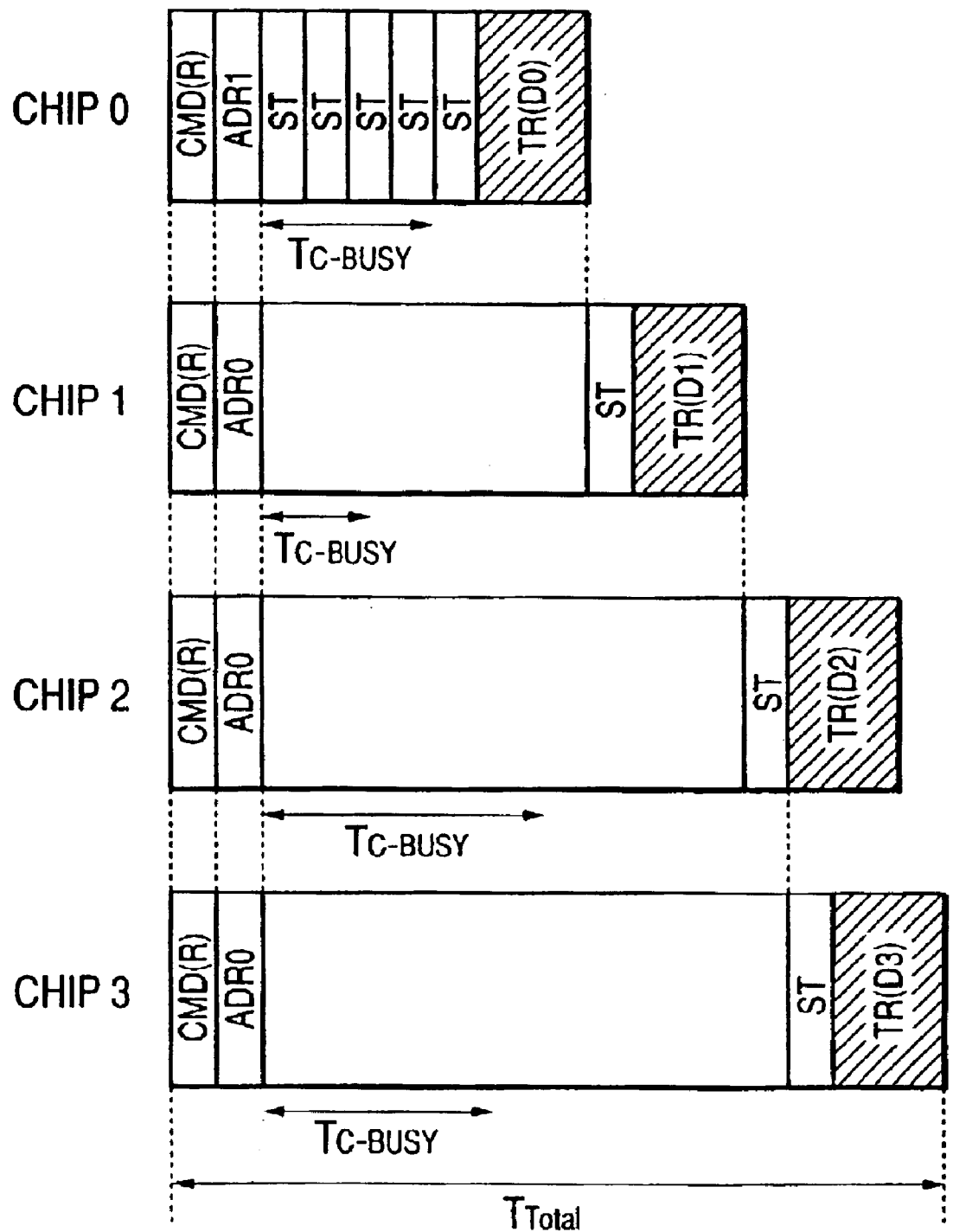
FIG. 45 is a chart for describing a reading controlling method on the time axis for reading data from the same addresses specified in a plurality of flash memory chips with use of the fourth Ready/Busy determination method.

FIG. 45 shows a flowchart for the reading shown in FIG. 41 on the time axis. At first, the chip select signals CE0 to CE3 are activated so that a read command is inputted (CMD(R)) simultaneously to each of the flash memory chips 0 to 3, then the same sector address ADR0 is inputted (ADR(ADR0)) simultaneously to each of the flash memory chips 0 to 3. After this, the status register of the chip 0 is read to determine Ready/Busy with the read value until Ready is detected therein. When Ready is detected, the data block 0 is read (TR(D0)) from the flash memory chip 0. Hereinafter, the status register of each of the chips 1 to 3 is read sequentially to determine Ready/Busy with the read value until Ready is detected therein and read the data blocks from the chips sequentially while flash memory chips are changed over (in order of TR(D1), TR(D2), TR(D3)).

Next, a description will be made for a case in which data is read from a plurality of different addresses specified in a plurality of flash memory chips with reference to FIGS. 46 through 53.

Figure 46:
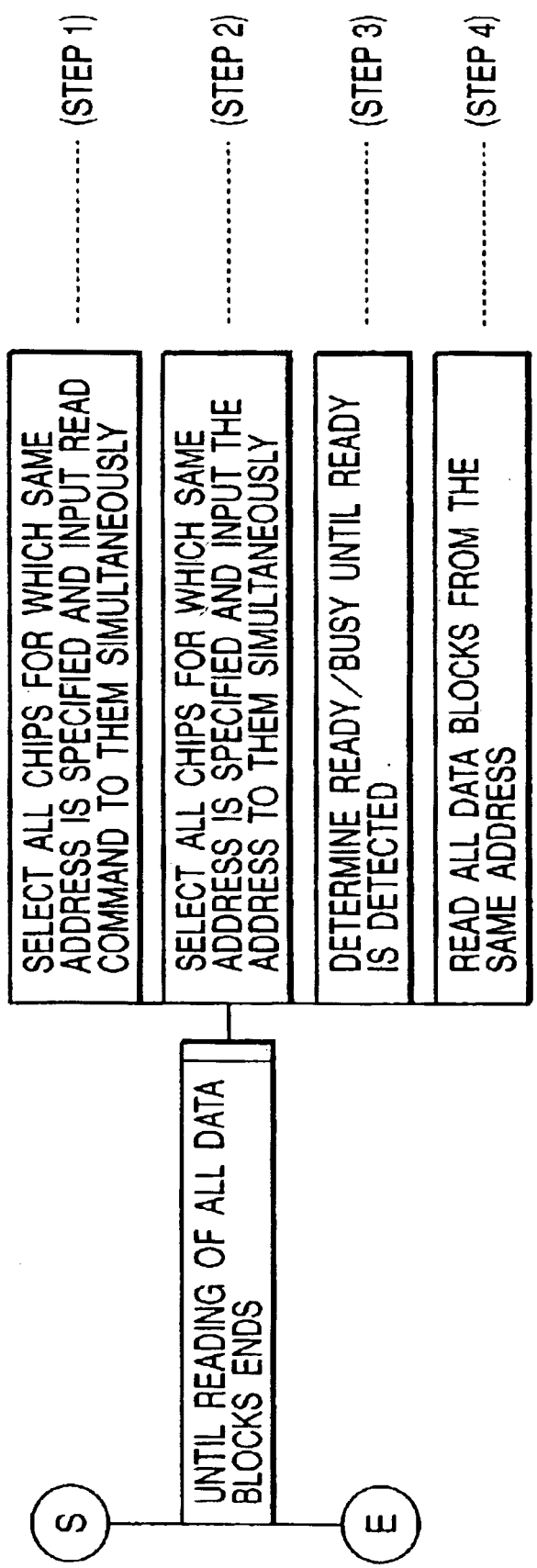
FIG. 46 is a flowchart of a reading controlling method for reading data from a plurality of different addresses specified in a plurality of flash memory chips with use of the first Ready/Busy determination method.

FIGS. 46 to 49 show flowcharts for controlling reading of data in accordance with the first to fourth Ready/Busy determination methods. FIG. 46 shows a flowchart for controlling the reading in accordance with the first Ready/Busy determination method. In STEP1, a read command is inputted simultaneously to each of the flash memory chips to which the same address is to be inputted. In STEP2, the same address is inputted simultaneously to each of the flash memory chips to which the read command is inputted in STEP1. In STEP3, Ready/Busy is determined in each chip until Ready is detected therein. In STEP4, the data blocks are read sequentially in order of data block input from each chip to which a read command is inputted in STEP1 and an address is inputted in STEP2. The processings in STEP1 to STEP4 are repeated until all the target data blocks are read completely.

Figure 47:
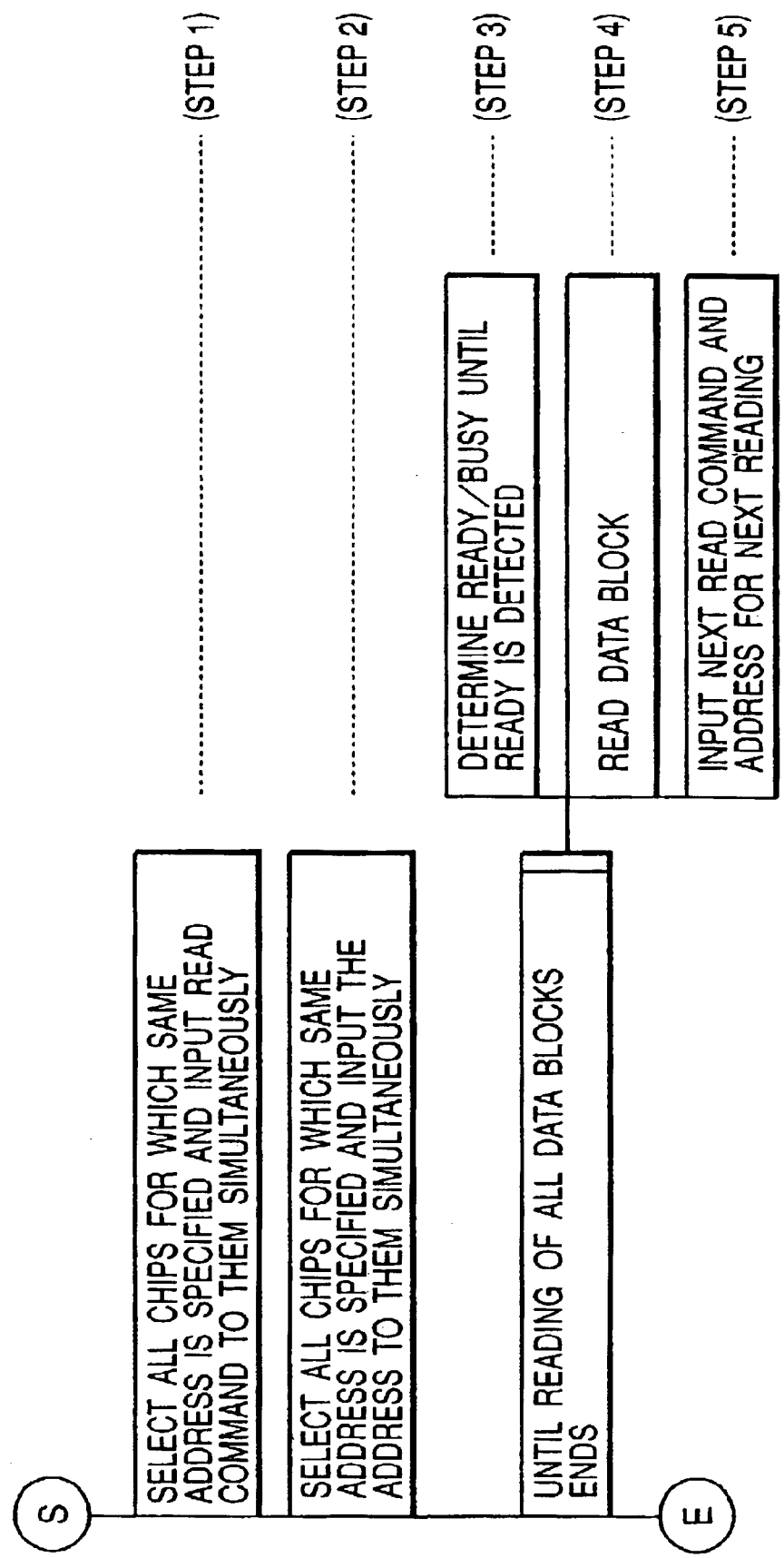
FIG. 47 is a flowchart of a reading controlling method for reading data from a plurality of different addresses specified in a plurality of flash memory chips with use of the second Ready/Busy determination method.

FIG. 47 shows a flowchart for controlling the reading in accordance with the second Ready/Busy determination method. In STEP1, a read command is inputted simultaneously to each of the flash memory chips to which the same address is to be inputted. In STEP2, the same address is inputted simultaneously to each of the flash memory chips to which the read command is inputted in STEP1. In STEP3, Ready/Busy is determined in each chip until Ready is detected therein. In STEP4, data blocks are read sequentially from each chip in which Ready is detected in STEP3. In STEP5, if a data block is to be read from the same chip from which a data block is read in STEP4, the read command and the address for the reading are inputted to the chip. The processings in STEP3 to STEP5 are repeated until all the data blocks are read completely.

Figure 48:
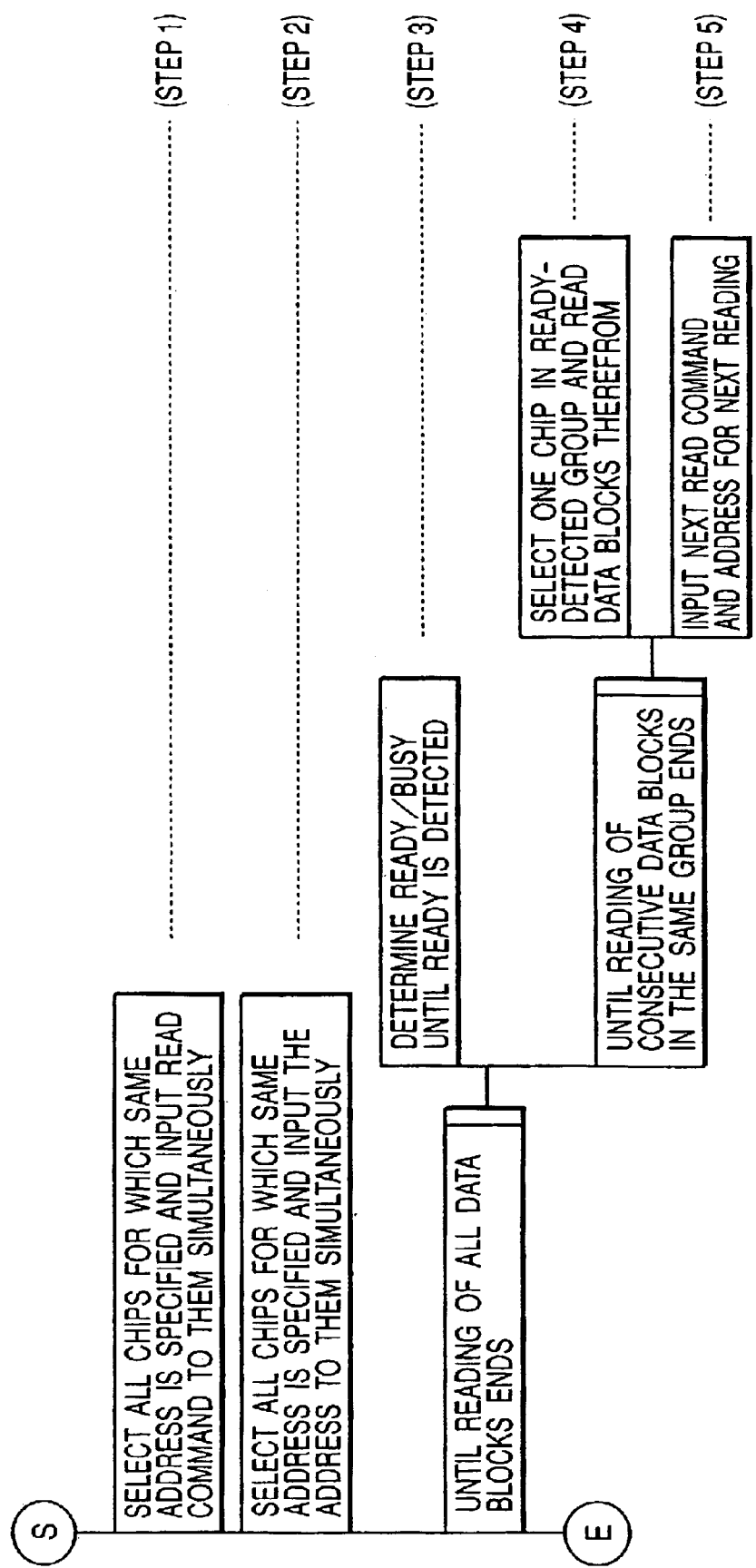
FIG. 48 is a flowchart of a reading controlling method for reading data from a plurality of different addresses specified in a plurality of flash memory chips with use of the third Ready/Busy determination method.

FIG. 48 shows a flowchart for controlling the reading in accordance with the third Ready/Busy determination method. In STEP1, a read command is inputted simultaneously to each of the flash memory chips to which the same address is to be inputted. In STEP2, the same address is inputted simultaneously to each of the flash memory chips to which the read command is inputted in STEP1. In STEP3, Ready/Busy is determined in each chip until Ready is detected therein. In STEP4, data blocks are read sequentially from the chips included in a group in which Ready is detected in STEP3. In STEP5, if the group includes a subsequent data block that follows the data block read in STEP4, the read command and the address for the reading are inputted to the group. The processings in STEP3 to STEP5 are repeated until all the target data blocks are read completely.

Figure 49:
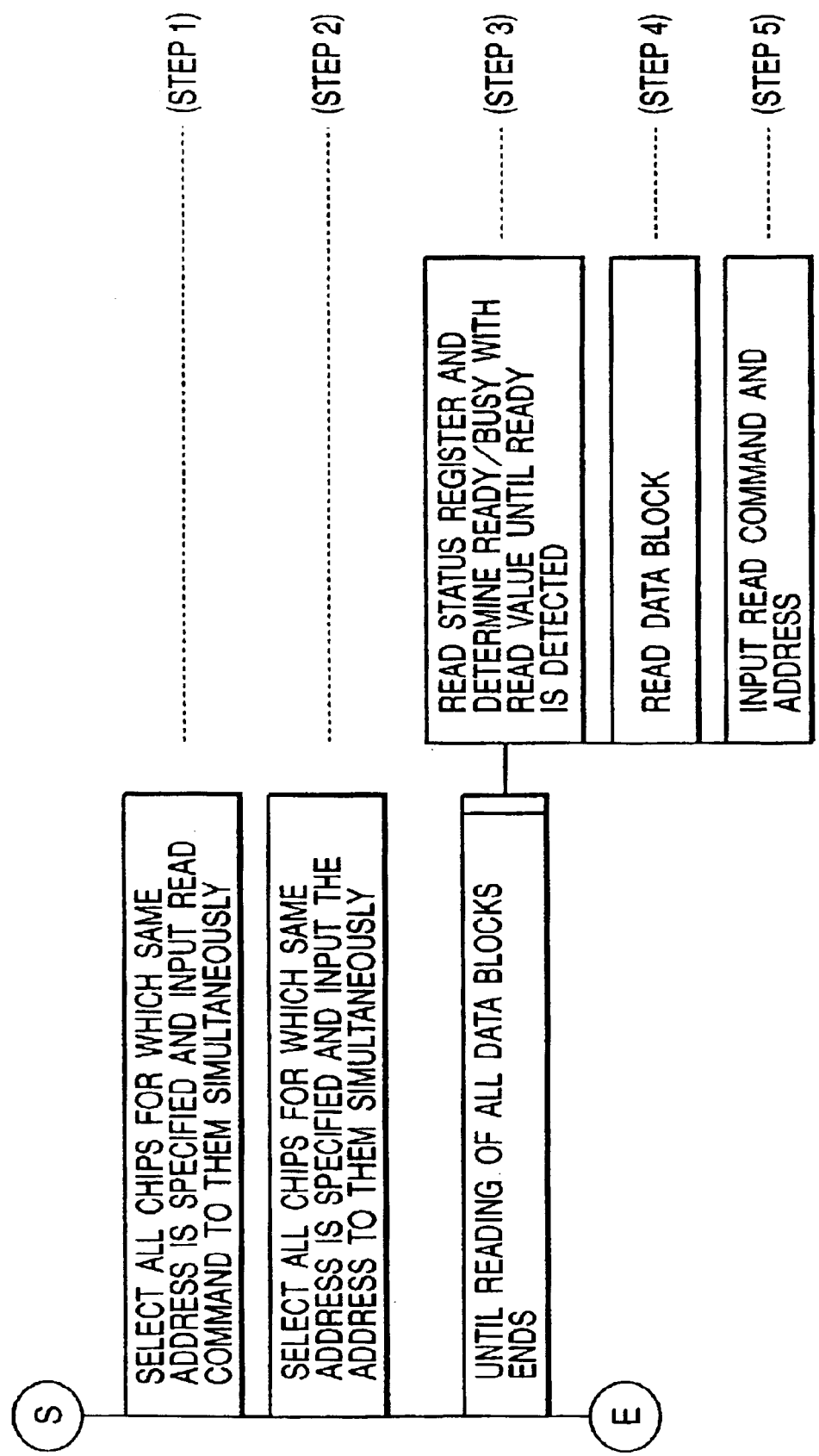
FIG. 49 is a flowchart of a reading controlling method for reading data from a plurality of different addresses specified in a plurality of flash memory chips with use of the fourth Ready/Busy determination method.

FIG. 49 shows a flowchart for controlling the reading in accordance with the fourth Ready/Busy determination method. In STEP1, a read command is inputted simultaneously to each of the flash memory chips to which the same address is to be inputted simultaneously. In STEP2, the same address is inputted simultaneously to each of the flash memory chips to which the read command is inputted in STEP1. In STEP3, Ready/Busy is determined in each chip with the read value until Ready is detected therein. In STEP4, a data block is read from the chip in which Ready is detected in STEP3. In STEP5, if the flash memory chip from which the data block is read in STEP4 includes any data block that follows the read one, the read command and the address for the reading are inputted to the chip. The processings in STEP3 to STEP5 are repeated until all the target data blocks are read completely.

Next, a description will be made for the flowcharts shown in FIG. 46 through FIG. 49 more in detail with reference to FIGS. 50 through 53. Just like in FIG. 15, it is premised here that the target data D is divided into D0 to D6 and stored in sector addresses ADR0 and ADR1 specified in different flash memory chips 0 to 3.

Figure 50:
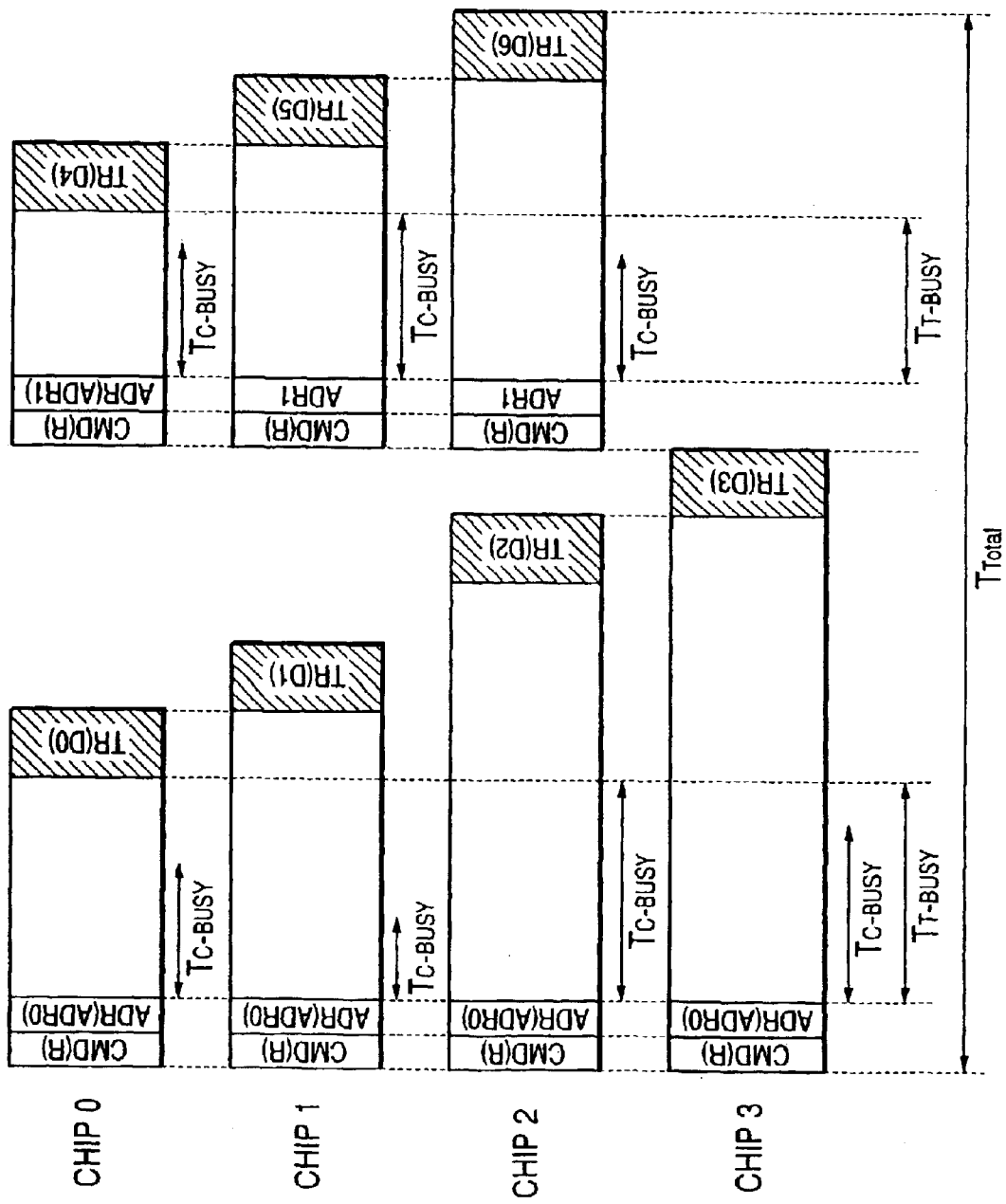
FIG. 50 is a chart for describing a reading controlling method on the time axis for reading data from a plurality of different addresses specified in a plurality of flash memory chips with use of the first Ready/Busy determination method.

FIG. 50 shows a flowchart for the reading shown in FIG. 46 on the time axis. At first, the chip select signals CE0 to CE3 are activated so that a read command is inputted (CMD(R)) simultaneously to each of the flash memory chips 0 to 3, then the same sector address ADR0 is inputted (ADR(ADR0)) simultaneously to each of the flash memory chips 0 to 3. After this, Ready/Busy is determined in each chip with the read value until Ready is detected therein. When Ready is detected, the data blocks 0 to 3 are read sequentially in order of (TR(D0), TR(D1), TR(D2), and TR(D3)) from the flash memory chips 0 to 3. Then, the chip select signals CD0 and CE2 are activated so that a read command is inputted simultaneously to each of the flash memory chips 0 to 2, then the same sector address ADR1 is inputted simultaneously to each of the flash memory chips 0 to 2 (SDR(ADR1). After this, Ready/Busy is determined in each chip until Ready is detected therein. When Ready is detected, data blocks D4 to D6 are read from those chips sequentially.

Figure 51:
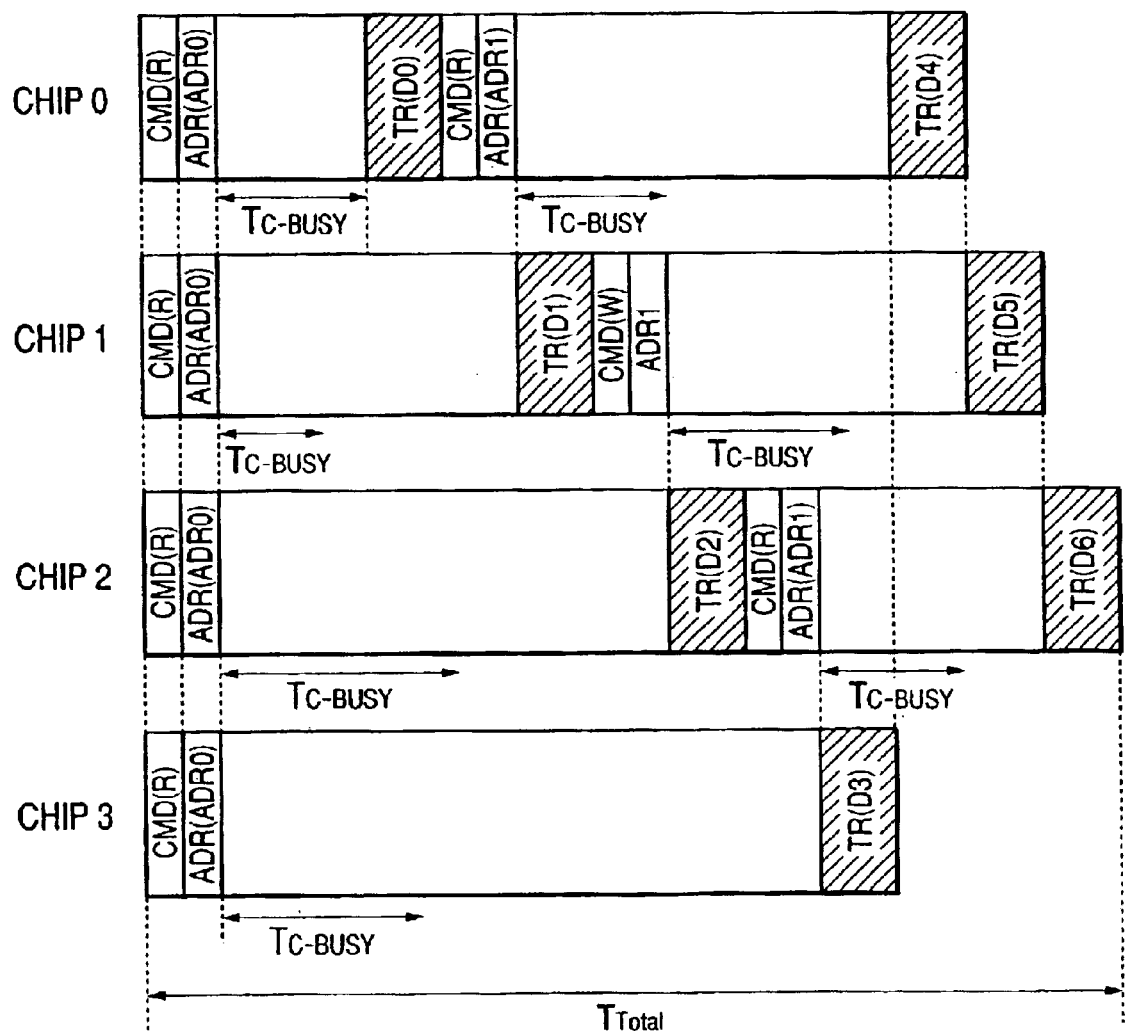
FIG. 51 is a chart for describing a reading controlling method on the time axis for reading data from a plurality of different addresses specified in a plurality of flash memory chips with use of the second Ready/Busy determination method.

FIG. 51 shows a flowchart for the reading shown in FIG. 47 on the time axis. At first, the chip select signals CE0 to CE3 are activated so that a read command is inputted (CMD(R)) simultaneously to each of the flash memory chips 0 to 3, then the same sector address ADR0 is inputted (ADR(ADR0)) simultaneously to each of the flash memory chips 0 to 3. After this, Ready/Busy is determined in each chip with the read value until Ready is detected therein. When Ready is detected, the data block 0 is read (TR(D0)) from the chip 0, then the read command and the address for the next reading are inputted (CMD(R)) (ADR(ADR1)) to the chip 0. Hereinafter, the remaining data blocks are read sequentially in order of data block connection at each Ready detection. If the chip includes any subsequent data block to be read, the read command and the sector address for the reading are inputted (CMD(R))(ADR(ADR1)) to the chip.

Figure 52:
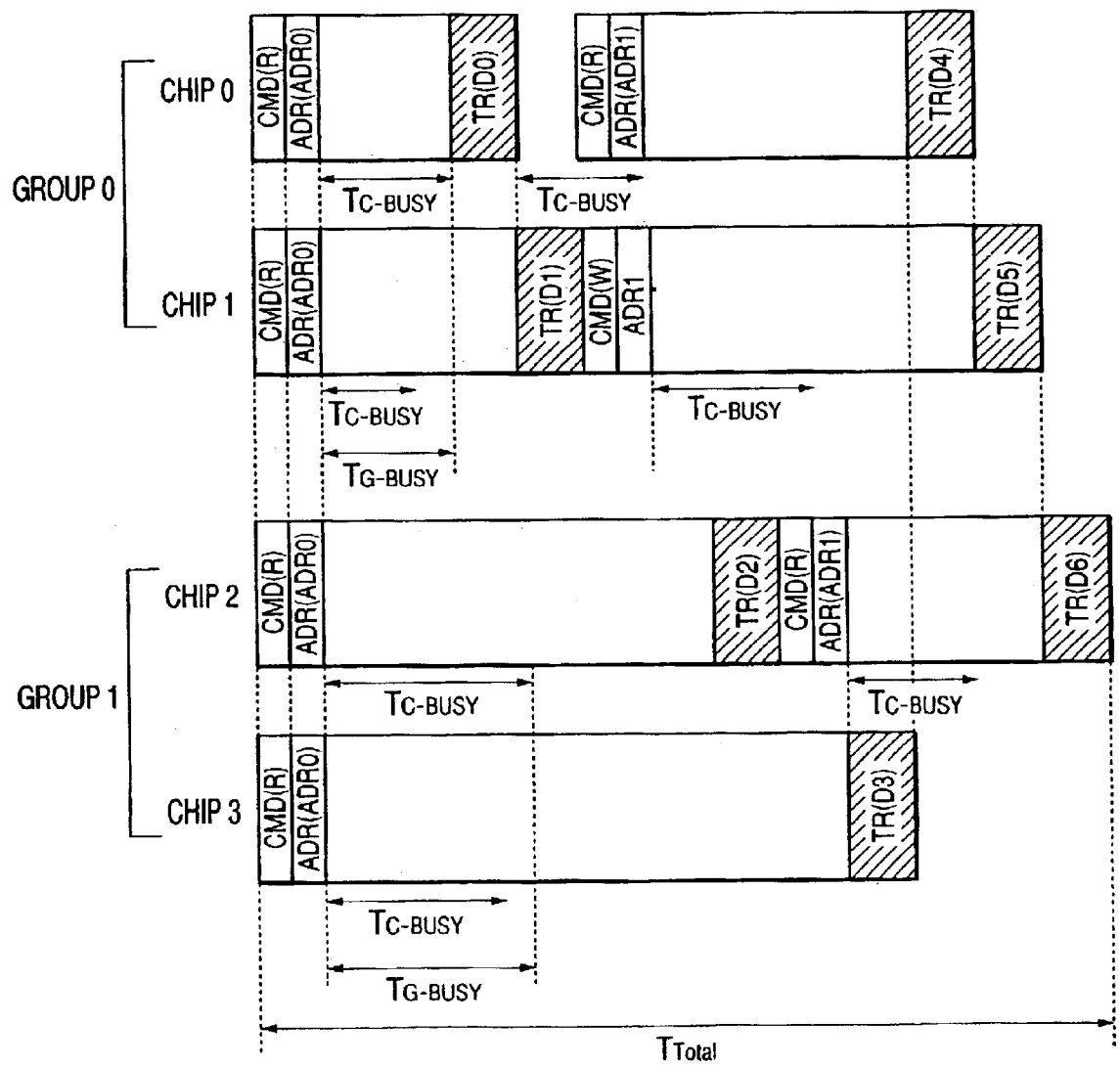
FIG. 52 is a chart for describing a reading controlling method on the time axis for reading data from a plurality of different addresses specified in a plurality of flash memory chips with use of the third Ready/Busy determination method.

FIG. 52 shows a flowchart for the reading shown in FIG. 48 on the time axis. At first, the chip select signals CE0 to CE3 are activated so that a read command is inputted (CMD(R)) simultaneously to each of the flash memory chips 0 to 3, then the same sector address ADR0 is inputted (ADR(ADR0)) simultaneously to each of the flash memory chips 0 to 3. After this, Ready/Busy is determined in each chip included in the group 0 with the read value until Ready is detected therein. After this, the data blocks 0 and 1 are read (TR(D0),TR(D1)) sequentially from the chips 0 and 1. Then, the read command and the address are inputted (CMD(R)) (ADR(ADR1)) to the flash memory chips 0 and 1 simultaneously. Hereinafter, while the groups are changed over in order of data block connection to determine Ready/Busy in each chip and the data blocks are read sequentially from the chips in the group. If any data block is still left in the group after the reading, the read command and the sector address for the reading are inputted (CMD(R))(ADR (ADR1)) to the group.

Figure 53:
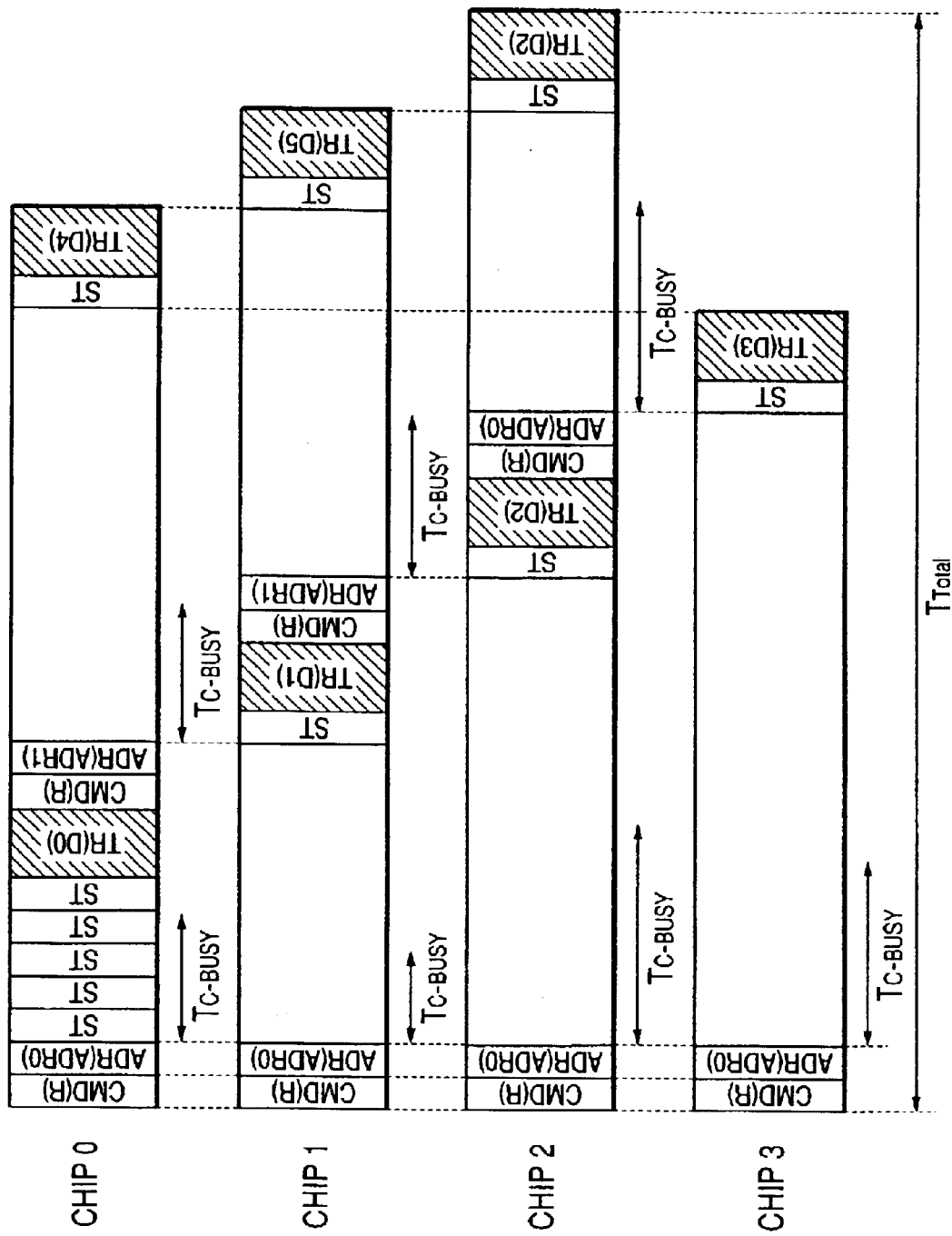
FIG. 53 is a chart for describing a reading controlling method on the time axis for reading data from a plurality of different addresses specified in a plurality of flash memory chips with use of the fourth Ready/Busy determination method.
Figure 54:
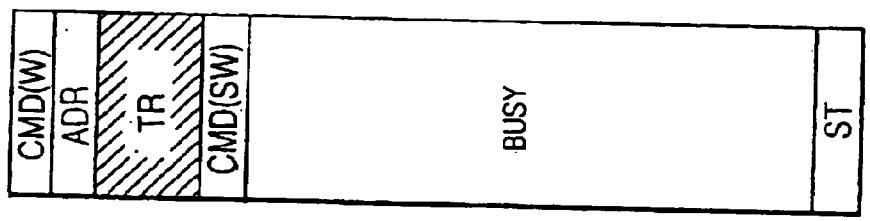
FIG. 54 is a chart for describing a conventional method of writing procedure.
Figure 55:
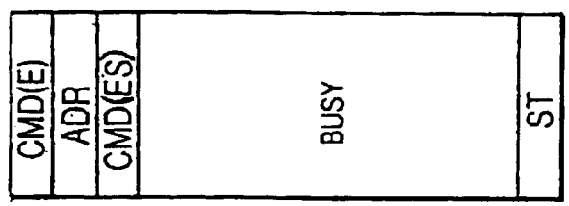
FIG. 55 is a chart for describing a conventional method of erasing procedure.
Figure 56:
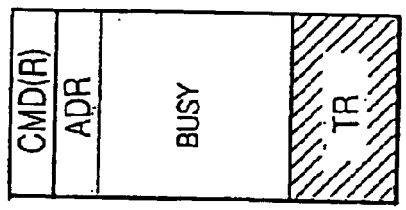
FIG. 56 is a chart for describing conventional method of reading procedure.
Figure 57:
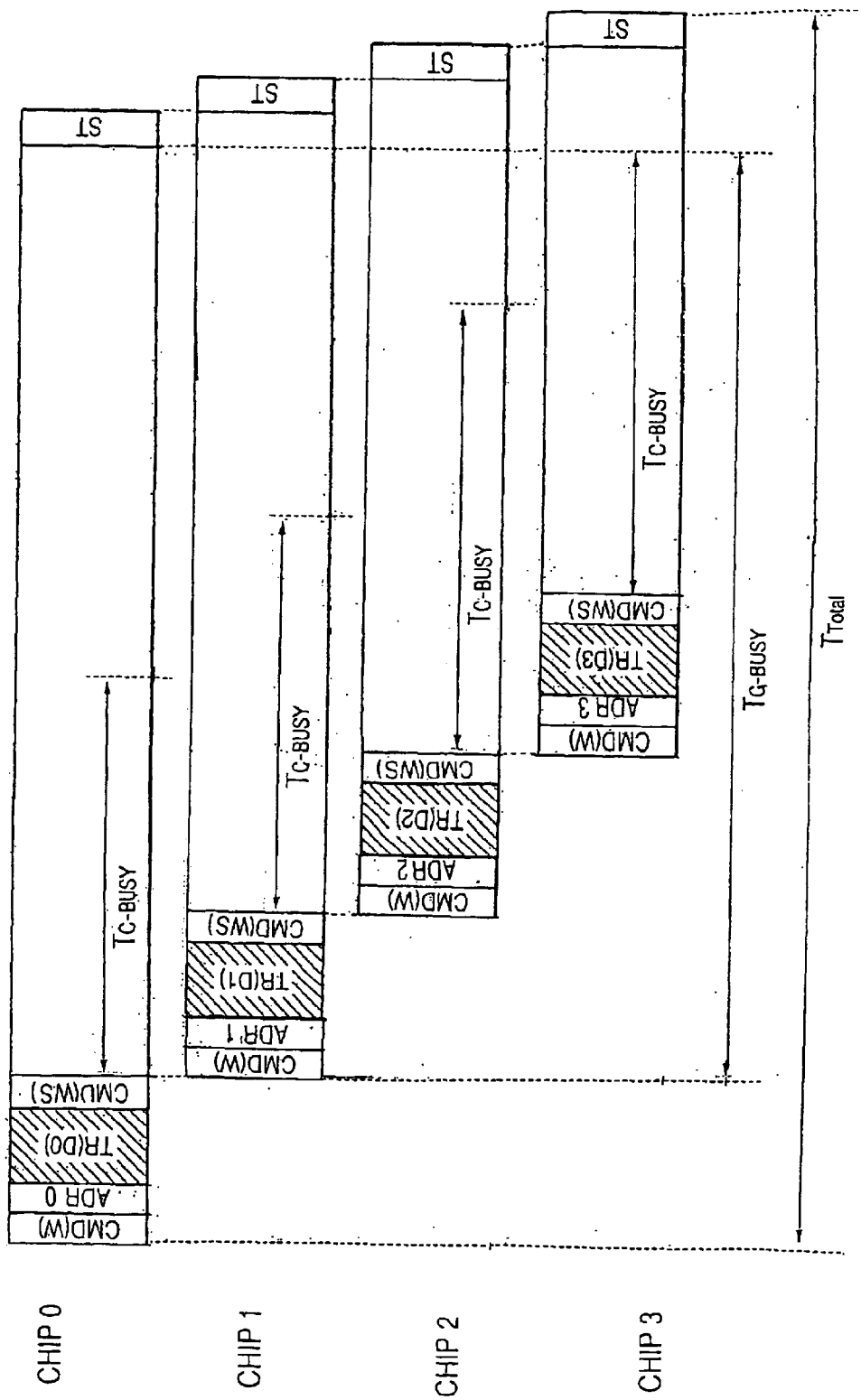
FIG. 57 is a chart for describing a conventional writing method described on the time axis in a case in which the data size is assumed as sector size ×4.
Figure 58:
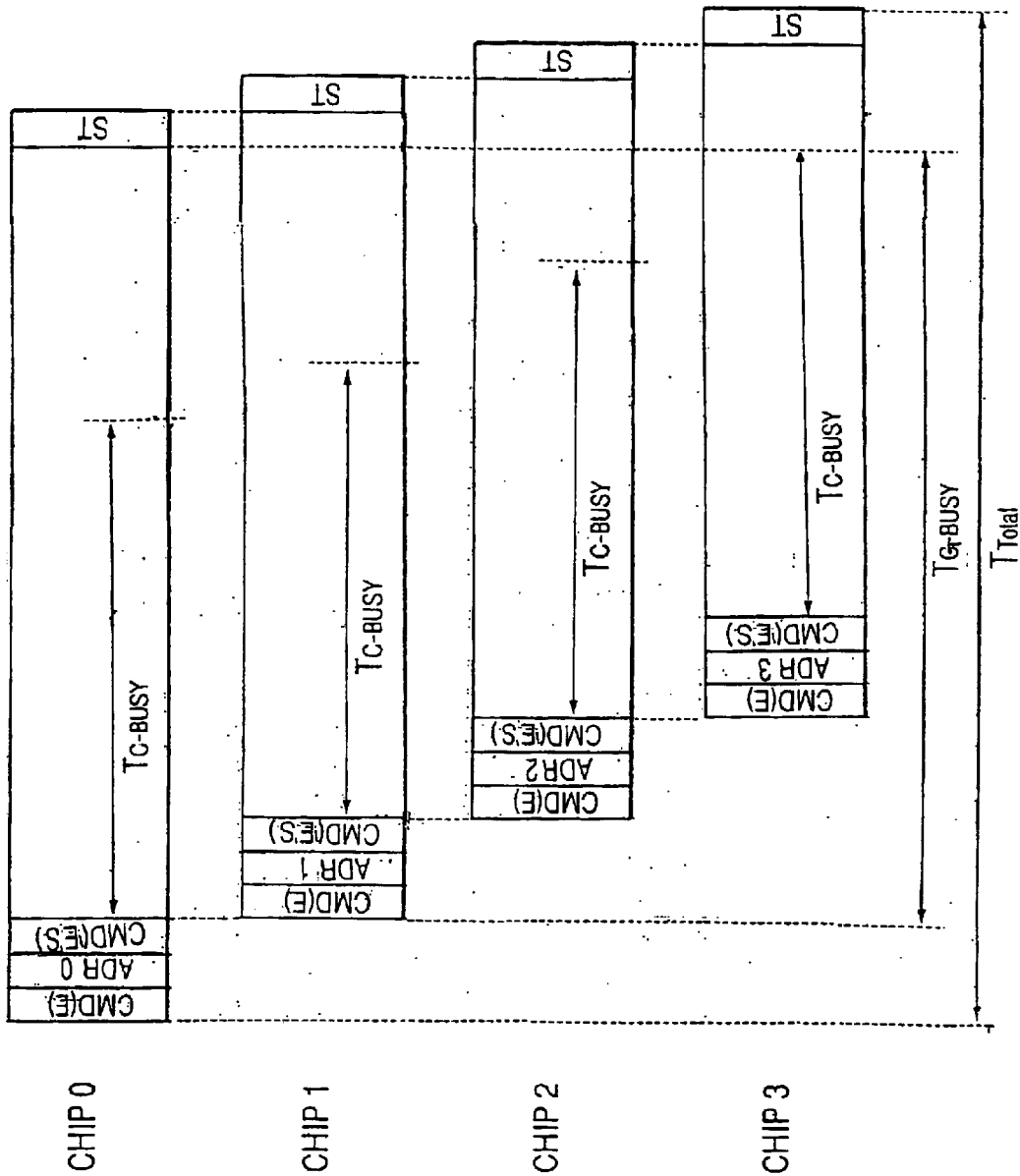
FIG. 58 is a chart for describing a conventional erasing method described on the time axis in a case in which the data size is assumed as sector size ×4.
Figure 59:
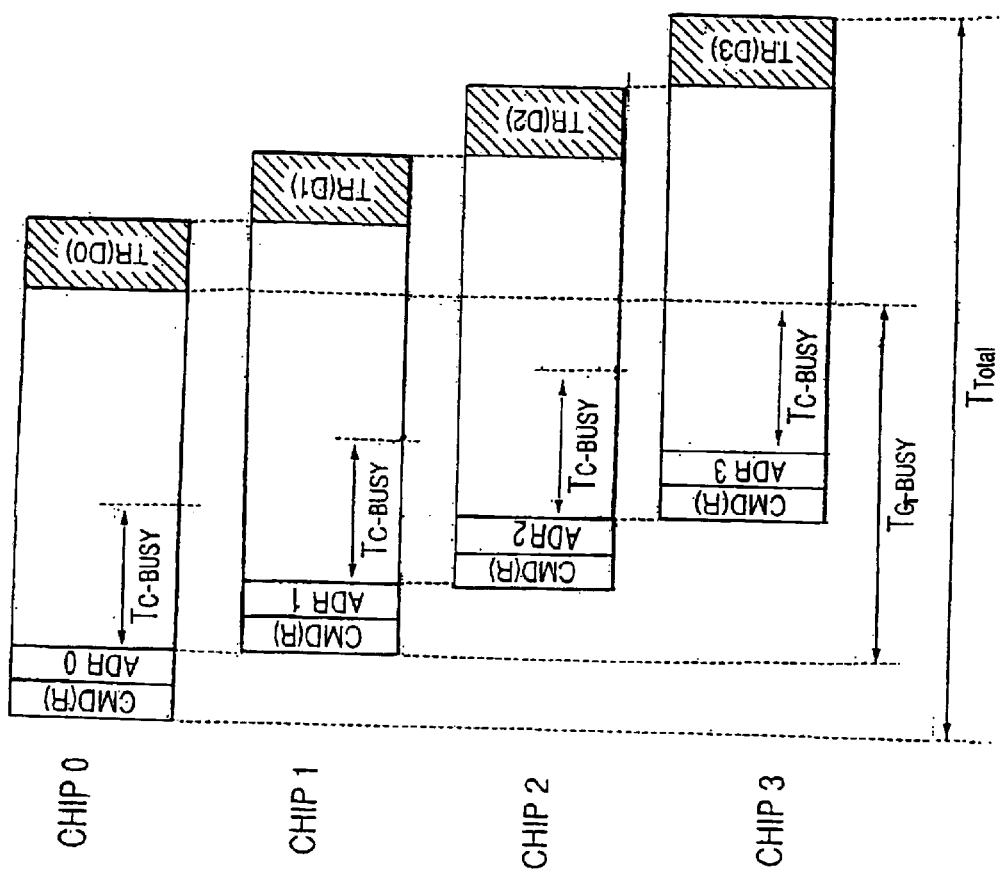
FIG. 59 is a chart for describing a conventional reading method described on the time axis in a case in which the data size is assumed as sector size ×4.

FIG. 53 shows a flowchart for the reading shown in FIG. 49 on the time axis. At first, the chip select signals CE0 to CE3 are activated so that a read command is inputted (CMD(R)) simultaneously to each of the flash memory chips 0 to 3, then the same sector address ADR0 is inputted (ADR(ADR0)) simultaneously to each of the flash memory chips 0 to 3. After this, the status register of the chip 0 is read to determine Ready/Busy with the read value until Ready is detected therein. After the Ready detection, the data block 0 is read from the flash memory chip 0. Because the data block D4 is also to be read from the chip 0, the read command and the sector address ADR1 for the reading are inputted to the chip. Hereinafter, while the groups are changed over in order of data block connection to determine Ready/Busy therein and read the data blocks from the subsequent chips. If there is still another data block in the chip 0 after the reading, the read command and the sector address for the reading are inputted to the chip.

As described above, using the controlling method of the present invention makes it possible to shorten the overhead of the input of commands and addresses, as well as to hide processing times of writing, erasing, and reading in/from flash memory chips and smooth out the variation among those processing times.

What is claimed is:

1. A writing controlling method used by memory controlling means to divide data into a plurality of data blocks and storing said data blocks in a plurality of non-volatile semiconductor memory chips connected to a common bus, said method comprising:

a first step of enabling said memory controlling means to input a write command to each of said plurality of non-volatile semiconductor memory chips simultaneously through said common bus;

a second step of enabling said memory controlling means to input the same address to each of said plurality of non-volatile semiconductor memory chips simultaneously through said common bus; and a third step of enabling said memory controlling means to select one of said plurality of non-volatile semiconductor memory chips sequentially to input a data block and a write start command thereto through said common bus.

2. The method according to claim 1;

wherein said third step also determines that the processing of said write start command inputted to each of said non-volatile semiconductor memory chips has ended therein; and wherein said method further includes:
a fourth step of determining each result of said write start command execution separately.

3. The method according to claim 1;

wherein said third step also determines that the processing of said write start command has ended in each of said non-volatile semiconductor memory chips therein separately; and wherein said method further includes:
a fourth step of determining each result of said write start command execution separately.

4. An erasing controlling method used by memory controlling means to erase data from a plurality of non-volatile semiconductor memory chips connected to a common bus, said method comprising:

a first step of enabling said memory controlling means to input an erase command to each of said plurality of non-volatile memory chips simultaneously through said common bus;

a second step of enabling said memory controlling means to input the same address to each of said plurality of non-volatile memory chips simultaneously through said common bus;

a third step of enabling said memory controlling means to input an erase start command to each of said plurality of non-volatile memory chips simultaneously through said common bus;

a fourth step of determining that the processing of said erase start command has ended in each of said plurality of non-volatile memory chips to which said erase command has been inputted; and a fifth step of determining each result of said erase command execution separately.

5. An erasing controlling method used by memory controlling means to erase data from a plurality of non-volatile memory chips connected through a common bus, said method comprising:

a first step of enabling said memory controlling means to input an erase command to each of said plurality of non-volatile memory chips simultaneously through said common bus;

a second step of enabling said memory controlling means to input the same address to each of said plurality of non-volatile memory chips simultaneously through said common bus;

a third step of enabling said memory controlling means to input an erase start command to each of said plurality of non-volatile memory chips simultaneously through said common bus;

a fourth step of determining that the processing of said erase start command has ended in each of said plurality of non-volatile memory chips separately; and a fifth step of determining each result of said erase command execution separately.

6. A reading controlling method used by memory controlling means to read a plurality of data blocks stored in a plurality of non-volatile memory chips connected through a common bus, said method comprising:

a first step of enabling said memory controlling means to input a read command to each of said plurality of non-volatile memory chips simultaneously through said common bus;

a second step of enabling said memory controlling means to input the same address to each of said plurality of non-volatile memory chips simultaneously through said common bus;

a third step of determining that each of said plurality of non-volatile memory chips to which said read command has been inputted is ready to be read;

a fourth step of enabling said memory controlling means to select one of said plurality of non-volatile semiconductor memory chips to read one data block therefrom through said common bus; and a fifth step of selecting one of said plurality of non-volatile semiconductor memory chips sequentially, to be subjected to said processing in said fourth step.

7. A reading controlling method used by memory controlling means to read a plurality of data blocks stored in the same addresses specified in a plurality of non-volatile semiconductor memory chips connected to a common bus, said method comprising:

a first step of enabling said memory controlling means to input a read command to each of said plurality of non-volatile memory chips simultaneously through said common bus;

a second step of enabling said memory controlling means to input the same address to each of said plurality of non-volatile memory chips simultaneously through said common bus;

a third step of determining that each of said plurality of non-volatile memory chips to which said read command has been inputted is ready to be read;

a fourth step of enabling said memory controlling means to select one of said plurality of non-volatile semiconductor memory chips ready to be read to read one data block therefrom through said common bus; and a fifth step of repeating processings in said third and fourth steps.

8. A writing controlling method used by memory controlling means to divide data into a plurality of data blocks and store said data blocks in a plurality of non-volatile semiconductor memory chips connected to a common bus, said method comprising:

a first step of enabling said memory controlling means to input a write command to each of said plurality of non-volatile memory chips simultaneously through said common bus;

a second step of enabling said memory controlling means to input the same address to each of said plurality of non-volatile memory chips simultaneously through said common bus;

a third step of enabling said memory controlling means to select one of said plurality of non-volatile memory chips and input a data block and a write start command to said selected chip through said common bus;

a fourth step of selecting one of said plurality of non-volatile semiconductor memory chips sequentially to be subjected to said processing in third step;

a fifth step of determining that processings of all write start commands inputted in step 4 have ended;

a sixth step of determining each execution result of said write start command inputted in said fourth step separately; and a seventh step of repeating processings in said first to sixth steps for different addresses.

9. A writing controlling method used by memory controlling means to divide data into a plurality of data blocks and store said data blocks in a plurality of non-volatile semiconductor memory chips connected to a common bus, said method comprising:

a first step of enabling said memory controlling means to input a write command to each of said plurality of non-volatile memory chips simultaneously through said common bus;

a second step of enabling said memory controlling means to input the same address to each of said plurality of non-volatile memory chips simultaneously through said common bus;

a third step of enabling said memory controlling means to select one of said plurality of non-volatile memory chips and input a data block and a write start command to said selected chip through said common bus;

a fourth step of selecting one of said plurality of non-volatile semiconductor memory chips sequentially to be subjected to said processing in said third step;

a fifth step of determining that the processing of each write start command inputted in step 4 has ended separately;

a sixth step of determining the execution result of each write start command inputted in said fourth step separately;

a seventh step of inputting a write command to each of said plurality of non-volatile semiconductor memory chips separately;

an eighth step of inputting the same address to each of said plurality of chips separately; and a ninth step of repeating the processings in said fifth to eighth steps.

10. An erasing controlling method used by memory controlling means to erase data from a plurality of non-volatile semiconductor memory chips connected to a common bus, said method comprising:

a first step of enabling said memory controlling means to input an erase command to each of said plurality of non-volatile memory chips simultaneously through said common bus;

a second step of enabling said memory controlling means to input the same address to said plurality of non-volatile memory chips simultaneously through said common bus;

a third step of enabling said memory controlling means to input an erase start command to said plurality of non-volatile memory chips simultaneously through said common bus;

a fourth step of determining that the processings of said erase start command has ended in each of said plurality of non-volatile semiconductor memory chips to which said erase command has been inputted;

a fifth step of determining each execution result of said erase command separately; and a sixth step of repeating the processings in said first to fifth steps.

11. An erasing controlling method used by memory controlling means to erase data from a plurality of non-volatile semiconductor memory chips connected to a common bus, said method comprising:

a first step of enabling said memory controlling means to input an erase command to each of said plurality of non-volatile memory chips simultaneously through said common bus;

a second step of enabling said memory controlling means to input the same address to said plurality of non-volatile memory chips simultaneously through said common bus;

a third step of enabling said memory controlling means to input an erase start command to each of said plurality of non-volatile memory chips simultaneously through said common bus;

a fourth step of determining that the processing of said erase command has ended in each of non-volatile semiconductor memory chips therein separately;

a fifth step of determining each execution result of said erase command separately;

a sixth step of enabling said memory controlling means to input an erase command to each of said non-volatile semiconductor memory chips simultaneously through said common bus;

a seventh step of enabling said memory controlling means to input the same address to each of said plurality of non-volatile semiconductor memory chips simultaneously through said common bus;

an eighth step of enabling said memory controlling means to input an erase start command to each of said plurality of non-volatile semiconductor memory chips through said common bus;

a ninth step of determining that the processing of said erase start command has ended in each of said plurality of non-volatile semiconductor memory chips therein separately;

a tenth step of determining each execution result of said erase command separately;

an eleventh step of inputting an erase command to each of said plurality of non-volatile semiconductor memory chips separately;

a twelfth step of inputting the same address to each of said plurality of non-volatile semiconductor memory chips separately;

a thirteenth step of inputting an erase start command to each of said plurality of non-volatile semiconductor memory chips separately; and a fourteenth step of repeating the processings in said fourth to thirteenth steps.

12. A reading controlling method used by memory controlling means to read a plurality of data blocks stored in a plurality of non-volatile semiconductor memory chips connected to a common bus, said method comprising:

a first step of enabling said memory controlling means to input a read command to each of said plurality of non-volatile memory chips simultaneously through said common bus;

a second step of enabling said memory controlling means to input the same address to said plurality of non-volatile memory chips simultaneously through said common bus;

a third step of determining that all of said plurality of non-volatile semiconductor memory chips to each of which said read command has been inputted are ready to be read;

a fourth step of enabling said memory controlling means to select one of said non-volatile semiconductor memory chips to read one data block therefrom through said common bus;

a fifth step of changing said selected chip to another sequentially to be subjected to the processing in said fourth step; and a sixth step of repeating the processings in said first to fifth steps.

13. A reading controlling method used by memory controlling means to read a plurality of data blocks stored in the same addresses specified in a plurality of non-volatile semiconductor memory chips connected to a common bus, said method comprising:

a first step of enabling said memory controlling means to input a read command to each of said plurality of non-volatile memory chips simultaneously through said common bus;

a second step of enabling said memory controlling means to input the same address to each of said plurality of non-volatile memory chips simultaneously through said common bus;

a third step of enabling said memory controlling means to determine that each of said plurality of non-volatile semiconductor memory chips to which said read start command has been inputted is ready to be read separately;

a fourth step for enabling said memory controlling means to select one of said non-volatile semiconductor memory chips ready to be read so as to read one data block therefrom through said common bus;

a fifth step of enabling said memory controlling means to input a read command to each of said plurality of non-volatile semiconductor memory chips separately through said common bus when there is a subsequent data block in said chip;

a sixth step of inputting the same address to each of said non-volatile semiconductor memory chips separately through said common bus when there is a subsequent data block in said chip;

a seventh step of repeating the processings in said third to sixth steps;

an eighth step of determining that each of said plurality of non-volatile semiconductor memory chips is ready to be read by said read command inputted in said seventh step separately;

a ninth step of enabling said memory controlling means to select each of said plurality of non-volatile semiconductor memory chips ready to be read so as to read one data block therefrom through said common bus; and a tenth step of repeating the processings in said seventh to ninth steps.

* * * * *